United States Patent
Gotoh et al.

(10) Patent No.: US 10,348,990 B2
(45) Date of Patent: Jul. 9, 2019

(54) LIGHT DETECTING DEVICE, SOLID-STATE IMAGE CAPTURING APPARATUS, AND METHOD FOR MANUFACTURING THE SAME

(71) Applicants: Sharp Kabushiki Kaisha, Sakai, Osaka (JP); National Institute of Advanced Industrial Science and Technology, Chiyoda-ku, Tokyo (JP)

(72) Inventors: Toshihisa Gotoh, Sakai (JP); Toshio Yoshida, Sakai (JP); Yoshinobu Kanazawa, Sakai (JP); Yoshimitsu Nakashima, Sakai (JP); Kohji Kobayashi, Sakai (JP); Toshio Fukai, Sakai (JP); Hitoshi Aoki, Sakai (JP); Yasushi Nagamune, Tsukuba (JP); Takashi Tokizaki, Tsukuba (JP); Toshitaka Ota, Tsukuba (JP)

(73) Assignees: SHARP KABUSHIKI KAISHA, Sakai (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 97 days.

(21) Appl. No.: 15/303,828

(22) PCT Filed: Mar. 23, 2015

(86) PCT No.: PCT/JP2015/058772
§ 371 (c)(1),
(2) Date: Oct. 13, 2016

(87) PCT Pub. No.: WO2015/159651
PCT Pub. Date: Oct. 22, 2015

(65) Prior Publication Data
US 2017/0041560 A1    Feb. 9, 2017

(30) Foreign Application Priority Data

Apr. 14, 2014 (JP) .............................. 2014-083189
Dec. 10, 2014 (JP) .............................. 2014-250343

(51) Int. Cl.
*H04N 5/369* (2011.01)
*G01J 3/36* (2006.01)
(Continued)

(52) U.S. Cl.
CPC ............ *H04N 5/369* (2013.01); *G01J 3/2803* (2013.01); *G01J 3/2823* (2013.01); *G01J 3/36* (2013.01);
(Continued)

(58) Field of Classification Search
CPC . H04N 5/369; H04N 9/07; H04N 5/33; H01L 27/14652; H01L 27/14621;
(Continued)

(56) References Cited

U.S. PATENT DOCUMENTS

2005/0133690 A1  6/2005  Higashitsutsumi
2006/0103738 A1*  5/2006  Sano ................... H04N 5/2256
                                                348/222.1
(Continued)

FOREIGN PATENT DOCUMENTS

JP   2006-140768 A   6/2006
JP      4286123 B2   6/2009
(Continued)

OTHER PUBLICATIONS

Official Communication issued in International Patent Application No. PCT/JP2015/058772, dated May 26, 2015.

*Primary Examiner* — Tony Ko
(74) *Attorney, Agent, or Firm* — Keating & Bennett, LLP

(57) ABSTRACT

A light detecting device includes: an optical filter (2) that transmits a first wavelength light having a wavelength in a
(Continued)

first wavelength range, a second wavelength light having a wavelength in a second wavelength range, . . . , and an n-th wavelength light having a wavelength in an n-th wavelength range (n is an integer); an optical sensor (3) that detects at least one of a first wavelength light intensity of the first wavelength light, a second wavelength light intensity of the second wavelength light, . . . , and an n-th wavelength light intensity of the n-th wavelength light; and an analysis unit (4) that estimates a light intensity of light having a wavelength in a wavelength range other than at least one of the first wavelength range, the second wavelength range, . . . , and the n-th wavelength range based on at least one of the first wavelength light intensity, the second wavelength light intensity, . . . , and the n-th wavelength light intensity. A correlative relationship exists between a light intensity of light having a wavelength in the at least one wavelength range and the light intensity of the light having the wavelength in the wavelength range other than the at least one wavelength range.

1 Claim, 35 Drawing Sheets

(51) Int. Cl.
| | | |
|---|---|---|
| *G01J 3/51* | (2006.01) | |
| *G02B 5/20* | (2006.01) | |
| *G03B 11/00* | (2006.01) | |
| *H01L 27/14* | (2006.01) | |
| *H04N 5/33* | (2006.01) | |
| *H04N 9/07* | (2006.01) | |
| *G01J 3/28* | (2006.01) | |
| *G02B 3/00* | (2006.01) | |
| *H01L 27/146* | (2006.01) | |
| *G01J 3/12* | (2006.01) | |

(52) U.S. Cl.
CPC .............. *G01J 3/51* (2013.01); *G02B 3/0006* (2013.01); *G02B 5/20* (2013.01); *G02B 5/201* (2013.01); *G02B 5/208* (2013.01); *G03B 11/00* (2013.01); *H01L 27/14* (2013.01); *H01L 27/14621* (2013.01); *H01L 27/14652* (2013.01); *H04N 5/33* (2013.01); *H04N 9/07* (2013.01); *G01J 2003/1213* (2013.01); *G01J 2003/2806* (2013.01)

(58) Field of Classification Search
CPC ............ H01L 27/14; G03B 11/00; G02B 5/20; G02B 3/0006; G02B 5/201; G02B 5/208; G01J 3/36; G01J 2003/2806; G01J 2003/1213; G01J 3/2823; G01J 3/2803; G01J 3/51
See application file for complete search history.

(56) References Cited

U.S. PATENT DOCUMENTS

| | | |
|---|---|---|
| 2008/0315339 A1 | 12/2008 | Rennie |
| 2009/0021739 A1 | 1/2009 | Tsujita et al. |
| 2012/0212619 A1 | 8/2012 | Nagamune |
| 2012/0226480 A1 | 9/2012 | Berkner et al. |
| 2015/0138407 A1 | 5/2015 | Kawaguchi et al. |
| 2015/0221691 A1 | 8/2015 | Watanabe |

FOREIGN PATENT DOCUMENTS

| | | |
|---|---|---|
| JP | 2011-050049 A | 3/2011 |
| JP | 2012-009983 A | 1/2012 |
| WO | 2013/172205 A1 | 11/2013 |
| WO | 2014/041742 A1 | 3/2014 |

\* cited by examiner

1: LIGHT DETECTING DEVICE
2: OPTICAL FILTER
3: OPTICAL SENSOR
L1, L2: LIGHT BEAM
T: INFORMATION

8a: COMPOSITE OPTICAL FILTER ARRAY
6a: OPTICAL SENSOR ARRAY (a)

REFRACTIVE INDEX VALUES IN 550 nm

| | FIRST OPTICAL FILTER 18 | | SECOND OPTICAL FILTER 19 | | THIRD OPTICAL FILTER 20 | |
|---|---|---|---|---|---|---|
| | REFRACTIVE INDEX | FILM THICKNESS (nm) | REFRACTIVE INDEX | FILM THICKNESS (nm) | REFRACTIVE INDEX | FILM THICKNESS (nm) |
| Lo | 1.5 | 50 | 1.5 | 50 | 1.5 | 50 |
| H1 | 2.5 | 100 | 2.2 | 100 | 2.2 | 50 |
| L1 | 1.5 | 150 | 1.5 | 150 | 1.5 | 150 |
| H2 | 2.5 | 100 | 2.2 | 100 | 2.2 | 100 |
| L2 | 1.5 | 200 | 1.5 | 200 | 1.5 | 150 |
| H3 | 2.5 | 100 | 2.2 | 100 | 2.2 | 50 |
| L3 | 1.5 | 200 | 1.5 | 200 | 1.5 | 150 |
| H4 | 2.5 | 100 | 2.2 | 100 | 2.2 | 50 |
| L4 | 1.5 | 250 | 1.5 | 200 | 1.5 | 200 |
| H5 | | | 2.2 | 100 | | |
| L5 | | | 1.5 | 150 | | |
| H6 | | | 2.2 | 50 | | |
| L6 | | | 1.5 | 100 | | |
| H7 | | | 2.2 | 50 | | |
| L7 | | | 1.5 | 100 | | |
| H8 | | | 2.2 | 50 | | |
| L8 | | | 1.5 | 150 | | |

9a: LENS ARRAY
8a: COMPOSITE OPTICAL FILTER ARRAY
6a: OPTICAL SENSOR ARRAY

8a: COMPOSITE OPTICAL FILTER ARRAY
9a: LENS ARRAY
6a: OPTICAL SENSOR ARRAY

8a: COMPOSITE OPTICAL FILTER ARRAY
9a, 9b: LENS ARRAY
6a: OPTICAL SENSOR ARRAY

FIG. 41
(a) PHOTO CAPTURED UNDER VISIBLE LIGHT
(b) PHOTO CAPTURED UNDER INFRARED RADIATION
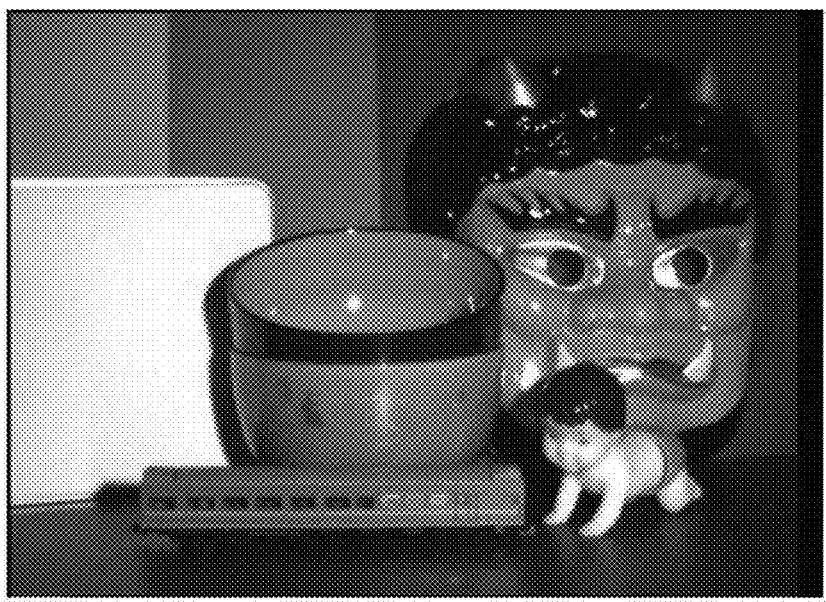

LIGHT DETECTING DEVICE, SOLID-STATE IMAGE CAPTURING APPARATUS, AND METHOD FOR MANUFACTURING THE SAME

TECHNICAL FIELD

The present invention relates to a light detecting device, a solid-state image capturing apparatus, and a method for manufacturing the same using an object under a normal-illuminance environment, a low-illuminance environment, an extremely-low-illuminance environment, and a 0 lux environment as a target.

BACKGROUND ART

In recent years, a high-sensitivity camera capable of performing color imaging with visible light of an object under a low-illuminance environment has been developed.

However, even when such a high-sensitivity camera is used, it is not possible to perform color imaging with visible light of an object under an extremely-low-illuminance environment where visible light is almost absent, for example, at night, or under a completely dark environment where visible light is absent, that is, under a 0 lux environment.

Meanwhile, in imaging an object under such an extremely-low-illuminance environment or 0 lux environment, normally, an infrared camera is used, but in this case, since color information is not obtained, monochrome imaging is performed.

Realization of an image sensor capable of performing color imaging of an object under an extremely-low-illuminance environment or 0 lux environment such as an in-vehicle camera capable of clearly reading a mark color or the like, or a security camera capable of distinctly reading a color of clothes of a suspicious person, even in the middle of night, is desired.

On the other hand, a color signal processing circuit has been proposed (for example, see PTL 1). The color signal processing circuit acquires a color signal and an infrared signal output from a color image sensor that includes plural color component photoelectric conversion elements that are respectively provided with color filters that respectively transmit different color components on a light receiving surface thereof and receive incident light to selectively output color signals corresponding to intensities of the different color components, and an infrared component photoelectric conversion element that is provided with an infrared component transmission filter that transmits an infrared component on a light receiving surface thereof and selectively outputs an infrared signal for correcting an infrared component included in at least one of the plural color signals. The color signal processing circuit controls at least two signal gains in the color signals based on the infrared signal in order to perform adjustment of white balance of the color signals.

Further, an image input device has been proposed (for example, see PTL 2). The image input device includes a solid-state image sensor that includes plural pixels that receive visible light and infrared light from an object and convert the visible light and the infrared light into a visible light signal and an infrared light signal, respectively, storage means for storing correction data including a correction value for each pixel of the solid-state image sensor with respect to the visible light signal, correction means for correcting the visible light signal output from the solid-state image sensor based on the correction data stored in the storage means, and formation means for calculating chrominance information from the corrected visible light signal and calculating luminance information from the corrected visible light signal and the infrared light signal to form a color image signal, in which the correction data is updated at a predetermined timing.

On the other hand, an image sensor has been proposed (for example, see PTL 3). The image sensor includes a radiation unit, an imaging unit, and a color specification setting unit, in which the radiation unit radiates infrared light having different wavelength intensity distributions to an object, the imaging unit captures an image of the object based on the infrared light having the different wavelength intensity distributions reflected from the object to form image information expressing respective images, and the color specification setting unit sets color specification information for color-specifying the respective images expressed by the formed image information with different monochromes for the image information.

CITATION LIST

Patent Literature

PTL 1: Japanese Unexamined Patent Application Publication No. 4286123 (Jul. 7, 2005)
PTL 2: Japanese Unexamined Patent Application Publication No. 2012-009983 (Jan. 12, 2012)
PTL 3: Japanese Unexamined Patent Application Publication No. 2011-50049 (Mar. 10, 2011)

SUMMARY OF INVENTION

Technical Problem

However, the color signal processing circuit disclosed in PTL 1 corrects an infrared component included in a signal of the color component photoelectric conversion element by using a signal of the infrared component photoelectric conversion element, but imaging of an object under an extremely-low-illuminance environment or 0 lux environment is not possible, and thus, is different from an aspect of the invention and an embodiment of the invention to be disclosed later.

Further, since the image input device disclosed in PTL 2 cannot sufficiently acquire a visible light signal, it is not possible to perform imaging of an object under an extremely-low-illuminance environment or 0 lux environment, and thus, is different from an aspect of the invention and an embodiment of the invention to be disclosed later.

Further, the image sensor disclosed in PTL 3 does not disclose components and a method for manufacturing the components according to an aspect of the invention and an embodiment of the invention.

An object of the invention is to provide a light detecting device, a solid-state image capturing apparatus, and a method for manufacturing the same capable of performing color reproduction and color imaging of an object under a normal-illuminance environment, a low-illuminance environment, an extremely-low-illuminance environment, and a 0 lux environment.

Solution to Problem

In order to solve the above-mentioned problems, a light detecting device according to an aspect of the invention includes: an optical filter that transmits a first wavelength light having a wavelength in a first wavelength range, a second wavelength light having a wavelength in a second wavelength range, . . . , and an n-th wavelength light having a wavelength in an n-th wavelength range (n is an integer), in light from an object; an optical sensor that detects at least one of a first wavelength light intensity of the first wavelength light, a second wavelength light intensity of the second wavelength light, . . . , and an n-th wavelength light intensity of the n-th wavelength light; and an analysis unit that estimates a light intensity of light having a wavelength in a wavelength range other than at least one of the first wavelength range, the second wavelength range, . . . , and the n-th wavelength range based on at least one of the first wavelength light intensity, the second wavelength light intensity, . . . , and the n-th wavelength light intensity detected by the optical sensor. Here, a correlative relationship exists between a light intensity of light having a wavelength in the at least one wavelength range and the light intensity of the light having the wavelength in the wavelength range other than the at least one wavelength range.

In order to solve the above-mentioned problems, another light detecting device according to the aspect of the invention includes: plural optical filters having different transmission wavelength bands; and plural optical sensors that receive light respectively passed through the plural optical filters. Here, each of the plural optical filters is configured so that plural layered members having a transmittance of 50% or greater in wavelength regions of visible light and infrared light are layered, and the plural layered members have the same or different refractive indexes, respectively. Further, each of the plural optical filters reflects light of a predetermined wavelength range in order to transmit light of a different wavelength range, and the plural optical filters are arranged in plan with a space or a spacer member being interposed therebetween.

The other light detecting device according to the aspect of the invention may further include plural lenses provided on a side opposite to the plural optical sensors with respect to the plural optical filters.

The other light detecting device according to the aspect of the invention may further include plural lenses arranged between the plural optical filters and the plural optical sensors.

The other light detecting device according to the aspect of the invention may further include plural first lenses provided on a side opposite to the plural optical sensors with respect to the plural optical filters, and plural second lenses arranged between the plural optical filters and the plural optical sensors.

In the light detecting device according to the aspect of the invention, light from the object may be infrared light, and the analysis unit may estimate a color, under visible light, of the object that reflects the infrared light, based on at least one of the first wavelength light intensity, the second wavelength light intensity, . . . , and the n-th wavelength light intensity detected by the optical sensors.

A light detecting device according to an aspect of the invention may further include an analysis unit that estimates a color, under visible light, of an object that reflects the infrared light, based on at least one of the first wavelength light intensity, the second wavelength light intensity, . . . , and the n-th wavelength light intensity detected by the plural optical sensors.

In order to solve the above-mentioned problems, a solid-state image capturing apparatus according to an aspect of the invention includes a composite optical filter array that includes plural composite optical filters and an optical sensor array in which plural optical sensors are arranged. Here, each of the plural composite optical filters includes plural optical filters having different transmission wavelength bands, and each of the plural optical filters transmits visible light having a predetermined wavelength and infrared light having a predetermined wavelength. Plural layered members having different refractive indexes are layered in each of the plural optical filters, and the plural optical sensors have sensitivity to the visible light and the infrared light. The plural optical filters are regularly arranged in plan, and the plural optical sensors are regularly arranged in plan.

The solid-state image capturing apparatus according to the aspect of the invention may further include a lens array that is arranged on a side opposite to the optical sensor array with respect to the composite optical filter array, and the plural lenses may be regularly arranged in plan.

The solid-state image capturing apparatus according to the aspect of the invention may further include a lens array that is disposed between the composite optical filter array and the optical sensor array and includes plural lenses, and the plural lenses may be regularly arranged in plan to correspond to the plural optical filters.

The solid-state image capturing apparatus according to the aspect of the invention may further include a first lens array that is arranged on a side opposite to the optical sensor array with respect to the composite optical filter array and has plural first lenses, and a second lens array that is arranged between the composite optical filter array and the optical sensor array and has plural second lenses, and the plural first and second lenses may be regularly arranged in plan to correspond to the plural optical filters.

The solid-state image capturing apparatus according to the aspect of the invention, the optical filter may absorb visible light other than the visible light having the predetermined wavelength and infrared light other than the infrared light having the predetermined wavelength, and thus, may transmit the visible light having the predetermined wavelength and the infrared light having the predetermined wavelength.

In the solid-state image capturing apparatus according to the aspect of the invention, the optical filter may reflect visible light other than the visible light having the predetermined wavelength and infrared light other than the infrared light having the predetermined wavelength, and thus, may transmit the visible light having the predetermined wavelength and the infrared light having the predetermined wavelength.

In the solid-state image capturing apparatus according to the aspect of the invention, the layered member may include at least one of an organic material and an inorganic material.

In the solid-state image capturing apparatus according to the aspect of the invention, the stacked member may be a dielectric substance.

In the solid-state image capturing apparatus according to the aspect of the invention, the shape of the optical filter may be a plate shape, a concave shape, a bowl shape, or a disk shape.

In the solid-state image capturing apparatus according to the aspect of the invention, the shape of the plural layered members may be a plate shape, a concave shape, a bowl shape, or a disk shape.

In the solid-state image capturing apparatus according to the aspect of the invention, the shape of the optical filter may be a cube, a rectangle, a prism, a pyramid, a frustum, a cylinder, a cone, a truncated cone, an elliptic cylinder, an elliptical cone, an elliptical frustum, a drum shape or a barrel shape.

In the solid-state image capturing apparatus according to the aspect of the invention, when a width is a size of the optical filters along the plane on which the optical filters are arranged, a length is a size of the optical filters along the plane, vertical to the size along the plane, and a height is a size of the optical filters vertical to the plane, the optical filters may have sizes which are equal or close to each other in the width, the length, and the height.

In the solid-state image capturing apparatus according to the aspect of the invention, when a width is a size of the optical filters along the plane on which the optical filters are arranged, a length is a size of the optical filters along the plane, vertical to the size along the plane, and a height is a size of the optical filters vertical to the plane, the optical filters may be formed by layering plural layered members having a size of a width of 10 micrometers or less, a length of 10 micrometers or less, and a height of 1 micrometer or less and having different refractive indexes.

In the solid-state image capturing apparatus according to the aspect of the invention, a space may be formed between the plural optical filters.

In the solid-state image capturing apparatus according to the aspect of the invention, a spacer member may be formed between the plural optical filters.

Another solid-state image capturing apparatus according to the aspect of the invention includes a first composite optical filter array, an optical sensor array, and a second composite optical filter array that is disposed between the first composite optical filter array and the optical sensor array or on a side opposite to the optical sensor array with respect to the first composite optical filter array. Here, the first composite optical filter array includes plural first composite optical filters, and each of the plural first composite optical filters include plural first optical filters having different transmission wavelength bands. The second composite optical filter array includes plural second composite optical filters, and each of the plural second composite optical filters includes plural second optical filters having different transmission wavelength bands. Each of the plural optical filters that form the plural first composite optical filters is formed of an inorganic or organic material, and each of the plural optical filters that form the plural second composite optical filters is formed of an organic or inorganic material. The plural respective optical filters that form the plural first composite optical filters are regularly arranged in plan, and the plural respective optical filters that form the plural second composite optical filters are regularly arranged in plan so as to correspond to the plural respective optical filters that form the plural first composite optical filters. A combination of one optical filter among the plural optical filters that form the plural first composite optical filters and one optical filter among the plural optical filters that form the plural second composite optical filters corresponding to the one optical filter among the plural optical filters that form the plural first composite optical filters transmits visible light having a predetermined wavelength and infrared light having a predetermined wavelength. The optical sensor array includes plural optical sensors having sensitivity to the visible light and the infrared light. The plural respective optical sensors are regularly arranged in plan so as to correspond to the plural optical filters. Here, the composite optical filters may be formed of the same material.

In the solid-state image capturing apparatus according to the aspect of the invention, the inorganic material may include silicon oxide, silicon nitride, or titanium oxide.

In the other solid-state image capturing apparatus according to the aspect of the invention, plural layered members having difference refractive indexes may be layered in each of the plural first and second optical filters.

In the other solid-state image capturing apparatus according to the aspect of the invention, each of the plural first and second optical filters may include plural high-refractive-index layers, the high-refractive-index layer may be a layer formed by a layered member having a highest refractive index in the wavelength regions of the visible light and the infrared light among the plural layered members formed in the plural respective first and the second optical filters, and the plural respective high-refractive-index layers may have different refractive indexes.

In the other solid-state image capturing apparatus according to the aspect of the invention, each of the plural first and second optical filters may include plural low-refractive-index layers, the low-refractive-index layer may be a layer formed by a layered member having a lowest refractive index in the wavelength regions of the visible light and the infrared light among the plural layered members formed in the plural respective first and the second optical filters, and the plural respective low-refractive-index layers may have different refractive indexes.

In the other solid-state image capturing apparatus according to the aspect of the invention, each of the plural first and second optical filters may include a lowermost layer, an uppermost layer, a layer adjacent to the lowermost layer, and a layer adjacent to the uppermost layer. Here, a ratio between a refractive index of the lowermost layer and a refractive index of the layer adjacent to the lowermost layer may be 85% or greater and 115% or less, and a ratio between a refractive index of the uppermost layer and a refractive index of a layer adjacent to the uppermost layer may be 85% or greater and 115% or less.

In order to solve the above-mentioned problems, still another solid-state image capturing apparatus according to the aspect of the invention includes a composite optical filter array that includes plural composite optical filters, and an optical sensor array in which plural optical sensors are arranged. Here, each of the plural composite optical filters includes a first optical filter that transmits light in a first wavelength range group, a second optical filter that transmits light in a second wavelength range group, . . . , and an n-th optical filter that transmits light in an n-th wavelength range group (n is an integer). A k-th wavelength range group (k is an integer that satisfies 1≤k≤n) includes a (k, 1) wavelength range, a (k, 2) wavelength range, . . . , and a (k, m) wavelength range (m is an integer). A correlative relationship exists between light intensities of the respective (k, 1) wavelength range, the (k, 2) wavelength range, . . . , and the (k, m) wavelength range. The composite optical sensor includes a first optical sensor, a second optical sensor, . . . , and an n-th optical sensor. A k-th optical sensor detects at least one of the respective light intensities of the (k, 1) wavelength range, the (k, 2) wavelength range, . . . , and the (k, m) wavelength range. The solid-state image capturing apparatus further includes an analysis unit that estimates, from a light intensity of light having a wavelength in the at least one wavelength range, a light intensity of light having a wavelength in a wavelength range other than the at least one wavelength range. A correlative relationship exists between the light intensity of the light having the wavelength in the at least one wavelength range and the light intensity of the light having the wavelength in the wavelength range other than the at least one wavelength range.

In the still other solid-state image capturing apparatus according to the aspect of the invention, one of the first to n-th optical filters may transmit red light having a red light wavelength region, and infrared light having a wavelength region which is closest to the red light wavelength region.

In the solid-state image capturing apparatus according to the aspect of the invention, n may be 3, the (1, 1) wavelength range may correspond to a red wavelength region, the (1, 2) wavelength range may correspond to a first infrared wavelength region, the (2, 1) wavelength range may correspond to a blue wavelength region, the (2, 2) wavelength range may correspond to a second infrared wavelength region, the (3, 1) wavelength range may correspond to a green wavelength region, and the (3, 2) wavelength range may correspond to a third infrared wavelength region. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a blue wavelength region and a red wavelength region, the (1, 2) wavelength range may include a first infrared wavelength region and a second infrared wavelength region, the (2, 1) wavelength range may include a green wavelength region and the blue wavelength region, the (2, 2) wavelength range may include the second infrared wavelength region and a third infrared wavelength region, the (3, 1) wavelength range may include the red wavelength region and the green wavelength region, and the (3, 2) wavelength range may include the first infrared wavelength region and the third infrared wavelength region. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the red wavelength region, the (2, 2) wavelength range may include the first infrared wavelength region, the (3, 1) wavelength range may include the green wavelength region, and the (3, 2) wavelength range may include the third infrared wavelength. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the green wavelength region, the (2, 2) wavelength range may include the third infrared wavelength region, the (3, 1) wavelength range may include the blue wavelength region, and the (3, 2) wavelength range may include the second infrared wavelength region. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the blue wavelength region, the (2, 2) wavelength range may include the second infrared wavelength region, the (3, 1) wavelength range may include the red wavelength region, and the (3, 2) wavelength range may include the first infrared wavelength. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the green wavelength region and the blue wavelength region, the (2, 2) wavelength range may include the third infrared wavelength region and the second infrared wavelength region, the (3, 1) wavelength range may include the blue wavelength region and the red wavelength region, and the (3, 2) wavelength range may include the second infrared wavelength region and the first infrared wavelength region. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the blue wavelength region and the red wavelength region, the (2, 2) wavelength range may include the second infrared wavelength region and the first infrared wavelength region, the (3, 1) wavelength range may include the red wavelength region and the green wavelength region, and the (3, 2) wavelength range may include the first infrared wavelength region and the third infrared wavelength region. Here, the second infrared wavelength region may be positioned on a longer wavelength side with respect to the first infrared wavelength region, and the third infrared wavelength region may be positioned on a wavelength side with respect to the second infrared wavelength region.

In the solid-state image capturing apparatus according to the aspect of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the red wavelength region and the green wavelength region, the (2, 2) wavelength range may include the first infrared wavelength region and the third infrared wavelength region, the (3, 1) wavelength range may include the green wavelength region and the blue wavelength region, and the (3, 2) wavelength range may include the third infrared wavelength region and the second infrared wavelength region. Here, the second infrared wavelength region may be positioned on a longer wavelength side with respect to the first infrared wavelength region, and the third infrared wavelength region may be positioned on a longer wavelength side with respect to the second infrared wavelength region.

In the solid-state image capturing apparatus according to the aspect of the invention, plural layered members having a transmittance of 50% or more may be layered in space or in wavelength regions of visible light and infrared light, in the first optical filter.

In the solid-state image capturing apparatus according to the aspect of the invention, the analysis unit may calculate the intensity of light from an object having a wavelength of the blue wavelength region and a wavelength of the second infrared wavelength region based on the intensity of light that passes through the first optical filter, the intensity of light that passes through the second optical filter, and the intensity of light that passes through the third optical filter.

In the solid-state image capturing apparatus according to the aspect of the invention, the analysis unit may calculate the intensity of light from an object having a wavelength of the red wavelength region and a wavelength of the first infrared wavelength region based on the intensity of light that passes through the first optical filter, the intensity of light that passes through the second optical filter, and the intensity of light that passes through the third optical filter.

In the solid-state image capturing apparatus according to the aspect of the invention, the analysis unit may calculate the intensity of light from an object having a wavelength of the green wavelength region and a wavelength of the third infrared wavelength region based on the intensity of light that passes through the first optical filter, the intensity of light that passes through the second optical filter, and the intensity of light that passes through the third optical filter.

In the solid-state image capturing apparatus according to the aspect of the invention, the analysis unit may calculate the intensity of light from an object having a wavelength of the red wavelength region, a wavelength of the green wavelength region, a wavelength of the first infrared wavelength region, and a wavelength of the third infrared wavelength region based on the intensity of light that passes through the first optical filter, the intensity of light that passes through the second optical filter, and the intensity of light that passes through the third optical filter.

In the solid-state image capturing apparatus according to the aspect of the invention, the analysis unit may calculate the intensity of light from an object having a wavelength of the blue wavelength region, a wavelength of the green wavelength region, a wavelength of the third infrared wavelength region, and a wavelength of the second infrared wavelength region based on the intensity of light that passes through the first optical filter, the intensity of light that passes through the second optical filter, and the intensity of light that passes through the third optical filter.

In the solid-state image capturing apparatus according to the aspect of the invention, the analysis unit may calculate the intensity of light from an object having a wavelength of the blue wavelength region, a wavelength of the red wavelength region, a wavelength of the second infrared wavelength region, and a wavelength of the first infrared wavelength region based on the intensity of light that passes through the first optical filter, the intensity of light that passes through the second optical filter, and the intensity of light that passes through the third optical filter.

The solid-state image capturing apparatus according to the aspect of the invention may further include a conversion unit that performs color conversion using matrix calculation.

In the solid-state image capturing apparatus according to the aspect of the invention, a refractive index of the high-refractive-index layer that transmits light having a wavelength of a blue wavelength region may be lower than a refractive index of the high-refractive-index layer that transmits light having a wavelength of a green wavelength region, and a refractive index of the high-refractive-index layer that transmits light having a wavelength of a red wavelength region.

In the solid-state image capturing apparatus according to the aspect of the invention, plural layered members having different thicknesses may be layered in each of the plural composite optical filters.

In the solid-state image capturing apparatus according to the aspect of the invention, any one of the optical filters, and the first to n-th optical filters may include plural layered members of which refractive indexes and thicknesses are $(n_1, d_1)$, $(n_2, d_2)$, ..., and $(n_i, d_i)$, respectively, and may transmit visible light in a predetermined wavelength region and infrared light in a predetermined wavelength region by appropriately setting respective values of $(n_1, d_1)$, $(n_2, d_2)$, ..., and $(n_i, d_i)$ (i is an integer).

In the solid-state image capturing apparatus according to the aspect of the invention, the plural optical filters or the first to n-th optical filters may include plural layered members of which refractive indexes and thicknesses are $(n^1_1, d^1_1)$, $(n^1_2, d^1_2)$, ..., and $(n^1_i, d^1_i)$; $(n^1_1, d^1_1)$, $(n^2_1, d^2_1)$, $d^2_2)$, ..., and $(n^2_i, d^2_i)$; ..., and $(n^p_1, d^p_1)$, $(n^p_2, d^p_2)$, ..., and $(n^p_i, d^p_i)$, respectively, and may transmit visible light in a predetermined wavelength region and infrared light in a predetermined wavelength region by appropriately setting respective values of $(n^1_1, d^1_1)$, $(n^1_2, d^1_2)$, ..., and $(n^1_i, d^1_i)$; $(n^2_1, d^2_1)$, $(n^2_2, d^2_2)$, ..., and $(n^2_i, d^2_i)$; ..., and $(n^p_1, d^p_1)$, $(n^p_2, d^p_2)$, ..., and $(n^p_i, d^p_i)$ (p is an integer that satisfies $1 \leq p \leq n$).

The solid-state image capturing apparatus according to the aspect of the invention may further include an electromagnetic wave radiation unit that radiates electromagnetic waves to an object.

The solid-state image capturing apparatus according to the aspect of the invention may further include an infrared radiation unit that radiates infrared light to an object.

The solid-state image capturing apparatus according to the aspect of the invention may further include a visible light radiation unit that radiates visible light to an object.

The solid-state image capturing apparatus according to the aspect of the invention may further include a visible light radiation unit that radiates visible light to an object and an infrared radiation unit that radiates infrared light to the object.

In the solid-state image capturing apparatus according to the aspect of the invention, the infrared light is near infrared light.

In the solid-state image capturing apparatus according to the aspect of the invention, the spacer member may include an organic material or an inorganic material.

In the solid-state image capturing apparatus according to the aspect of the invention, the size of the spacer member may be 10 micrometers or less.

In the solid-state image capturing apparatus according to the aspect of the invention, a size ratio of the optical filters to the spacer member along a plane vertical to a transmission direction of light with respect to the optical filters may be 0.5 or greater.

In the solid-state image capturing apparatus according to the aspect of the invention, a ratio, to the size of the optical filters or the first to n-th optical filters along a plane vertical to a transmission direction of light with respect to the optical filters or the first to n-th optical filters, of the size of the optical filters or the first to n-th optical filters along a direction vertical to the plane may be 0.5 or greater.

In the solid-state image capturing apparatus according to the aspect of the invention, a cycle at which the plural optical filters are regularly arranged in plan, a cycle at which the plural optical sensors are regularly arranged in plan, and a cycle at which the plural lenses are regularly arranged in plan may be different from each other.

In order to solve the above-mentioned problems, still another solid-state image capturing apparatus according to the aspect of the invention includes a composite optical filter array that includes plural composite optical filters and an optical sensor array in which plural optical sensors are arranged. Here, each of the plural composite optical filters includes plural optical filters having different transmission wavelength bands, and each of the plural optical filters transmits ultraviolet light having a predetermined wavelength, visible light having a predetermined wavelength, and infrared light having a predetermined wavelength. Each of the plural optical filters is formed by layering plural layered members having different refractive indexes. The plural optical sensors have sensitivity to the ultraviolet light, the visible light, and the infrared light. The plural optical filters are regularly arranged in plan, and the plural optical sensors are regularly arranged in plan.

In order to solve the above-mentioned problems, a method for manufacturing the solid-state image capturing apparatus according to the aspect of the invention includes forming a first optical sensor and a second optical sensor on a semiconductor substrate; forming an insulating film on the semiconductor substrate to cover the first optical sensor and the second optical sensor; forming a first optical filter corresponding to the first optical sensor on the insulating film; and forming a second optical filter corresponding to the second optical sensor on the insulating film. Here, the first optical filter and the second optical filter have different transmission wavelength bands and transmit visible light having a predetermined wavelength and infrared light having a predetermined wavelength. Further, each of the first optical filter and the second optical filter is formed by layering plural layered members having different refractive indexes. The first and second optical sensors have sensitivity to the visible light and the infrared light.

Advantageous Effects of Invention

According to the present invention, it is possible to perform color reproduction and color imaging of an object under a normal-illuminance environment, a low-illuminance environment, an extremely-low-illuminance environment, and a 0 lux environment. Further, it is possible to provide a light detecting device, a solid-state image capturing apparatus, and a method for manufacturing the same capable of performing color reproduction or forming a color image regardless of day and night. In addition, it is possible to reduce weights and sizes of the devices, and thus, it is possible to move the devices to all places, or to install the devices in the all places. Thus, it is possible to use the devices in various applications.

16(b) and 16(c) are graphs illustrating wavelength dependency of intensities of respective light beams that pass through optical filters.

FIGS. 17(a) to 17(g) are diagrams illustrating a method for manufacturing the solid-state image capturing apparatus according to Embodiment 10.

Figure 18:
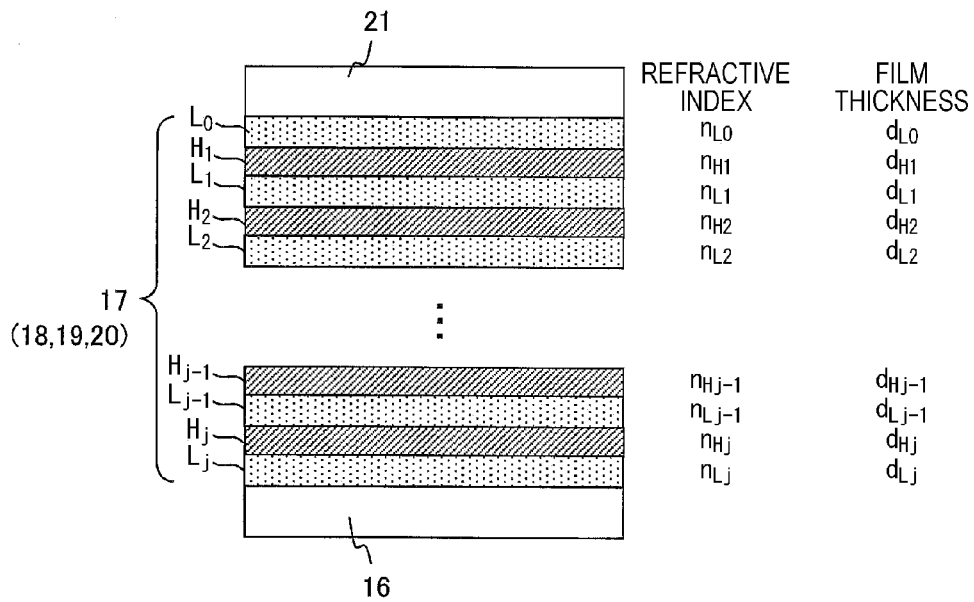

FIG. 18 is a cross-sectional view illustrating a structure of an inorganic film optical filter.

Figure 19:
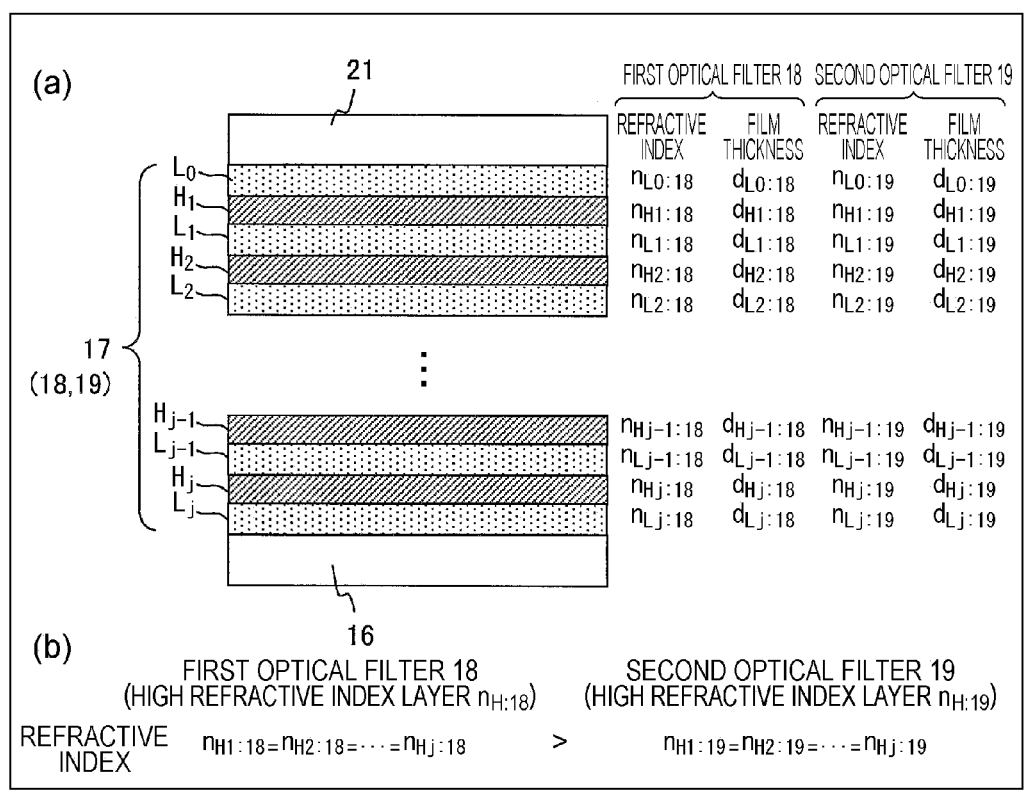

FIG. 19(a) is a diagram illustrating structures of a first optical filter and a second optical filter, and FIG. 19(b) is an expression of comparison of respective refractive indexes of high-refractive-index layers.

Figure 20:
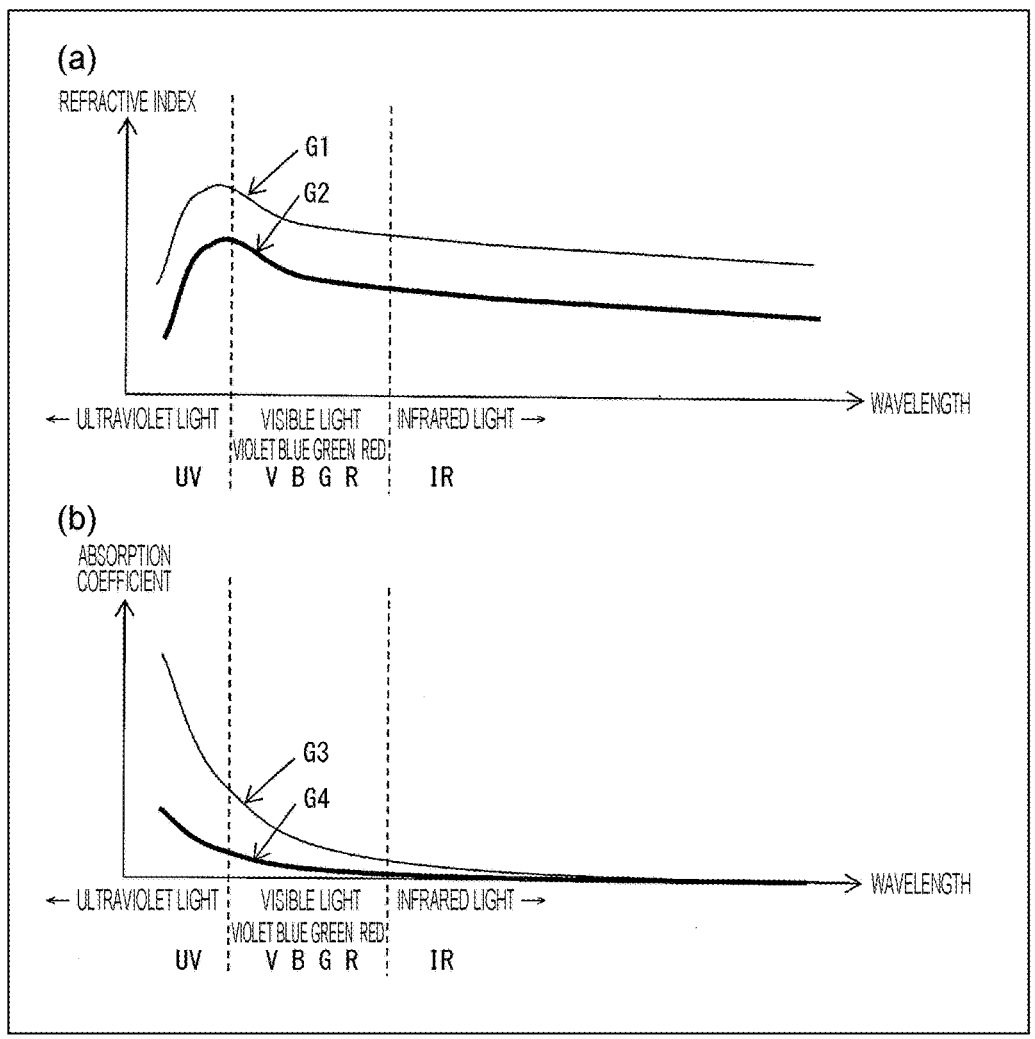

FIG. 20(a) is a graph illustrating a refractive index of an inorganic film optical filter, and FIG. 20(b) is a graph illustrating wavelength dependency of an absorption coefficient of the inorganic film optical filter.

FIG. 21(a) shows an example of refractive indexes and film thicknesses of first to third optical filters, and FIG. 21(b) shows wavelength dependency of transmittances of the optical filters.

Figure 22:
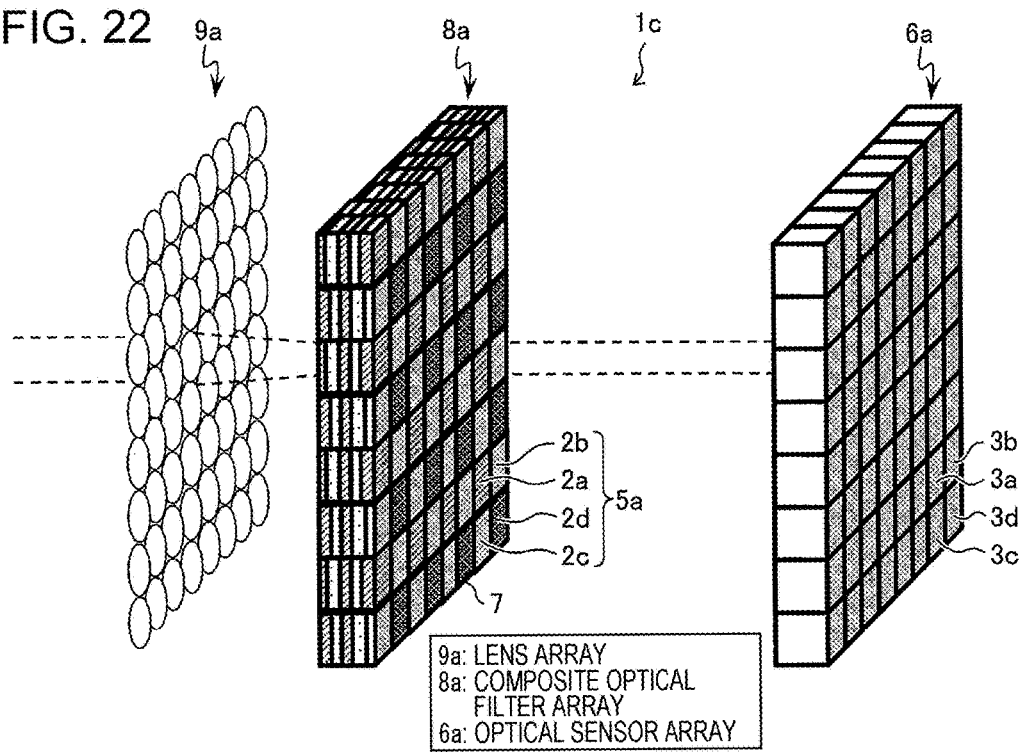

FIG. 22 is a diagram illustrating a configuration of a solid-state image capturing apparatus according to Embodiment 11 of the invention.

Figure 23:
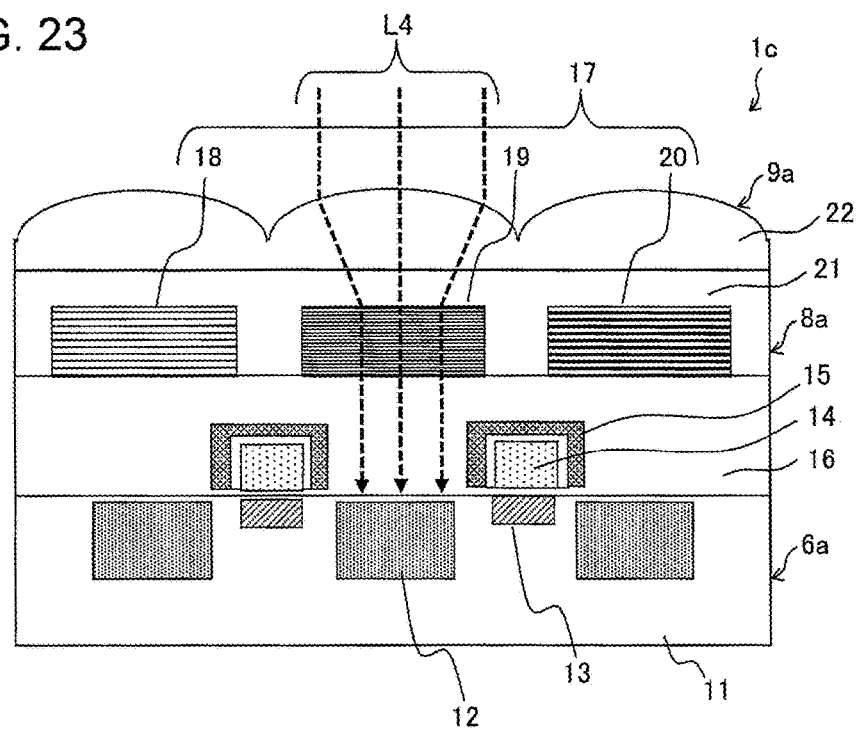

FIG. 23 is a cross-sectional view of the solid-state image capturing apparatus according to Embodiment 11.

FIGS. 24(a) and 24(b) are diagrams illustrating a method for manufacturing the solid-state image capturing apparatus according to Embodiment 11.

Figure 25:
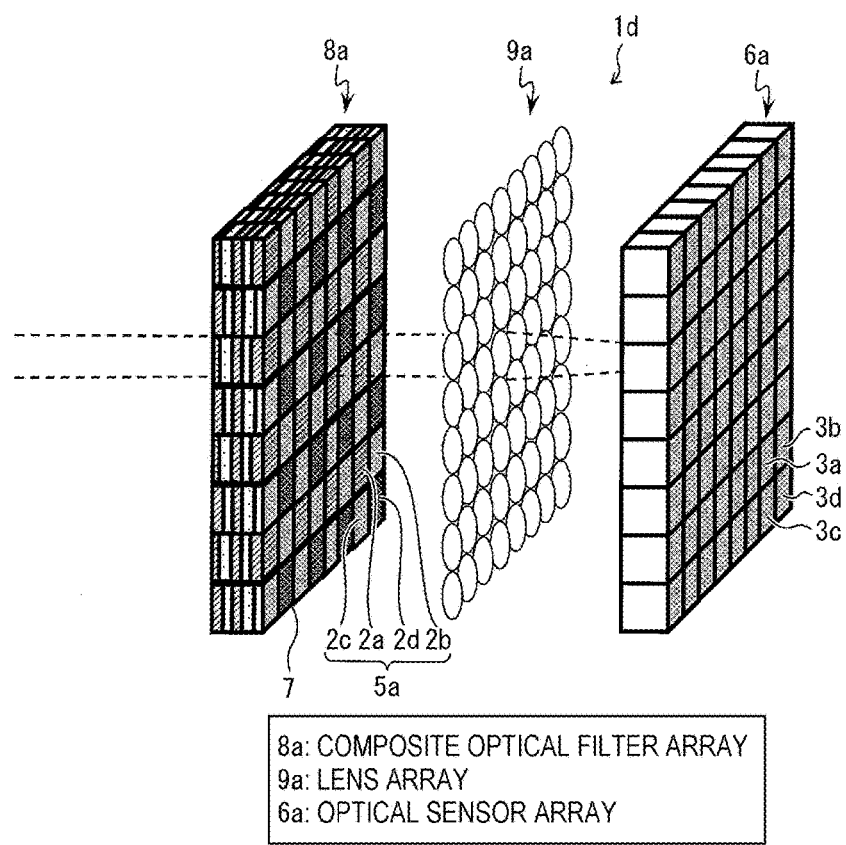

FIG. 25 is a diagram illustrating a configuration of a solid-state image capturing apparatus according to Embodiment 12 of the invention.

Figure 26:
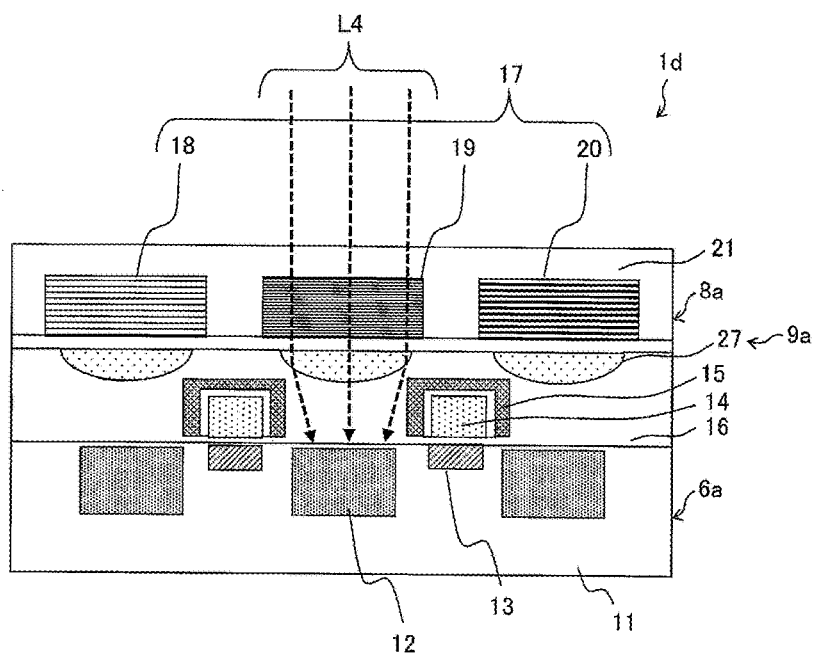

FIG. 26 is a cross-sectional view illustrating the solid-state image capturing apparatus according to Embodiment 12.

FIGS. 27(a) to 27(d) are diagrams illustrating a method for manufacturing the solid-state image capturing apparatus according to Embodiment 12.

Figure 28:
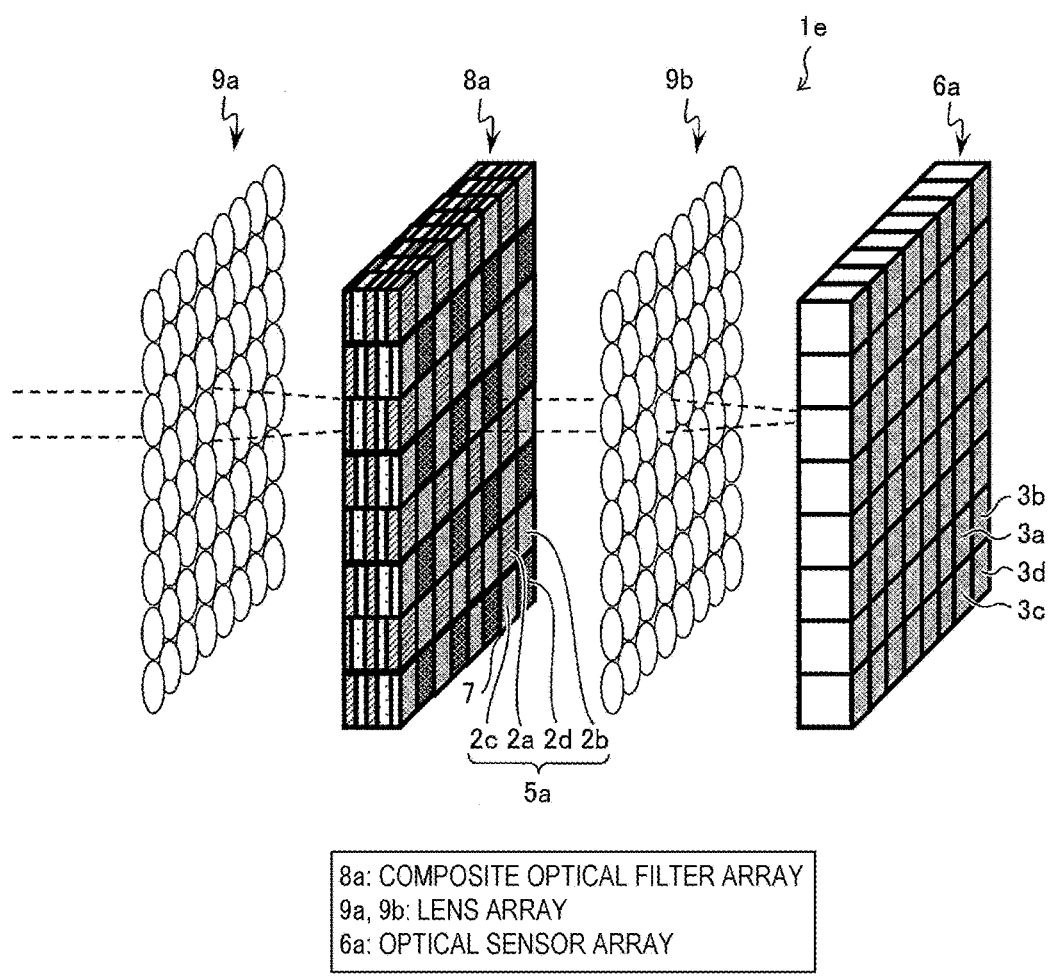

FIG. 28 is a diagram illustrating a configuration of a solid-state image capturing apparatus according to Embodiment 13.

Figure 29:
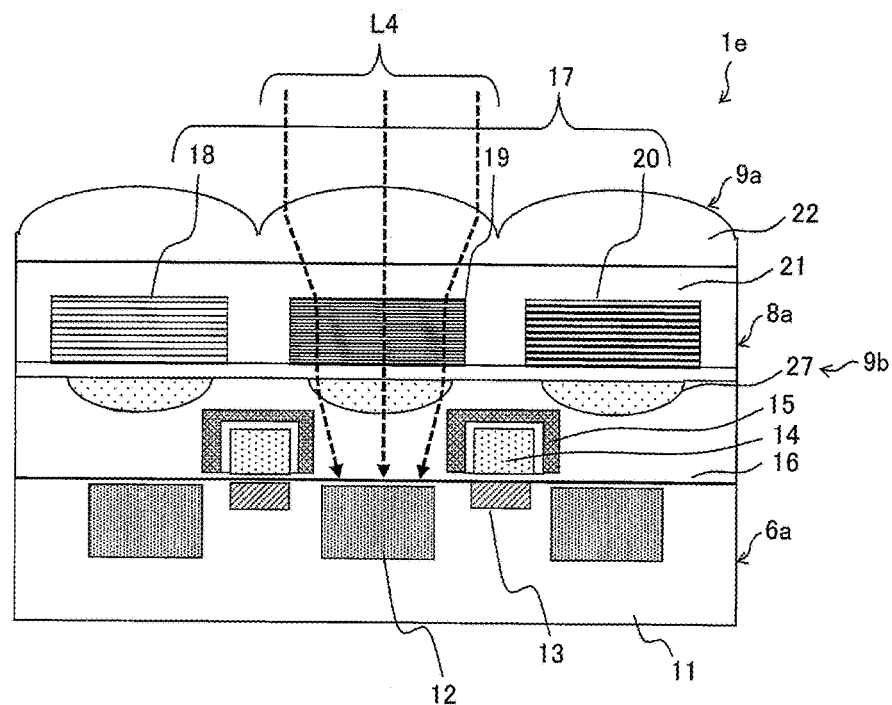

FIG. 29 is a cross-sectional view illustrating the solid-state image capturing apparatus according to Embodiment 13.

FIGS. 30(a) and 30(b) are diagrams illustrating a method for manufacturing a solid-state image capturing apparatus according to Embodiment 13.

FIG. 31(a) is a diagram illustrating a configuration of a solid-state image capturing apparatus according to Embodiment 14, and FIG. 31(b) is a diagram illustrating a configuration of another solid-state image capturing apparatus according to Embodiment 14.

Figure 32:
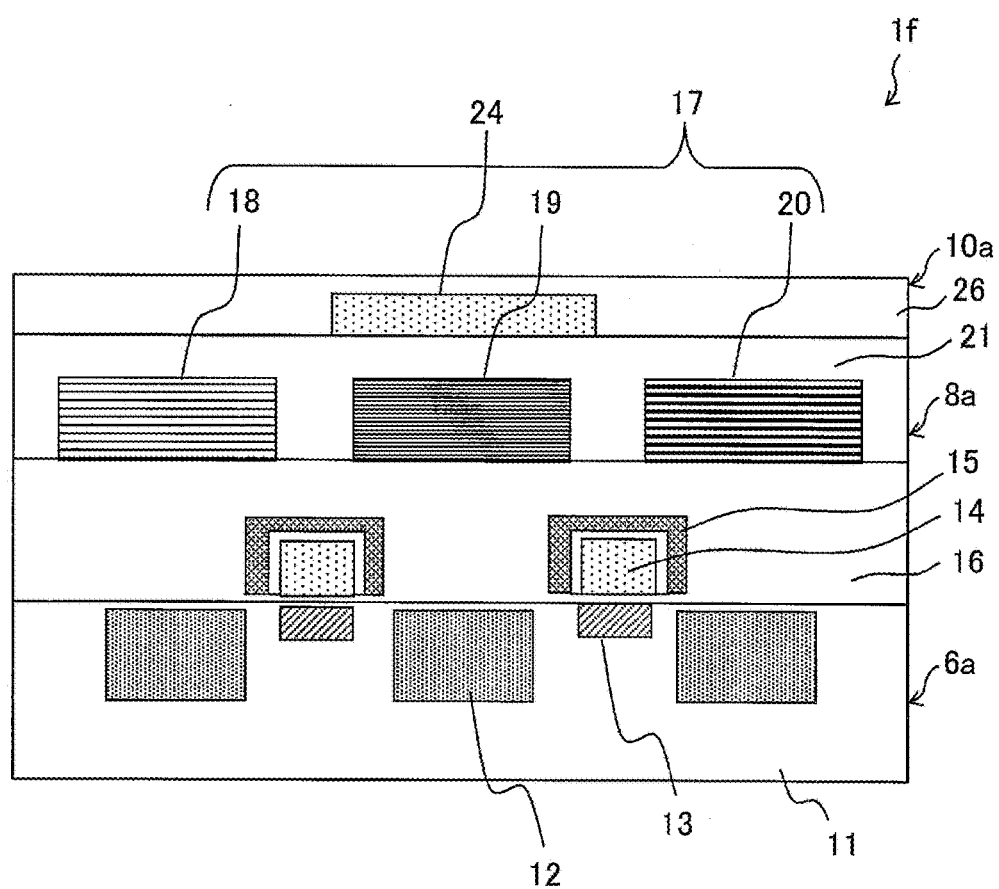

FIG. 32 is a cross-sectional view illustrating the solid-state image capturing apparatus according to Embodiment 14.

Figure 33:
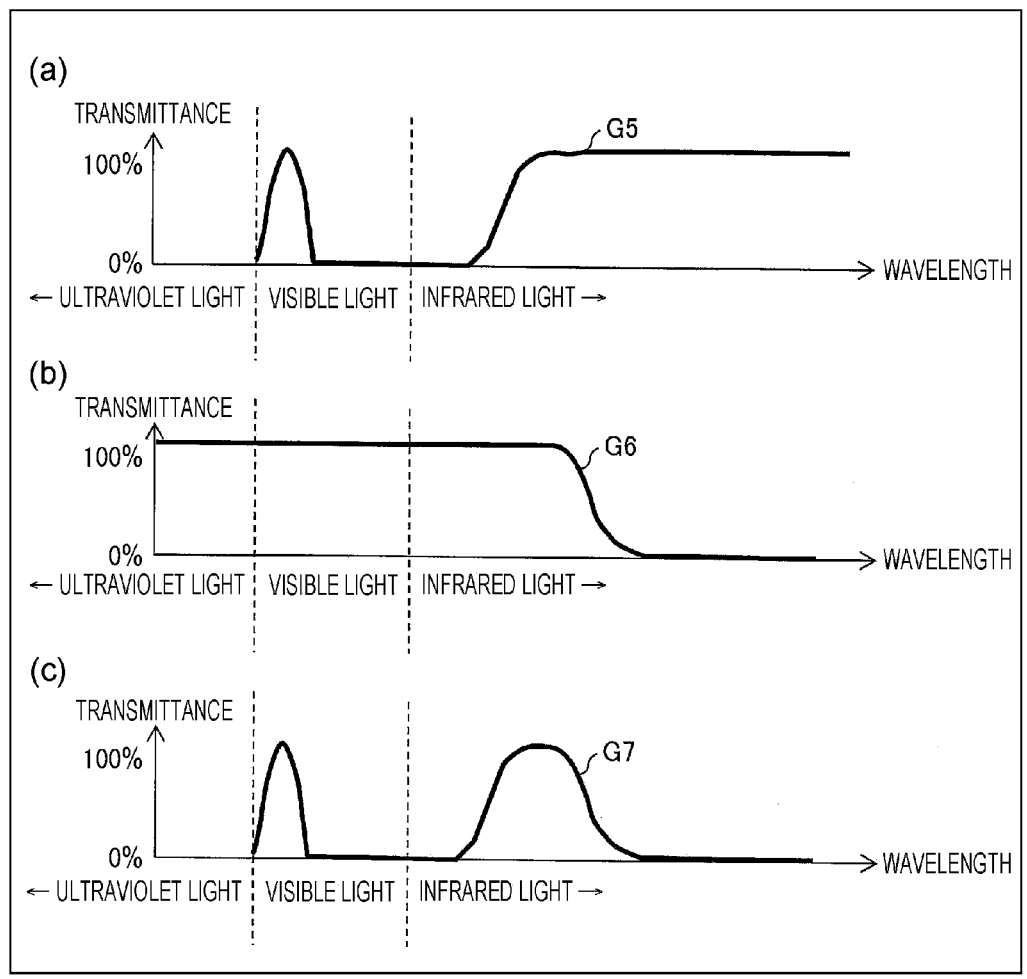

FIG. 33(a) is a graph illustrating wavelength dependency of a transmittance of an organic film optical filter for obtaining a second optical filter feature, FIG. 33(b) is a graph illustrating wavelength dependency of a transmittance of an inorganic optical filter, and FIG. 33(c) is a graph illustrating wavelength dependency of a total transmittance.

Figure 34:
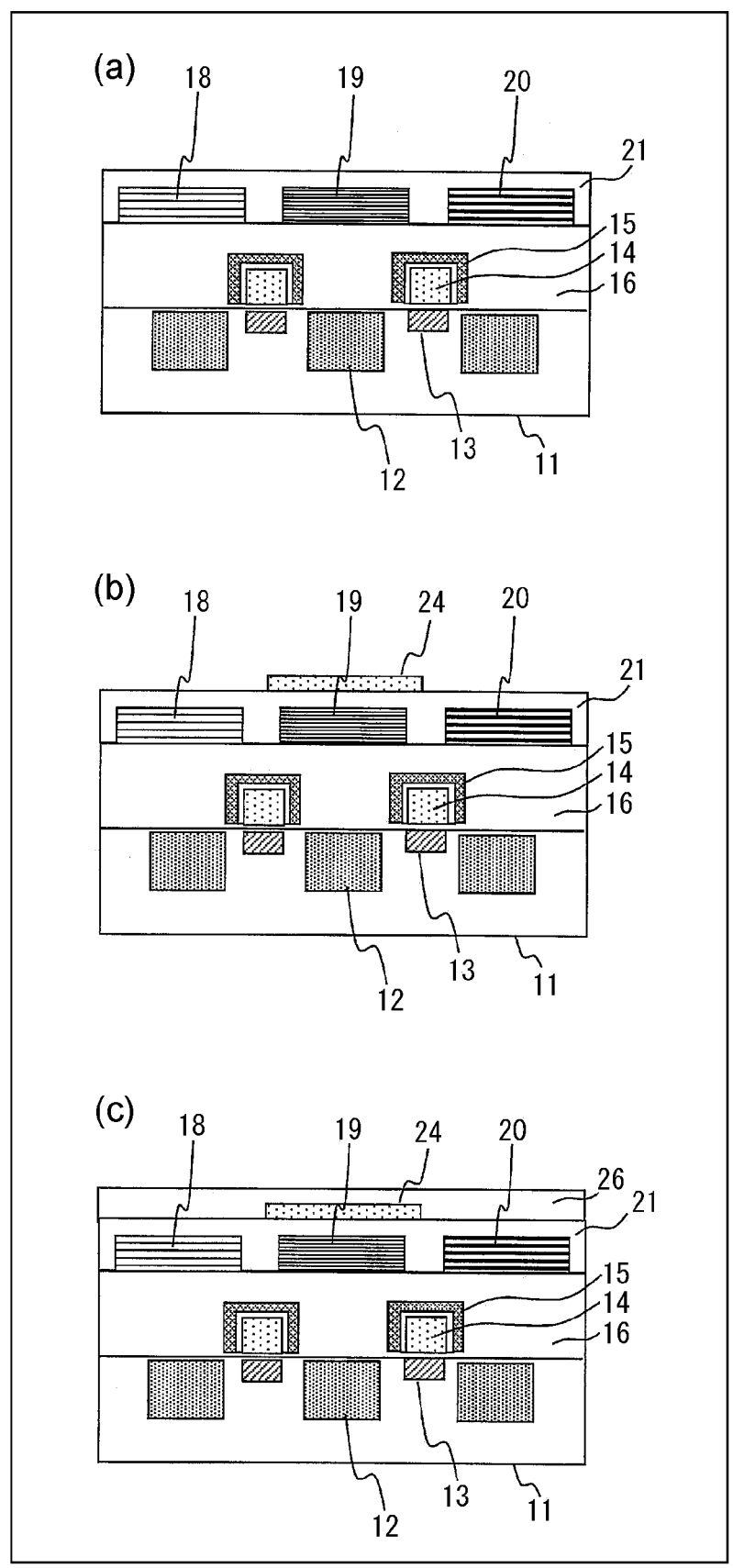

FIGS. 34(a) to 34(c) are diagrams illustrating a method for manufacturing the solid-state image capturing apparatus according to Embodiment 14.

Figure 35:
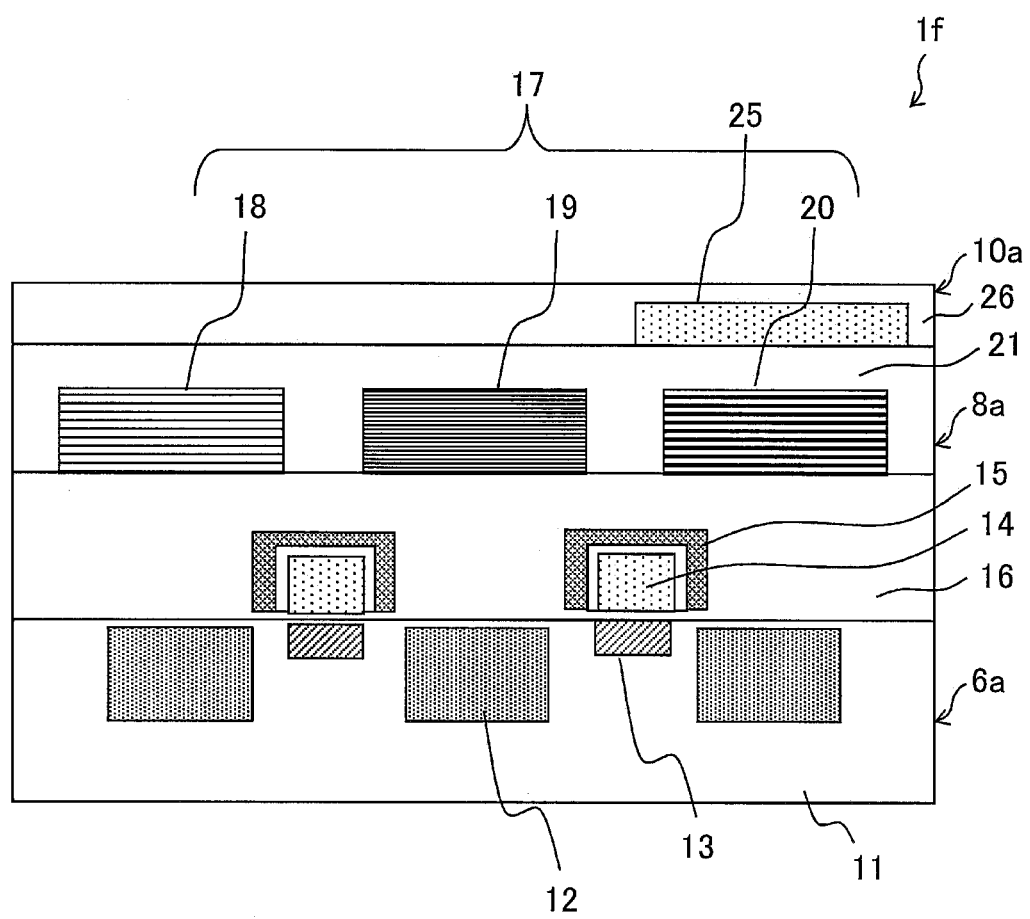

FIG. 35 is a cross-sectional view of the solid-state image capturing apparatus according to Embodiment 14.

Figure 36:
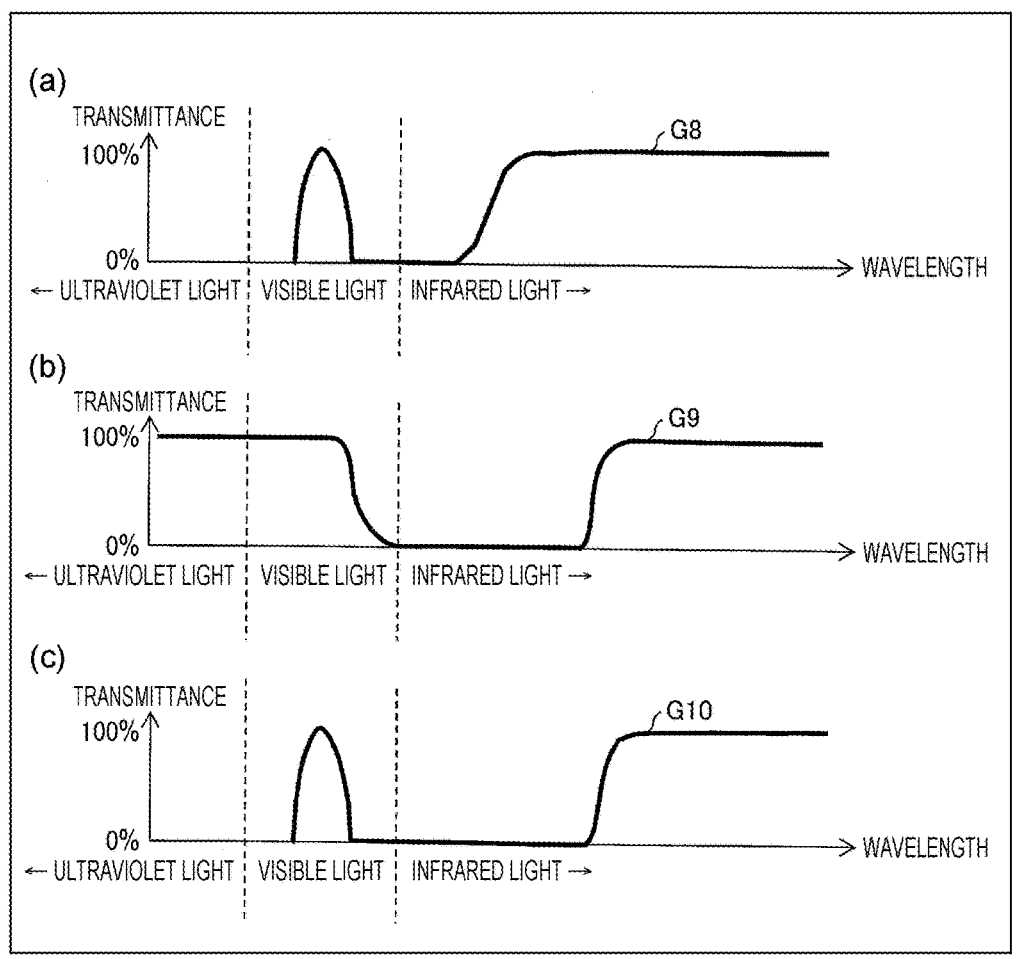

FIG. 36(a) is a graph illustrating wavelength dependency of a transmittance of an organic film optical filter for obtaining a third optical filter feature, FIG. 36(b) is a graph illustrating wavelength dependency of a transmittance of an inorganic optical filter, and FIG. 36(c) is a graph illustrating wavelength dependency of a total transmittance.

Figure 37:
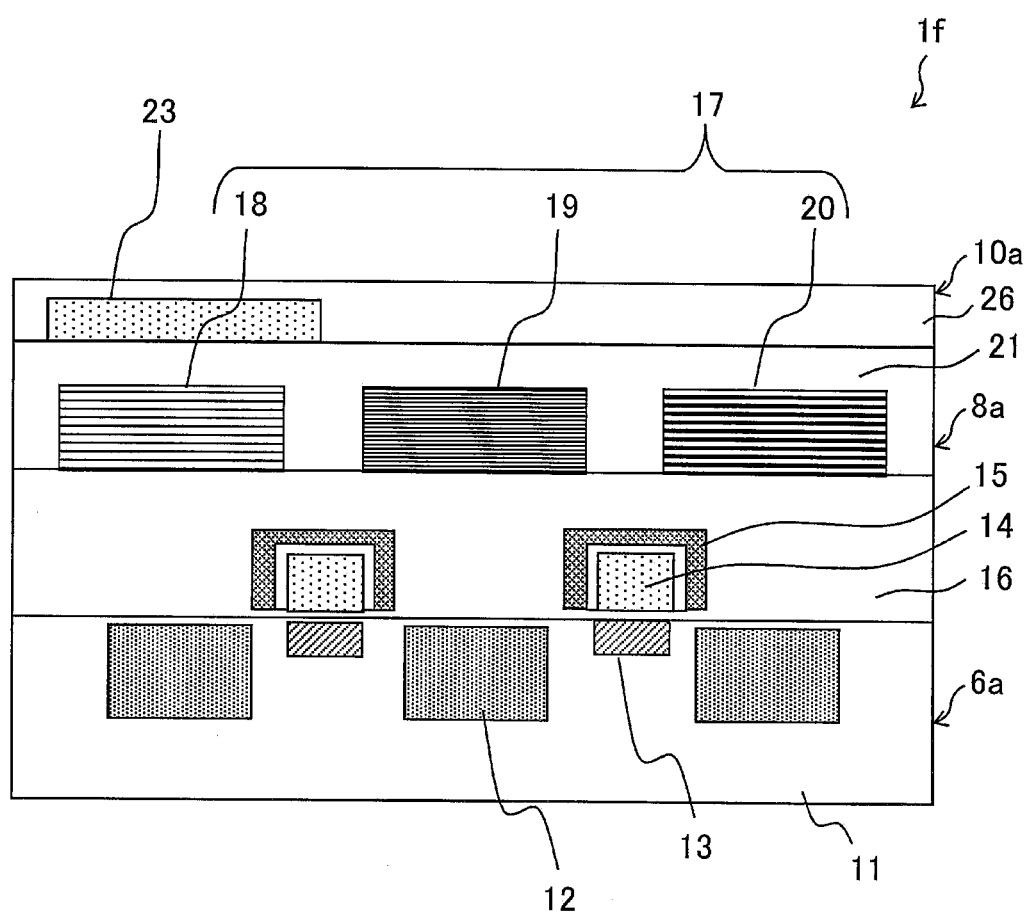

FIG. 37 is a cross-sectional view of the solid-state image capturing apparatus according to Embodiment 14.

Figure 38:
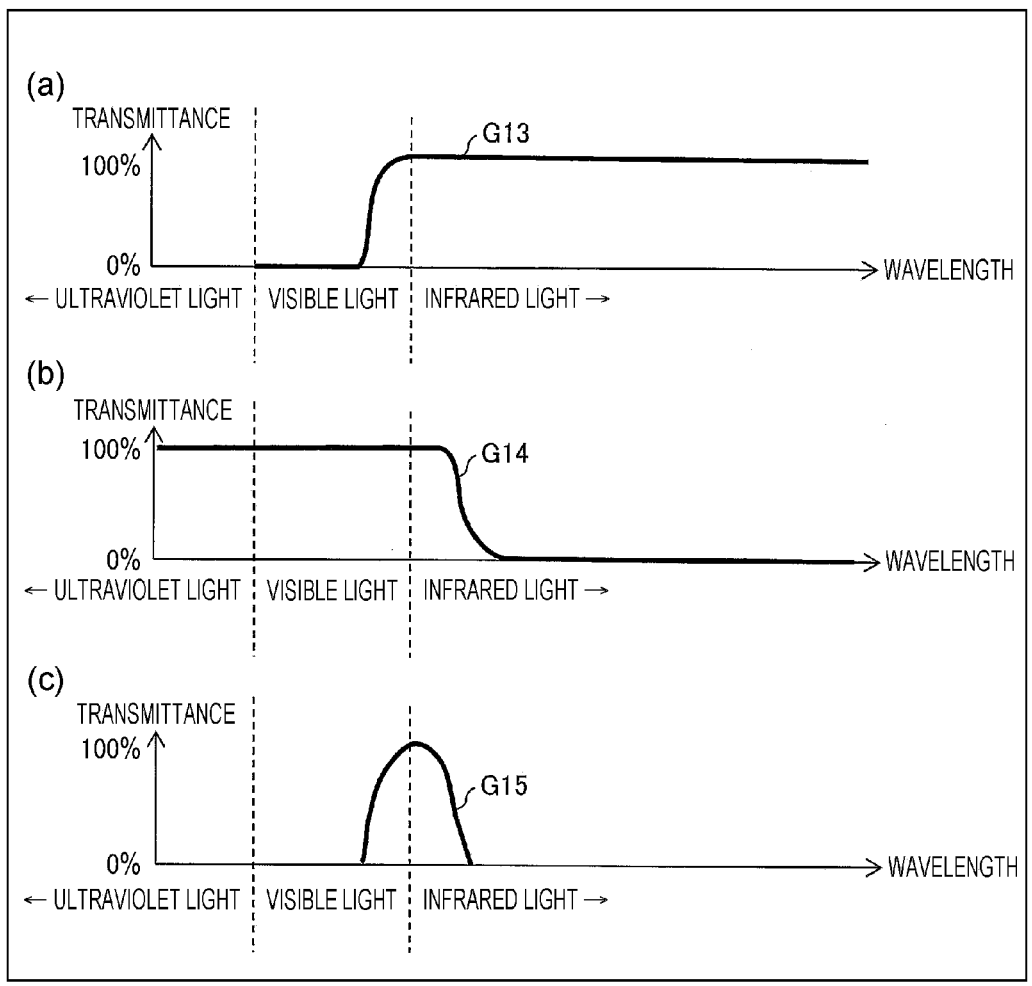

FIG. 38(a) is a graph illustrating wavelength dependency of a transmittance of an organic film optical filter for obtaining a first optical filter feature, FIG. 38(b) is a graph illustrating wavelength dependency of a transmittance of an inorganic optical filter, and FIG. 38(c) is a graph illustrating wavelength dependency of a total transmittance.

Figure 39:
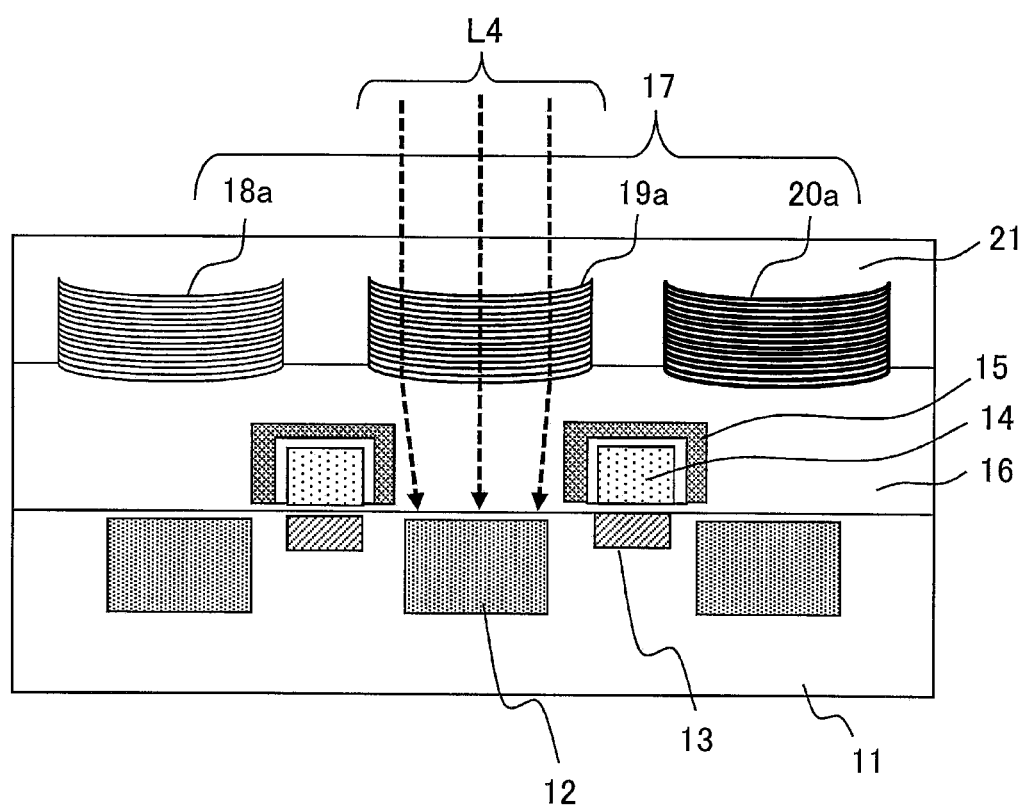

FIG. 39 is a cross-sectional view of a solid-state image capturing apparatus according to Embodiment 15.

FIGS. 40(a) to 40(f) are diagrams illustrating a method for manufacturing the solid-state image capturing apparatus according to Embodiment 15.

FIGS. 41(a) and 41(b) are color photos based on visible light and infrared radiation, captured by the solid-state image capturing apparatus of the invention.

DESCRIPTION OF EMBODIMENTS

Hereinafter, embodiments of the invention will be described.

Embodiment 1

Configuration of Light Detecting Device

Figure 1:
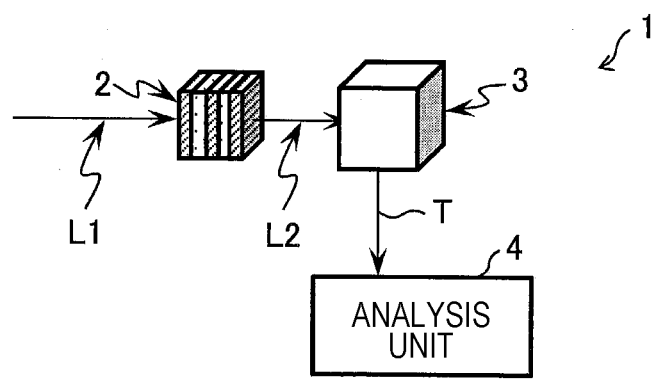
FIG. 1 is a diagram illustrating a configuration of a light detecting device according to an embodiment of the invention and the light detecting device that forms a solid-state image capturing apparatus.

FIG. 1 is a diagram illustrating a configuration of a light detecting device 1 according to Embodiment 1. The light detecting device 1 includes an optical filter 2. The optical filter 2 transmits a first wavelength light having a first wavelength range, a second wavelength light having a second wavelength range, . . . , and an n-th wavelength light (n is an integer) having an n-th wavelength range in a light beam L1 which is incident from an object. A light beam L2 includes the first wavelength light, the second wavelength light, . . . , and the n-th wavelength light. An optical sensor 3 is provided in the light detecting device 1. The optical sensor 3 detects, as information T, at least one of a first wavelength light intensity of the first wavelength light, a second wavelength light intensity of the second wavelength light, . . . , and an n-th wavelength light intensity of the n-th wavelength light. A correlative relationship exists between the first wavelength light intensity, the second wavelength light intensity, . . . , and the n-th wavelength light intensity.

Further, the light detecting device 1 includes an analysis unit 4. The analysis unit 4 estimates a light intensity of light having a wavelength in a wavelength range other than at least one of the first wavelength range, the second wavelength range, . . . , and the n-th wavelength range based on at least one of the first wavelength light intensity, the second wavelength light intensity, . . . , and the n-th wavelength light intensity detected by the optical sensor 3.

(Specific Process of Analysis Unit 4)

In FIG. 1, the light beam L1 represents light from an object or a target. The light from the object or the target includes light reflected by the object or the target, light emitted from the object or the target, light that has passed through the object or the target, a combination thereof, or the like.

In a case where an object or a target is illuminated, ultraviolet light, visible light, and infrared light may be respectively included in illumination light at specific wavelength intensity distributions in the daytime when sunlight is strong. Further, at night when sunlight is not present, a wavelength intensity distribution of artificial illumination light is obtained. The artificial illumination light generally includes white illumination, infrared illumination, or the like. The white illumination includes incandescent lamp illumination, fluorescent lamp illumination, LED illumination, or the like, and may further include infrared light.

Hereinafter, a case where the light beam L1 is light reflected by an object or a target will be described.

For example, in a case where the object or the target reflects an m-th wavelength light having a wavelength of an m-th wavelength range and an n-th wavelength light having a wavelength of an n-th wavelength range at a specific intensity or a specific wavelength intensity distribution, respectively, it can be said that a correlative relationship exists between an m-th wavelength light intensity or a wavelength intensity distribution of the m-th wavelength light reflected by the object or the target and an n-th wavelength light intensity or a wavelength intensity distribution of the n-th wavelength light reflected by the object or the target. Here, m and n are integers, respectively.

Here, for example, the optical filter 2 is set to transmit the m-th wavelength light in the m-th wavelength light range and the n-th wavelength light in the n-th wavelength light range, and the optical sensor 3 is set to detect the m-th wavelength light in the m-th wavelength light range and the n-th wavelength light in the n-th wavelength light range.

Further, here, in a case where only the n-th wavelength light is included in illumination light, only the n-th wavelength light is included in the light beam L1 which is light reflected from the object or the target. Accordingly, only the n-th wavelength light is included in the light beam L2, and thus, the optical sensor 3 detects only the n-th wavelength light intensity.

Further, even if the m-th wavelength light intensity is not included in the light beam L1, the analysis unit 4 may estimate the m-th wavelength light intensity of the m-th wavelength light reflected by the object or the target based on the correlative relationship, using information T relating to the n-th wavelength light intensity obtained by the optical sensor 3.

Contrarily, in a case where only the m-th wavelength light is included in the illumination light, the m-th wavelength light is included in the light beam L1 which is the light reflected from the object or the target. Accordingly, only the m-th wavelength light is included in the light beam L2, and thus, the optical sensor 3 detects only the m-th wavelength light intensity.

Further, even if the n-th wavelength light intensity is not included in the light beam L1, the analysis unit 4 may estimate the n-th wavelength light intensity of the n-th wavelength light intensity reflected by the object or the target based on the correlative relationship, using information T relating to the m-th wavelength light intensity obtained by the optical sensor 3.

The description is applied to a case where the object or the target reflects the m-th wavelength light and the n-th wavelength light at specific intensities, respectively, the light beam L1 is formed by the n-th wavelength light or the m-th wavelength light, and the optical sensor 2 transmits the m-th wavelength light and the n-th wavelength light; however, for example, the description may be applied to a case where the object or the target reflects the first to n-th wavelength light at specific intensity distributions.

Generally speaking in consideration of these cases, it can be said that the analysis unit 4 may estimate a light intensity of light reflected by the object or the target, having a wavelength range other than at least one of the first wavelength range, the second wavelength range, . . . , and the n-th wavelength range on the basis of at least one of the first wavelength light intensity, the second wavelength light intensity, . . . , and the n-th wavelength light intensity detected by the optical sensor 3.

The light reflected by the object or the target may be compatibly expressed as light from the object or the target such as light emitted from the object or the target, light that has passed through the object or the target, or a combination thereof.

It is preferable that information relating to a light wavelength intensity distribution included in the light beam L1 is input or set in advance in the analysis unit 4.

It is preferable that a long-wavelength cut filter, a shot-wavelength cut filter, a band pass filter, a dummy filter or an ND filter is provided in the optical filter 2 on the side of the light beam L1 and the information is input or set in the analysis unit 4.

It is preferable that the solid-state image capturing apparatus according to this embodiment includes the light detecting device 1.

If the light detecting device 1 is configured to perform scanning on a plane, for example, to perform raster scanning or the like, it is possible to cause the light detecting device 1 to function as the solid-state image capturing apparatus according to this embodiment. Further, in this case, a wavelength of a light source may be changed for every scanning.

(Configuration of Optical Filter 2)

FIGS. 2(a) to 2(e) are diagrams illustrating the optical filter 2 of the light detecting device 1 according to Embodiment 1, and FIG. 2(f) is a diagram illustrating a waveform of a light source.

Figure 2:
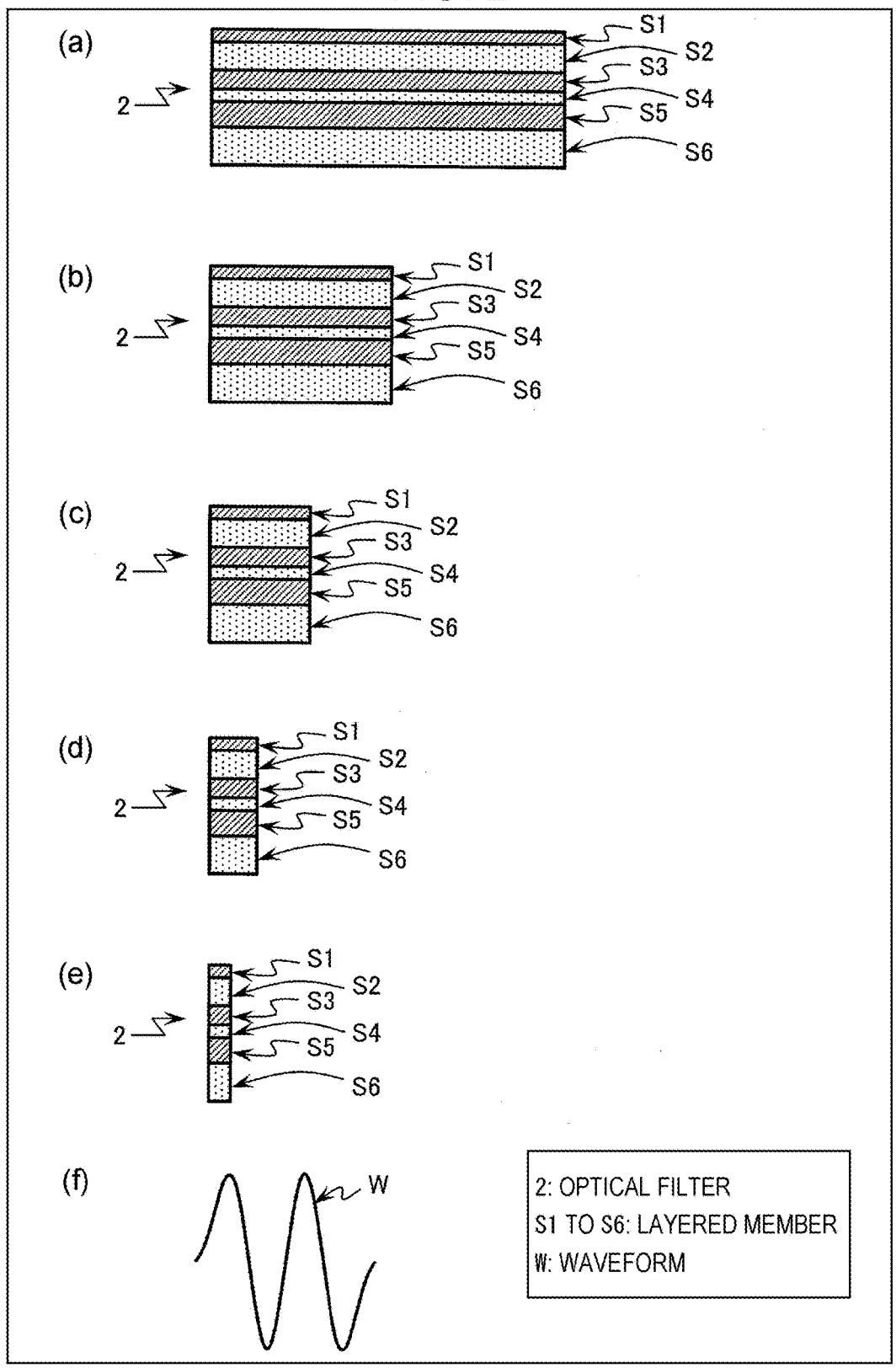
FIGS. 2(a) to 2(e) are diagrams illustrating optical filters of a light detecting device and a solid-state image capturing apparatus according to Embodiment 1 of the invention.
FIG. 2(f) is a diagram illustrating a waveform of a light beam.

The optical filter 2 may be formed by plural different layered members S1 to S6. In FIG. 2, a case where the number of layers of the layered members is 6 is shown, but the invention is not limited thereto, and an arbitrary number of layers may be set as described later.

Further, in order to enhance an optical resolution of the optical filter 2, as shown in FIG. 2(a) to FIG. 2(e), it is necessary to narrow the width of the optical filter 2. Further, if the width of the optical filter 2 is of the same order as that of the wavelength of a waveform W of the light beam L1 shown in FIG. 2(f), or is several times or approximately the same as the wavelength of the waveform W, it is not possible to ignore a phenomenon that a part of the light beam L1 that is incident to the optical filter 2 is leaked through a side surface of the optical filter 2 (see FIG. 5 to be described later).

Embodiment 2

Configuration of Light Detecting Devices 1a and 1h

Figure 3:
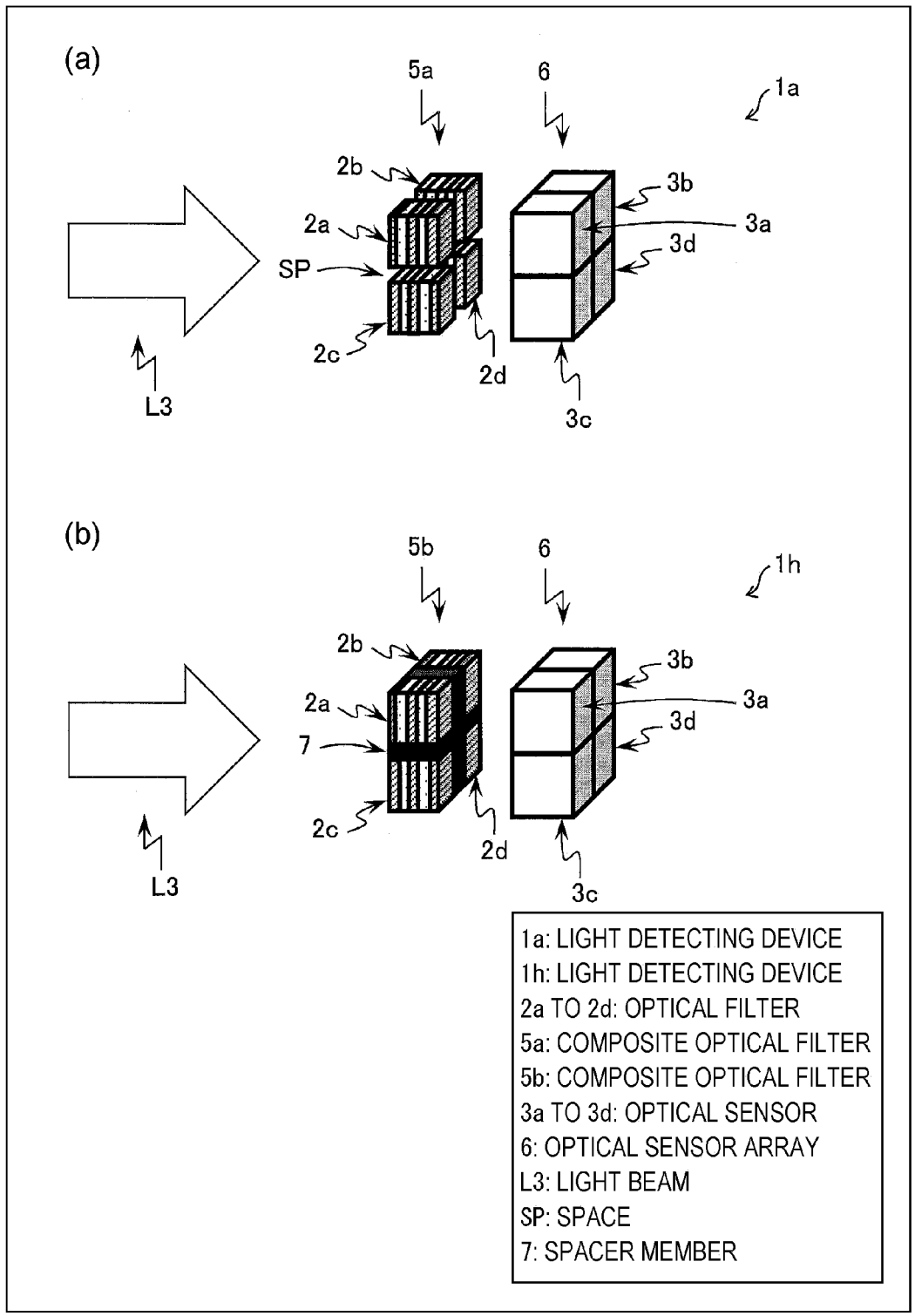
FIGS. 3(a) and 3(b) are diagrams illustrating a configuration of a light detecting device according to Embodiment 2 of the invention, and a configuration of the light detecting device that forms a solid-state image capturing apparatus.

FIGS. 3(a) and 3(b) are diagrams illustrating configurations of light detecting devices 1a and 1h according to Embodiment 2.

The light detecting device 1a shown in FIG. 3(a) includes a composite optical filter 5a and an optical sensor array 6. The composite optical filter 5a includes optical filters 2a to 2d which are arranged in 2 rows and 2 columns, to which a light beam L3 is incident. Plural layered members having a transmittance of 50% or more are layered in wavelength regions of visible light and infrared light, in each of the optical filters 2a to 2d.

The optical filter 2a transmits a first wavelength light having a wavelength in a first wavelength range by reflecting light having wavelengths other than the first wavelength range in light from an object. The optical filter 2b transmits a second wavelength light having a wavelength in a second wavelength range by reflecting light having wavelengths other than the second wavelength range in light from an object. The optical filter 2c transmits a third wavelength light having a wavelength in a third wavelength range by reflecting light having wavelengths other than the third wavelength range in light from an object. The optical filter 2d transmits a fourth wavelength light having a wavelength in a fourth wavelength range by reflecting light having wavelengths other than the fourth wavelength range in light from an object.

Each of the optical filters 2a to 2d may reflect light in a predetermined wavelength range to transmit light in a different wavelength range. Here, the light in the different wavelength range may not coincide with light having wavelengths other than the predetermined wavelength range. Further, the different wavelength range may overlap the predetermined wavelength range.

In order to prevent occurrence of interaction or crosstalk between light beams leaked from respective side surfaces of the optical filters 2a to 2d, a space SP is formed between the optical filters 2a to 2d.

The optical sensor array 6 includes optical sensors 3a to 3d arranged corresponding to the optical filters 2a to 2d, respectively. The optical sensor 3a detects a first wavelength light intensity of a first wavelength light that has passed through the optical filter 2a. The optical sensor 3b detects a second wavelength light intensity of a second wavelength light that has passed through the optical filter 2b. The optical sensor 3c detects a third wavelength light intensity of a third wavelength light that has passed through the optical filter 2c. The optical sensor 3d detects a fourth wavelength light intensity of a fourth wavelength light that has passed through the optical filter 2d.

In the light detecting device 1h shown in FIG. 3(b), in order to prevent occurrence of interaction or crosstalk between light beams leaked from respective side surfaces of the optical filters 2a to 2d, a spacer member 7 is formed between the optical filters 2a to 2d. Other configurations are the same as the configurations of the light detecting device 1a in FIG. 3(a).

FIGS. 4(a) to 4(e) and FIGS. 5(a) to 5(e) are diagrams illustrating an operation of a space and a spacer member between optical filters that form the light detecting device and the solid-state image capturing apparatus according to Embodiment 2. FIG. 4 is a diagram conceptually illustrating a wavelength of the light beam L3 with respect to a cross-sectional view of a composite optical filter 5b taken along section AA shown in FIG. 6(a) to be described later.

Figure 4:
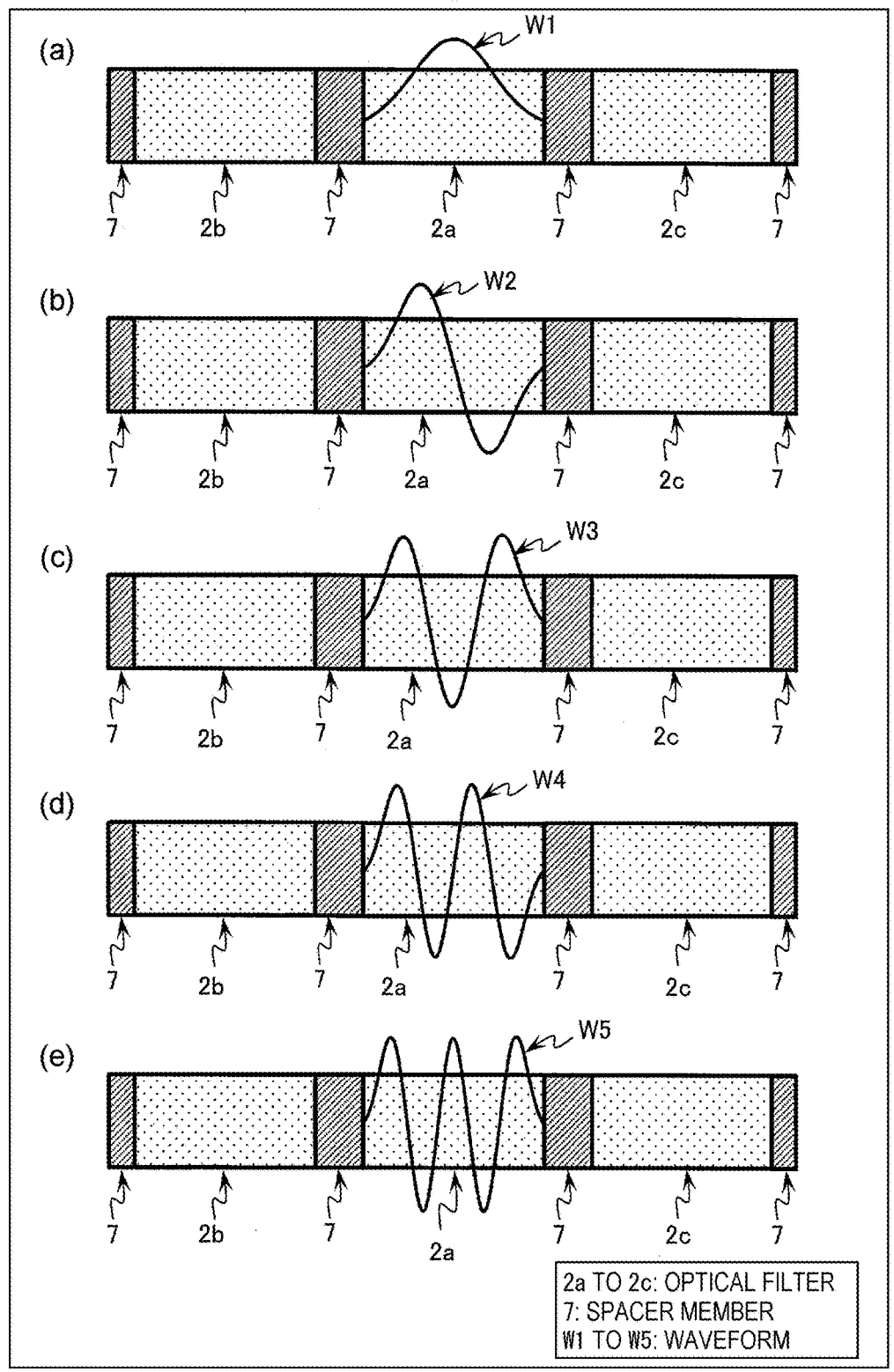
FIGS. 4(a) to 4(e) are diagrams illustrating an operation of a space and a spacer member between optical filters that form the light detecting device and the solid-state image capturing apparatus according to Embodiment 2 of the invention.

As shown in waveforms W1 to W5 shown in FIG. 4, it is possible to prevent the light beam L3 in the optical filter 2a from being leaked toward the adjacent optical filters 2b and 2c using the spacer member 7. Thus, it is possible to easily control a light beam that is reflected from or passes through each of the optical filters 2a to 2d.

Figure 5:
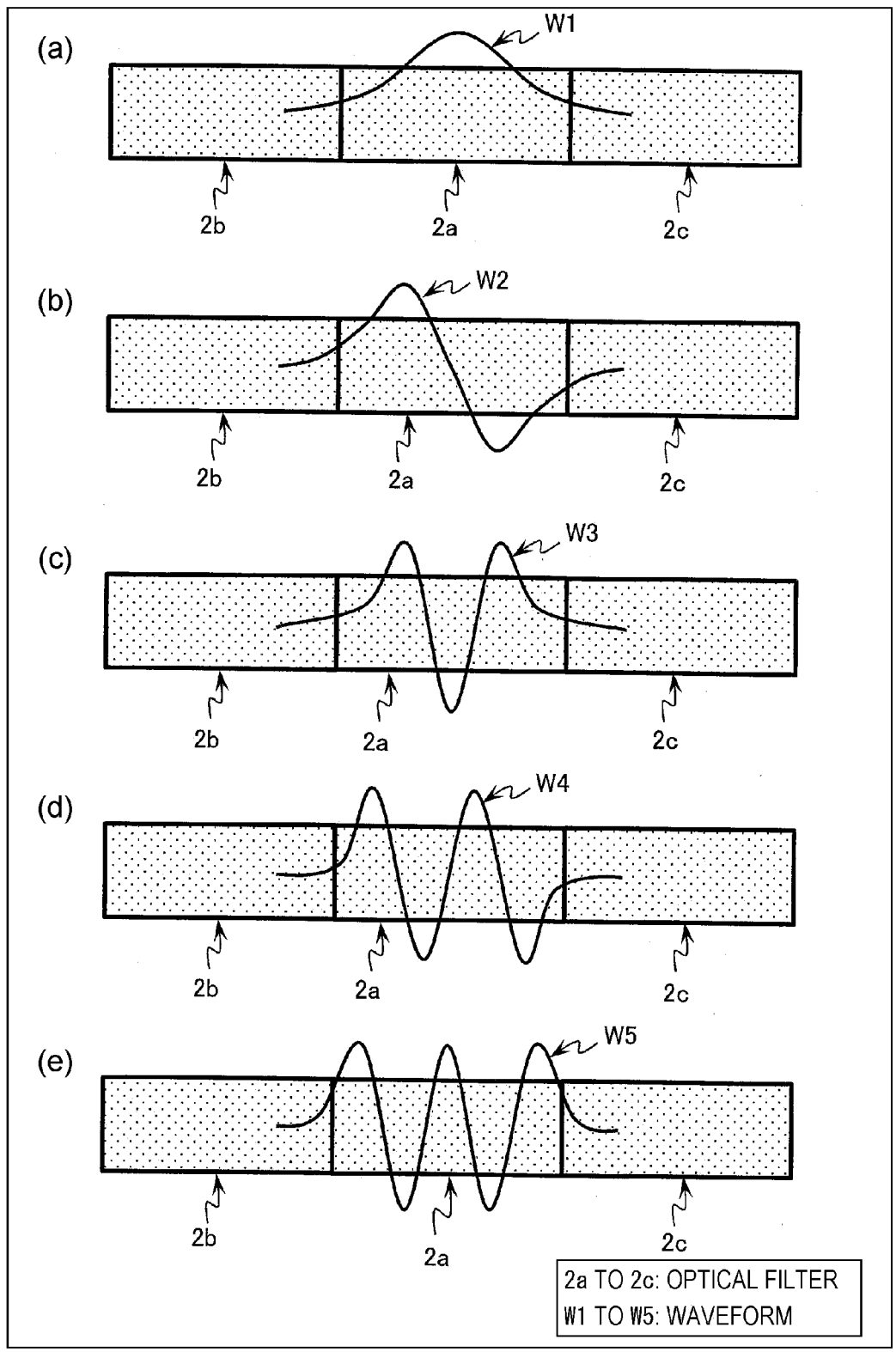
FIGS. 5(a) to 5(e) are diagrams illustrating cases where an operation of a space and a spacer member between the optical filters that form the light detecting device and the solid-state image capturing apparatus according to Embodiment 2 of the invention is not present.

On the other hand, as shown in FIG. 5, in a case where the optical filters 2a to 2d are provided without using the space SP and the spacer member 7, as shown in the waveforms W1 to W5 shown in FIG. 5, light beams in the optical filter 2a are leaked toward the adjacent optical filters 2b and 2c, and the respective light beams cause interaction or crosstalk. Thus, it is difficult to control a light beam that is reflected from or passes through each of the optical filters 2a to 2d.

It is preferable that the solid-state image capturing apparatus according to this embodiment includes the light detecting device 1a or 1h.

If the light detecting device 1a or the light detecting device 1h is configured to perform scanning on a plane, for example, to perform raster scanning or the like, it is possible to cause the light detecting device 1a or 1h to function as the solid-state image capturing apparatus according to this embodiment.

Embodiment 3

Arrangement Example of Optical Filters

Figure 6:
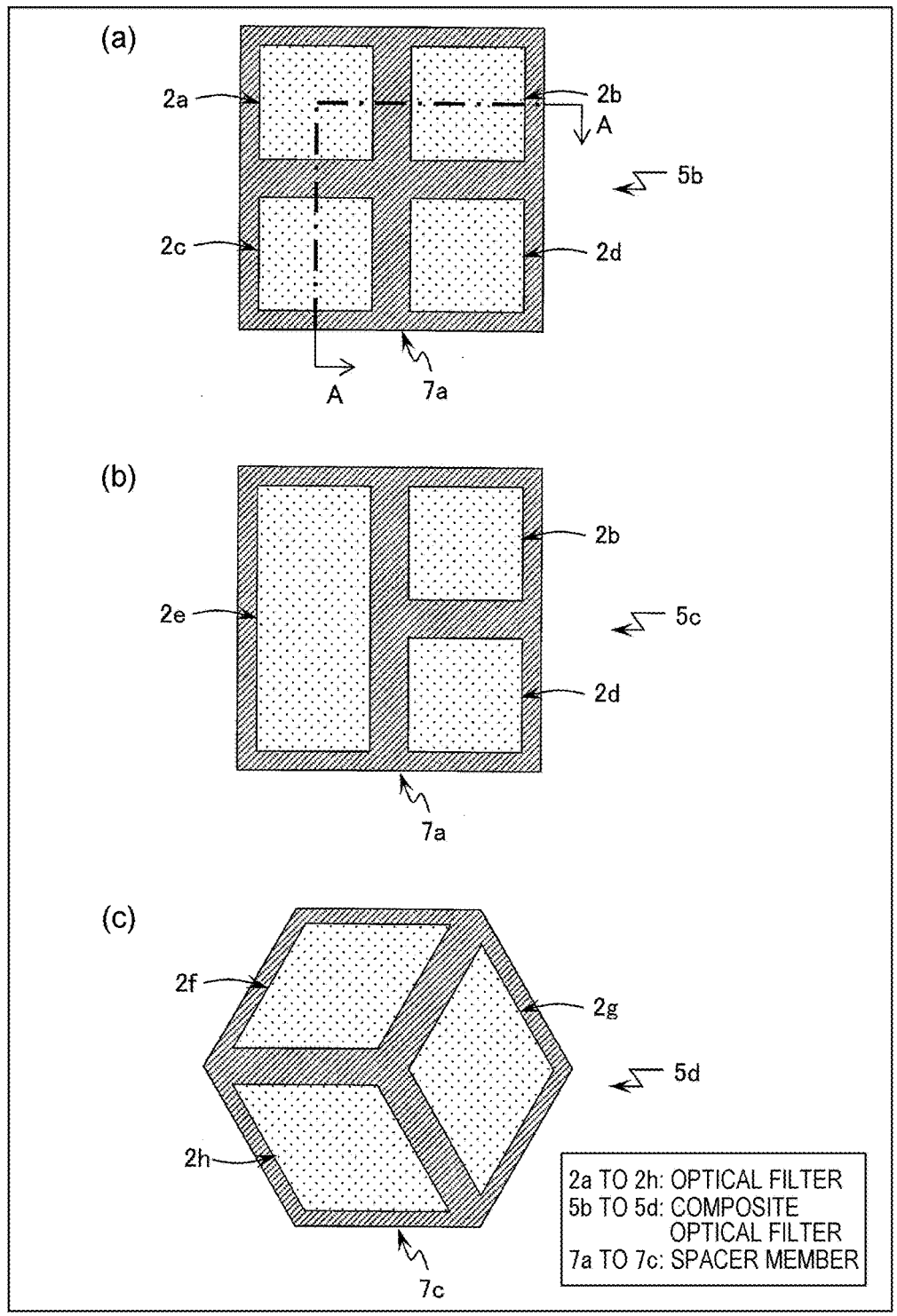
FIGS. 6(a) to 6(c) are diagrams illustrating installation examples of optical filters that form a light detecting device and a solid-state image capturing apparatus according to Embodiment 3 of the invention.

FIGS. 6(a) to 6(c) are diagrams illustrating installation examples of optical filters that form a light detecting device and a solid-state image capturing apparatus according to Embodiment 3 of the invention.

Referring to FIG. 6(a), a composite optical filter 5b includes square-shaped optical filters 2a to 2d arranged in two rows and two columns, and a spacer member 7a formed between the optical filters 2a to 2d.

Referring to FIG. 6(b), a composite optical filter 5c includes square-shaped optical filters 2b and 2d, a rectangular-shaped optical filter 2e, and a spacer member 7b formed between the optical filters 2b, 2d, and 2e.

Referring to FIG. 6(c), a composite optical filter 5d includes diamond-shaped optical filters 2f, 2g, and 2h, and a spacer member 7c formed between the optical filters 2f, 2g, and 2h.

Embodiment 4

Another Arrangement Example of Optical Filters

Figure 7:
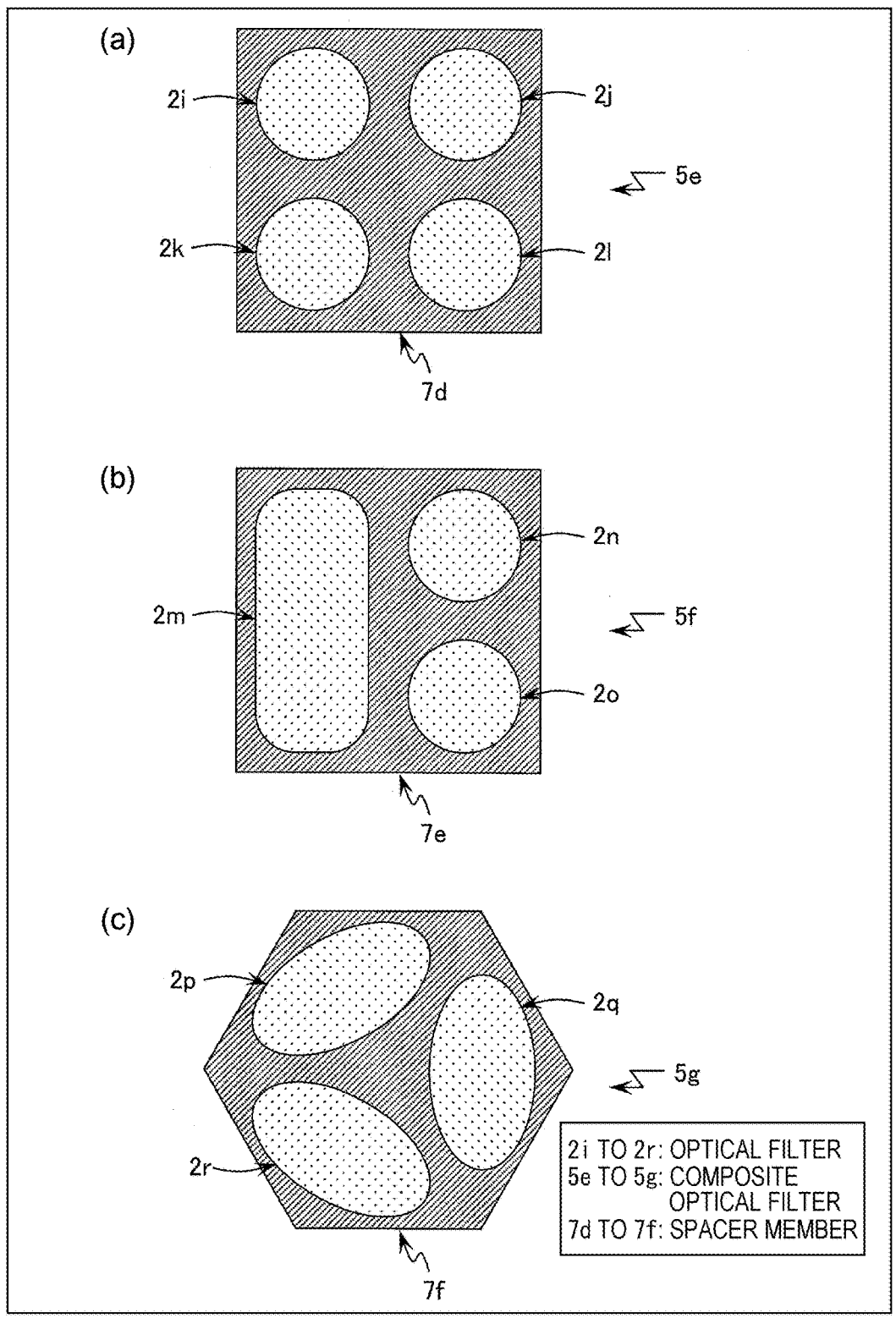
FIGS. 7(a) to 7(c) are diagrams illustrating installation examples of optical filters that form a light detecting device and a solid-state image capturing apparatus according to Embodiment 4 of the invention.

FIGS. 7(a) to 7(c) are diagrams illustrating installation examples of optical filters that form a light detecting device and a solid-state image capturing apparatus according to Embodiment 4. Referring to FIG. 7(a), a composite optical filter 5e includes four circular optical filters 2i to 2l, and a spacer member 7d formed between the optical filters 2i to 2l.

Referring to FIG. 7(b), a composite optical filter 5f includes two circular optical filters 2n and 2o, a racetrack-shaped optical filter 2m, and a spacer member 7 formed between the optical filters 2n, 2o, and 2m.

Referring to FIG. 7(c), a composite optical filter 5g includes three elliptical optical filters 2p, 2q, and 2r, and a spacer member 7f formed between the optical filters 2p, 2q, and 2r.

Embodiment 5

Still Another Arrangement Example of Optical Filters

Figure 8:
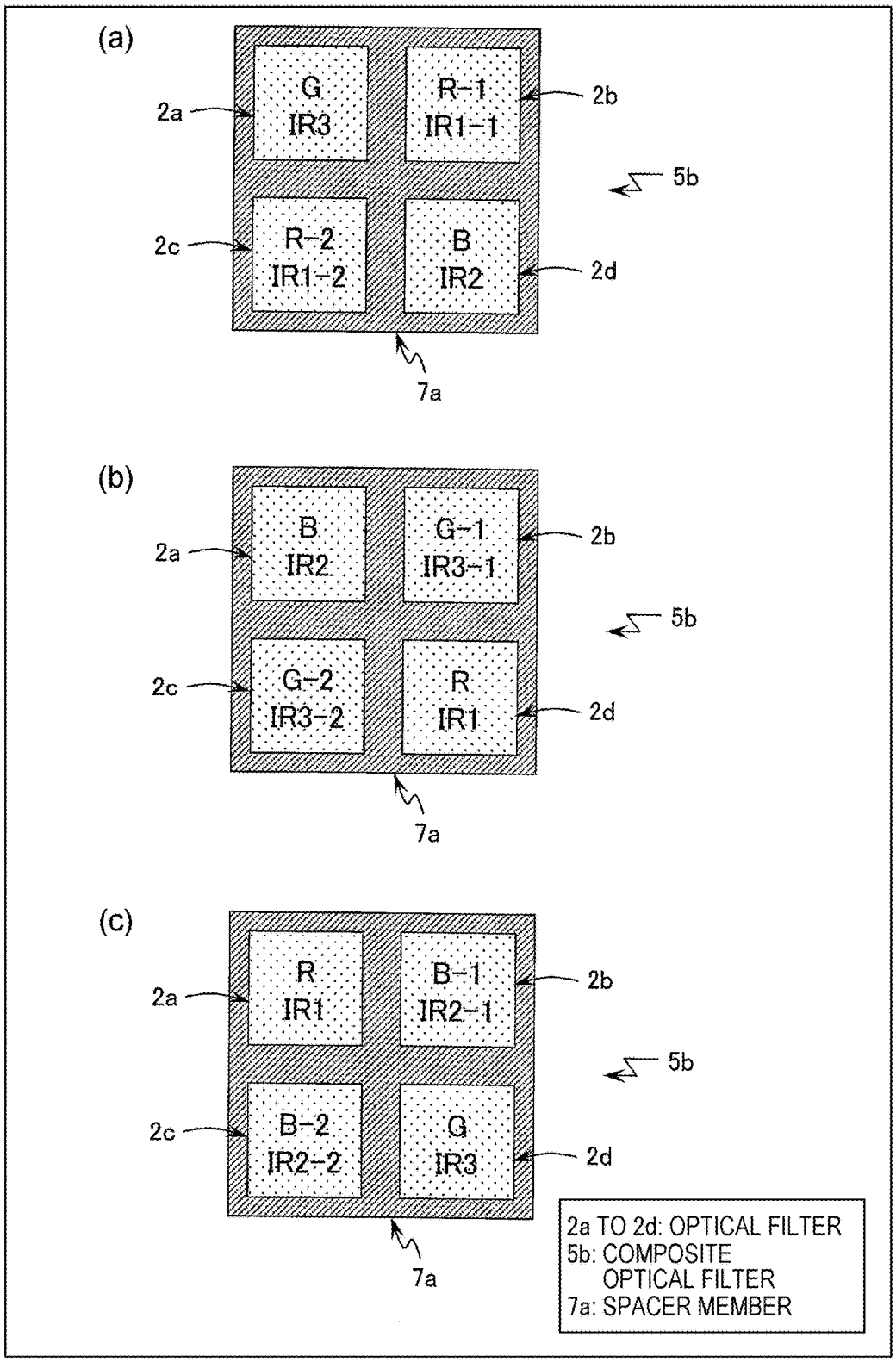
FIGS. 8(a) to 8(c) are diagrams illustrating installation examples of optical filters that form a light detecting device and a solid-state image capturing apparatus according to Embodiment 5 of the invention.

FIGS. 8(a) to 8(c) are diagrams illustrating installation examples of optical filters that form a light detecting device and a solid-state image capturing apparatus according to Embodiment 5. In the composite optical filter 5b, the optical filters 2a to 2d of a square shape are arranged in two rows and two columns with the spacer member 7a being interposed therebetween.

Referring to FIG. 8(a), an optical filter 2a transmits a "green wavelength region (G)" and a "third infrared wavelength region (IR3)", optical filters 2b and 2c transmit a "red wavelength region (R)" and a "first infrared wavelength region (IR1)", and optical filter 2d transmits a "blue wavelength region (B)" and a "second infrared wavelength region (IR2)".

Here, in the infrared wavelength regions, "the first infrared wavelength region (IR1)", "the second infrared wavelength region (IR2)", and "the third infrared wavelength region (IR3)" represent a shorter wavelength region in the order, and this is similarly applied hereinafter.

Referring to FIG. 8(b), the optical filter 2a transmits the "blue wavelength region (B)" and the "second infrared wavelength region (IR2)", the optical filters 2b and 2c transmit the "green wavelength region (G)" and the "third infrared wavelength region (IR3)", and optical filter 2d transmits the "red wavelength region (R)" and the "first infrared wavelength region (IR1)".

Referring to FIG. 8(c), the optical filter 2a transmits the "red wavelength region (R)" and the "first infrared wavelength region (IR1)", the optical filters 2b and 2c transmit the "blue wavelength region (B)" and the "second infrared wavelength region (IR2)", and optical filter 2d transmits the "green wavelength region (G)" and the "third infrared wavelength region (IR3)".

The intensity of visible light having a wavelength of the "red wavelength region (R)" that passes through each of the filters 2a to 2d is represented as R, the intensity of visible light having a wavelength of the "green wavelength region (G)" is represented as G, the intensity of visible light having a wavelength of the "blue wavelength region (B)" is represented as B, the intensity of infrared light having a wavelength of the "first infrared wavelength region (IR1)" is represented as IR1, the intensity of infrared light having a wavelength of the "second infrared wavelength region (IR2)" is represented as IR2, and the intensity of infrared light having a wavelength of the "third infrared wavelength region (IR3)" is represented as IR3. Hereinafter, similarly, $a0(R+IR1)$ detected by each of the optical sensors 3a to 3d may be color-specified as "R" of the three primary colors, $b0(G+IR3)$ detected by each of the optical sensors 3a to 3d may be color-specified as "G" of the three primary colors, and $c0(B+IR2)$ detected by each of the optical sensors 3a to 3d may be color-specified as "B" of the three primary colors.

Here, $a0$, $b0$, and $c0$ represent coefficients, and may be appropriately adjusted according to detection rates of the respective optical sensors 3a to 3d.

Embodiment 6

Configuration Example of Optical Filters

Figure 9:
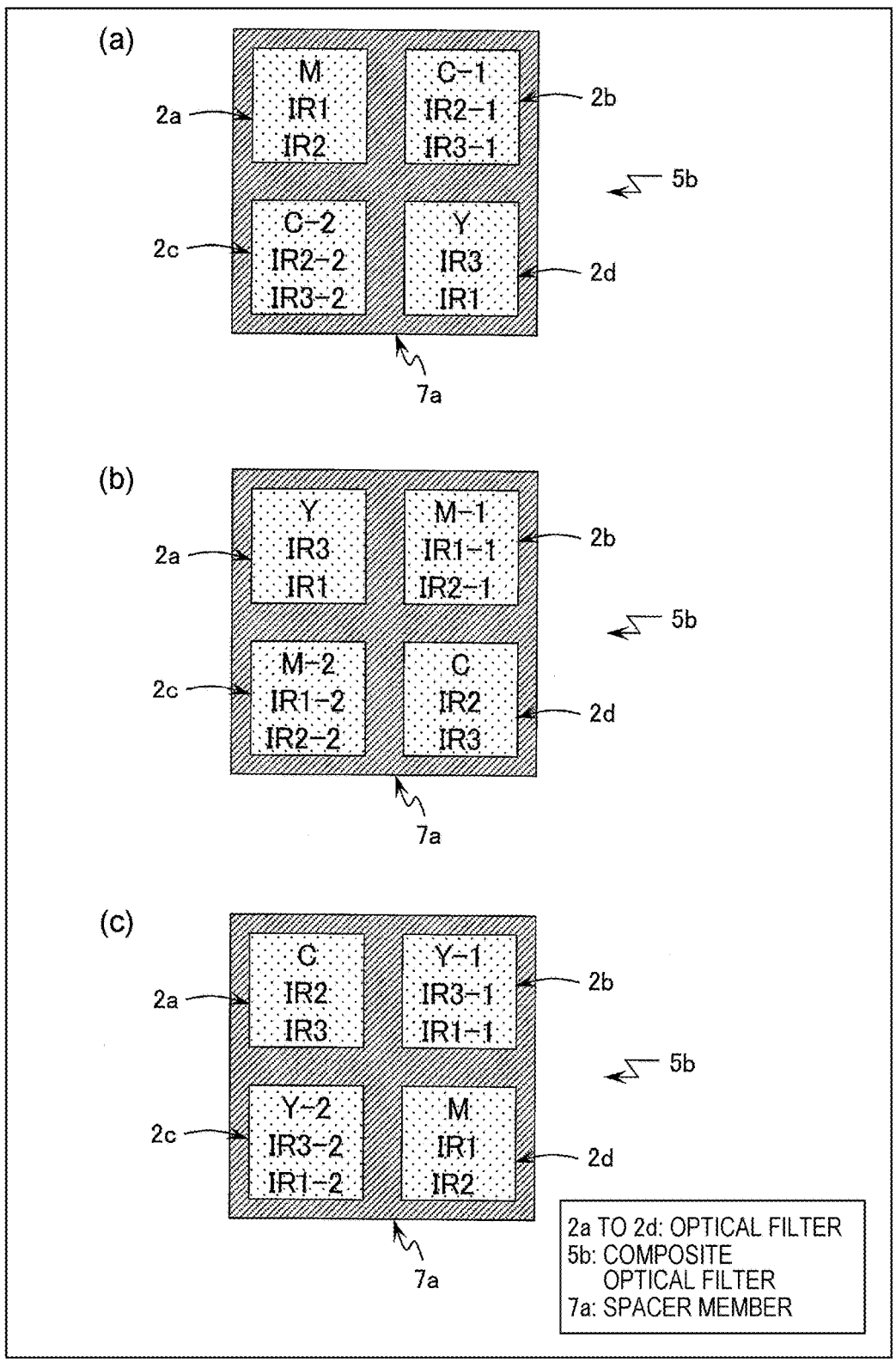
FIGS. 9(a) to 9(c) are diagrams illustrating installation examples of optical filters that form a light detecting device and a solid-state image capturing apparatus according to Embodiment 6 of the invention.

FIGS. 9(a) to 9(c) are diagrams illustrating installation examples of optical filters that form a light detecting device and a solid-state image capturing apparatus (light detecting device) according to Embodiment 6. Referring to FIG. 9(a), an optical filter 2a transmits an "M wavelength region", a "first infrared wavelength region (IR1)", and a "second infrared wavelength region (IR2)", optical filters 2b and 2c transmit a "C wavelength region", the "second infrared wavelength region (IR2)", and a "third infrared wavelength region (IR3)", and an optical filter 2d transmits a "Y wavelength region", the "third infrared wavelength region (IR3)", and the "first infrared wavelength region (IR1)".

Here, a "C wavelength region" represents the "green wavelength region (G)" and the "blue wavelength region (B)", an "M wavelength region" represents the "blue wavelength region (B)" and the "red wavelength region (R)", and a "Y wavelength region" represents the "red wavelength region (R)" and the "green wavelength region (G)". This is similarly applied hereinafter.

Referring to FIG. 9(b), the optical filter 2a transmits the "Y wavelength region", the "third infrared wavelength region (IR3)", and the "first infrared wavelength region (IR1)", the optical filters 2b and 2c transmit the "M wavelength region", the "first infrared wavelength region (IR1)", and the "second infrared wavelength region (IR2)", and the optical filter 2d transmits the "C wavelength region", the "second infrared wavelength region (IR2)", and the "third infrared wavelength region (IR3)".

Referring to FIG. 9(c), the optical filter 2a transmits the "C wavelength region", the "second infrared wavelength region (IR2)", and the "third infrared wavelength region (IR3)", the optical filters 2b and 2c transmit the "Y wavelength region", the "third infrared wavelength region (IR3)", and the "first infrared wavelength region (IR1)", and the optical filter 2d transmits the "M wavelength region", the "first infrared wavelength region (IR1)", and the "second infrared wavelength region (IR2)".

In addition to the above-mentioned combinations, other combinations using the "red wavelength region (R)", the "green wavelength region (G)", the "blue wavelength region (B)", the "C wavelength region", the "M wavelength region", the "Y wavelength region", the "first infrared wavelength region (IR1)", the "second infrared wavelength region (IR2)", or the "third infrared wavelength region (IR3) may be used.

The intensity of visible light having a wavelength of the "C wavelength region" that passes through each of the filters 2a to 2d is represented as C, the intensity of visible light having a wavelength of the "M wavelength region" that passes through each of the filters 2a to 2d is represented as M, and the intensity of visible light having a wavelength of the "Y wavelength region" that passes through each of the filters 2a to 2d is represented as Y. Hereinafter, similarly, $a02(C+IR2+IR3)$ detected by each of the optical sensors 3a to 3d may be color-specified as "C" of the three primary colors, $b02(M+IR1+IR2)$ detected by each of the optical sensors 3a to 3d may be color-specified as "M" of the three primary colors, and $c02(Y+IR1+IR3)$ detected by each of the optical sensors 3a to 3d may be color-specified as "Y" of the three primary colors.

Here, $a02$, $b02$, and $c02$ represent coefficients, and may be appropriately adjusted according to transmittances of the respective optical filters 2a to 2d, detection rates of the respective optical sensors 3a to 3d, or the like.

The intensity of visible light in the "red wavelength region (R)", the "green wavelength region (G)", and the "blue wavelength region (B)" from an object is represented as W0, and the intensity of infrared having a wavelength of the "first infrared wavelength region (IR1)", the "second infrared wavelength region (IR2)", and the "third infrared wavelength region (IR3)" from the object is represented as IR0. Hereinafter, similarly, conversion is made by $$R+IR1=d0(W0+IR0)-a02(C+IR2+IR3)=\{-a02(C+IR2+IR3)+b02(M+IR1+IR2)+c02(Y+IR1+IR3)\}/2 \quad (1),$$

$$G+IR3=d0(W0+IR0)-b02(M+IR1+IR2)=\{a02(C+IR2+IR3)-b02(M+IR1+IR2)+c02(Y+IR1+IR3)\}/2 \quad (2), \text{ and}$$

$$B+IR2=d0(W0+IR0)-c02(Y+IR1+IR3)=\{a02(C+IR2+IR3)+b02(M+IR1+IR2)-c02(Y+IR1+IR3)\}/2 \quad (3).$$

Thus, $a03(R+IR1)$ may be color-specified as "R" of the three primary colors, $b03(G+IR3)$ may be color-specified as "G"

of the three primary colors, and c03(B+IR2) may be color-specified as "B" of the three primary colors.

That is, it is possible to convert CMY color system information into RGB color system information. Here, a03, b03, c03, and d0 represent coefficients, and may be appropriately adjusted.

Embodiment 7

Configuration Example of Optical Filters

Figure 10:
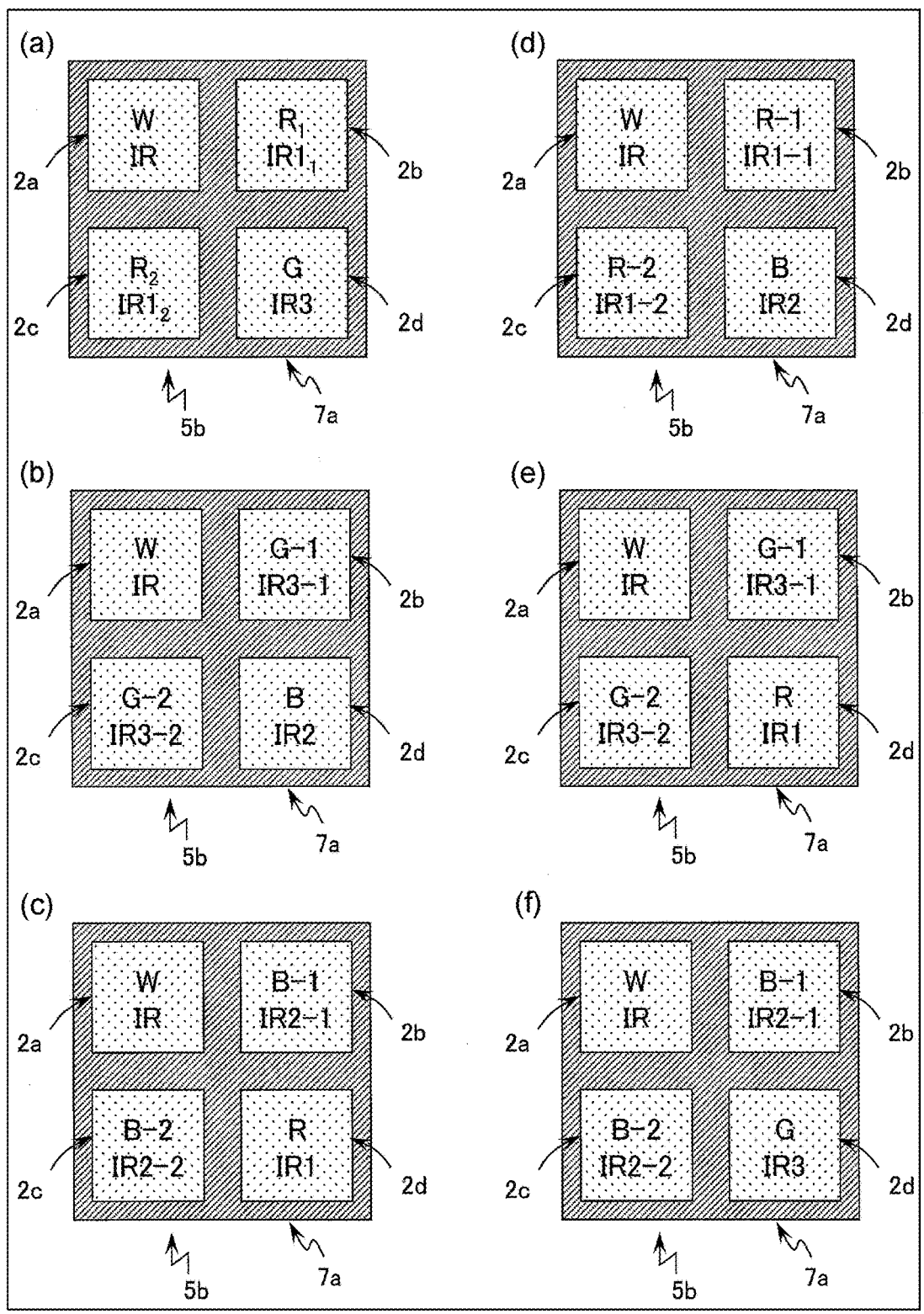
FIGS. 10(a) to 10(f) are diagrams illustrating installation examples of optical filters that form a light detecting device and a solid-state image capturing apparatus according to Embodiment 7 of the invention.

FIGS. 10(a) to 10(f) are diagrams illustrating installation examples of optical filters that form a light detecting device and a solid-state image capturing apparatus according to Embodiment 7. Referring to FIG. 10(a), an optical filter 2a transmits a "W wavelength region" and an "infrared wavelength region (IR)", optical filters 2b and 2c transmit a "red wavelength region (R)" and a "first infrared wavelength region (IR1)", and an optical filter 2d transmits a "green wavelength region (G)" and a "third infrared wavelength region (IR3)".

Here, the "W wavelength region" represents the "red wavelength region (R)" and the "green wavelength region (G)", and the "blue wavelength region (B)", and the "IR wavelength region" represents the "first infrared wavelength region (IR1)", the "second infrared wavelength region (IR2)", and the "third infrared wavelength region (IR3)". This is similarly applied hereinafter.

The intensity of visible light in the "red wavelength region (R)", the "green wavelength region (G)", and the "blue wavelength region (B)" that pass through each of the optical filters 2a to 2d is represented as W, and the intensity of infrared light having a wavelength of the "first infrared wavelength region (IR1)", the "second infrared wavelength region (IR2)", and the "third infrared wavelength region (IR3)" that pass through each of the optical filters 2a to 2d is represented as IR. Hereinafter, similarly, the light intensity of the "blue wavelength region (B)" and the "second infrared wavelength region (IR2)" from an object may be calculated from Expression (4) or the like, for example.

$$B+IR2=a1(W+IR)-2b1(R+IR1)-c1(G+IR3) \quad (4)$$

Further, a1, b1, and c1 represent coefficients, and may be appropriately adjusted according to transmittances of the respective optical filters 2a to 2d, detection rates of the respective optical sensors 3a to 3d, or the like.

Referring to FIG. 10(b), the optical filter 2a transmits the "W wavelength region" and the "infrared wavelength region (IR)", the optical filters 2b and 2c transmit the "green wavelength region (G)" and the "third infrared wavelength region (IR3)", and the optical filter 2d transmits the "blue wavelength region (B)" and the "second infrared wavelength region (IR2)".

The light intensity of the "red wavelength region (R)" and the "first infrared wavelength region (IR1)" from an object may be calculated from Expression (5) or the like, for example.

$$R+IR1=a2(W+IR)-2b2(G+IR3)-c2(B+IR2) \quad (5)$$

Here, a2, b2, and c2 represent coefficients, and may be appropriately adjusted according to transmittances of the respective optical filters 2a to 2d, detection rates of the respective optical sensors 3a to 3d, or the like.

Referring to FIG. 10(c), the optical filter 2a transmits the "W wavelength region" and the "infrared wavelength region (IR)", the optical filters 2b and 2c transmit the "blue wavelength region (B)" and the "second infrared wavelength region (IR2)", and the optical filter 2d transmits the "red wavelength region (R)" and the "first infrared wavelength region (IR1)".

The light intensity of the "green wavelength region (G)" and the "third infrared wavelength region (IR3)" from an object may be calculated from Expression (6) or the like, for example.

$$G+IR3=a3(W+IR)-2b3(B+IR2)-c3(R+IR1) \quad (6)$$

Here, a3, b3, and c3 represent coefficients, and may be appropriately adjusted according to transmittances of the respective optical filters, detection rates of the respective optical sensors, or the like.

Referring to FIG. 10(d), the optical filter 2a transmits the "W wavelength region" and the "infrared wavelength region (IR)", the optical filters 2b and 2c transmit the "red wavelength region (R)" and the "first infrared wavelength region (IR1)", and the optical filter 2d transmits the "blue wavelength region (B)" and the "second infrared wavelength region (IR2)".

The light intensity of the "green wavelength region (G)" and the "third infrared wavelength region (IR3)" from an object may be calculated from Expression (7) or the like, for example.

$$G+IR3=a4(W+IR)-2b4(R+IR1)-c4(B+IR2) \quad (7)$$

Here, a4, b4, and c4 represent coefficients, and may be appropriately adjusted according to transmittances of the respective optical filters, detection rates of the respective optical sensors, or the like.

Referring to FIG. 10(e), the optical filter 2a transmits the "W wavelength region" and the "infrared wavelength region (IR)", the optical filters 2b and 2c transmit the "green wavelength region (G)" and the "third infrared wavelength region (IR3)", and the optical filter 2d transmits the "red wavelength region (R)" and the "first infrared wavelength region (IR1)".

Here, the light intensity of the "blue wavelength region (B)" and the "second infrared wavelength region (IR2)" from an object may be calculated from Expression (8) or the like, for example.

$$B+IR2=a5(W+IR)-2b5(G+IR3)-c5(R+IR1) \quad (8)$$

Here, a5, b5, and c5 represent coefficients, and may be appropriately calculated according to transmittances of the respective optical filters, detection rates of the respective optical sensors, or the like.

Referring to FIG. 10(f), the optical filter 2a transmits the "W wavelength region" and the "infrared wavelength region (IR)", the optical filters 2b and 2c transmit the "blue wavelength region (B)" and the "second infrared wavelength region (IR2)", and the optical filter 2d transmits the "green wavelength region (G)" and the "third infrared wavelength region (IR3)".

Here, the light intensity of the "red wavelength region (R)" and the "first infrared wavelength region (IR1)" from an object may be calculated from Expression (9) or the like, for example.

$$R+IR1=a6(W+IR)-2b6(B+IR2)-c6(G+IR3) \quad (9)$$

Here, a6, b6, and c6 represent coefficients, and may be appropriately calculated according to transmittances of the respective optical filters, detection rates of the respective optical sensors, or the like.

Embodiment 8

Still Another Configuration Example of Optical Filters

FIGS. 11(a) to 11(f) are diagrams illustrating installation examples of optical filters that form a light detecting device and a solid-state image capturing apparatus according to Embodiment 8. Here, in the composite optical filter 5b, the optical filters 2a to 2d are arranged with the spacer member 7a being interposed therebetween.

Figure 11:
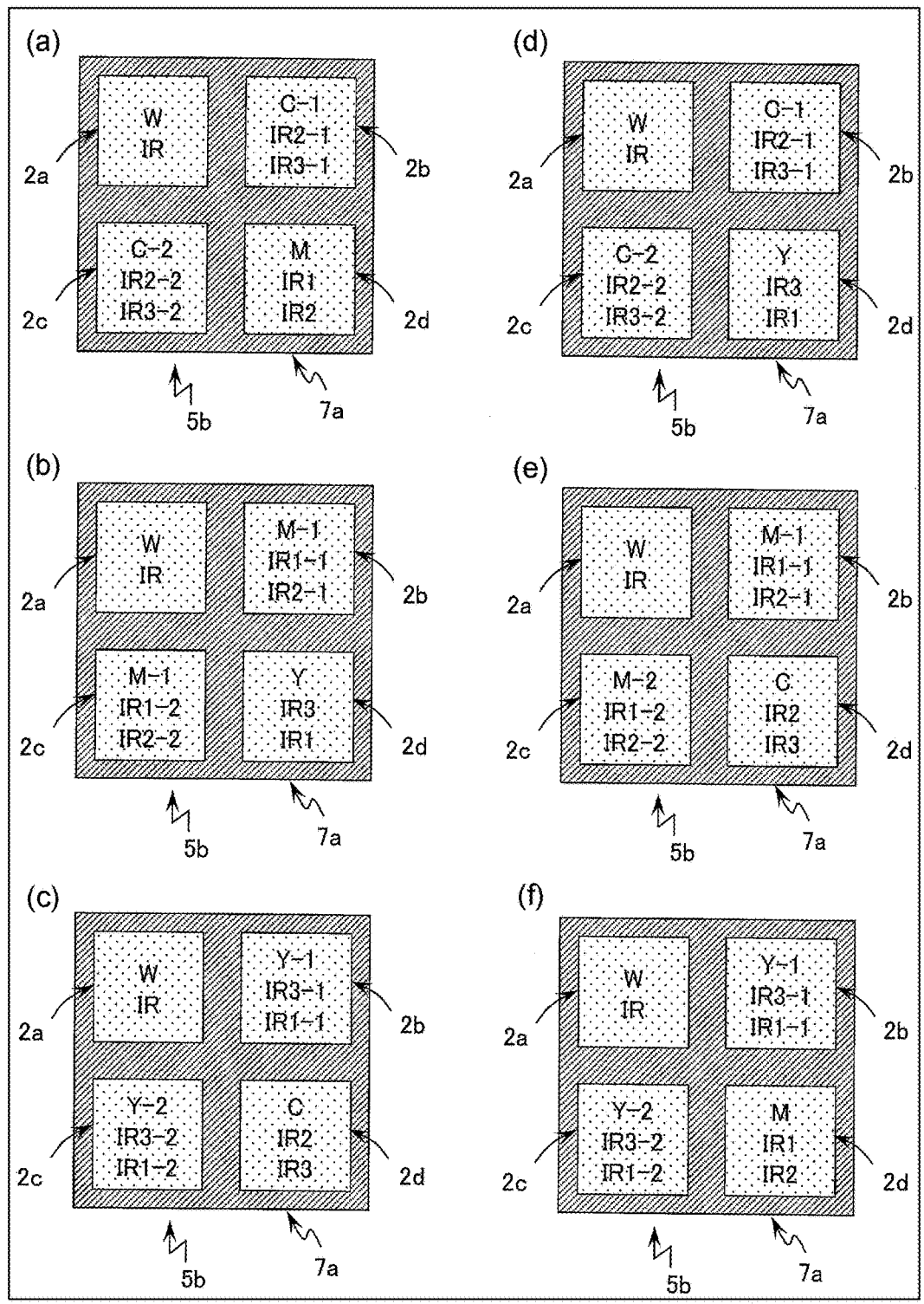
FIGS. 11(a) to 11(f) are diagrams illustrating installation examples of optical filters that form a light detecting device and a solid-state image capturing apparatus according to Embodiment 8 of the invention.

Referring to FIG. 11(a), the optical filter 2a transmits the "W wavelength region" and the "infrared wavelength region (IR)", the optical filters 2b and 2c transmit the "C wavelength region", the "second infrared wavelength region (IR2)", and the "third infrared wavelength region (IR3)", and the optical filter 2d transmits the "M wavelength region", the "first infrared wavelength region (IR1)" and the "second infrared wavelength region (IR2)".

The light intensity of the "Y wavelength region", the "first infrared wavelength region (IR1)", and the "third infrared wavelength region (IR3)" from an object may be calculated from Expression (10) or the like, for example.

$$Y+IR1+IR3=a7(W+IR)-2b7(C+IR2+IR3)-c7(M+IR1+IR2) \quad (10)$$

Here, a7, b7, and c7 represent coefficients, and may be appropriately adjusted according to transmittances of the respective optical filters, detection rates of the respective optical sensors, or the like.

Here, a20(C+IR2+IR3) detected by each of the optical sensors may be color-specified as "C" of the three primary colors, b20(M+IR1+IR2) detected by each of the optical sensors may be color-specified as "M" of the three primary colors, and c20(Y+IR1+IR3) detected by each of the optical sensors may be color-specified as "Y" of the three primary colors, with respect to Y+IR1+IR3 obtained from the above-mentioned calculation. Here, a20, b20, and c20 represent coefficients, and may be appropriately adjusted.

Similarly, it is possible to convert the CMY color system information into the RGB color system information.

Referring to FIG. 11(b), the optical filter 2a transmits the "W wavelength region" and the "infrared wavelength region (IR)", the optical filters 2b and 2c transmit the "M wavelength region", the "first infrared wavelength region (IR1)", and the "second infrared wavelength region (IR2)", and the optical filter 2d transmits the "Y wavelength region", the "third infrared wavelength region (IR3)", and the "first infrared wavelength region (IR1)".

The light intensity of the "C wavelength region", the "second infrared wavelength region (IR2)", and the "third infrared wavelength region (IR3)" from an object may be calculated from Expression (11) or the like, for example.

$$C+IR2+IR3=a8(W+IR)-2b8(M+IR1+IR2)-c8(Y+IR1+IR3) \quad (11)$$

Here, a8, b8, and c8 represent coefficients, and may be appropriately adjusted according to transmittances of the respective optical filters, detection rates of the respective optical sensors, or the like.

Similarly, it is possible to convert the CMY color system information into the RGB color system information.

Here, b21(M+IR1+IR2) detected by each of the optical sensors may be color-specified as "M" of the three primary colors, c21(Y+IR1+IR3) detected by each of the optical sensors may be color-specified as "Y" of the three primary colors, and a21(C+IR2+IR3) detected by each of the optical sensors may be color-specified as "C" of the three primary colors, with respect to the C+IR2+IR3 obtained from the above-mentioned calculation. Here, a21, b21, and c21 represent coefficients, and may be appropriately adjusted.

Similarly, it is possible to convert the CMY color system information into the RGB color system information.

Referring to FIG. 11(c), the optical filter 2a transmits the "W wavelength region" and the "infrared wavelength region (IR)", the optical filters 2b and 2c transmit the "Y wavelength region", the "third infrared wavelength region (IR3)", and the "first infrared wavelength region (IR1)", and the optical filter 2d transmits the "C wavelength region", the "second infrared wavelength region (IR2)", and the "third infrared wavelength region (IR3)".

The light intensity of the "M wavelength region", the "IR1 wavelength region", and the "IR2 wavelength region" from an object may be calculated from Expression (12) or the like, for example.

$$M+IR1+IR2=a9(W+IR)-2b9(Y+IR1+IR3)-c9(C+IR2+IR3) \quad (12)$$

Here, a9, b9, and c9 represent coefficients, and may be appropriately adjusted according to transmittances of the respective optical filters, detection rates of the respective optical sensors, or the like.

Similarly, it is possible to convert the CMY color system information into the RGB color system information.

Here, c22(Y+IR1+IR3) detected by each of the optical sensors may be color-specified as "Y" of the three primary colors, a22(C+IR2+IR3) detected by each of the optical sensors may be color-specified as "C" of the three primary colors, and b22(M+IR1+IR2) detected by each of the optical sensors may be color-specified as "M" of the three primary colors, with respect to the M+IR1+IR2 obtained from the above-mentioned calculation. Here, a22, b22, and c22 represent coefficients, and may be appropriately adjusted.

Similarly, it is possible to convert the CMY color system information into the RGB color system information.

Referring to FIG. 11(d), the optical filter 2a transmits the "W wavelength region" and the "infrared wavelength region (IR)", the optical filters 2b and 2c transmit the "C wavelength region", the "second infrared wavelength region (IR2)", and the "third infrared wavelength region (IR3)", and the optical filter 2d transmits the "Y wavelength region", the "third infrared wavelength region (IR3)", and the "first infrared wavelength region (IR1)".

The light intensity of the "M wavelength region", the "first infrared wavelength region (IR1)", and the "second infrared wavelength region (IR2)" from an object may be calculated from Expression (13) or the like, for example.

$$M+IR1+IR2=a10(W+IR)-2b10(C+IR2+IR3)-c10(Y+IR1+IR3) \quad (13)$$

Here, a10, b10, and c10 represent coefficients, and may be appropriately adjusted according to transmittances of the respective optical filters, detection rates of the respective optical sensors, or the like.

Here, a23(C+IR2+IR3) detected by each of the optical sensors may be color-specified as "C" of the three primary colors, c23(Y+IR1+IR3) detected by each of the optical sensors may be color-specified as "Y" of the three primary colors, and b23(M+IR1+IR2) detected by each of the optical sensors may be color-specified as "M" of the three primary colors, with respect to the M+IR1+IR2 obtained from the above-mentioned calculation. Here, a23, b23, and c23 represent coefficients, and may be appropriately adjusted.

Similarly, it is possible to convert the CMY color system information into the RGB color system information.

Referring to FIG. 11(e), the optical filter 2a transmits the "W wavelength region" and the "infrared wavelength region (IR)", the optical filters 2b and 2c transmit the "M wavelength region", the "first infrared wavelength region (IR1)", and the "second infrared wavelength region (IR2)", and the optical filter 2d transmits the "C wavelength region", the "second infrared wavelength region (IR2)", and the "third infrared wavelength region (IR3)".

The light intensity of the "Y wavelength region", the "first infrared wavelength region (IR1)", and the "third infrared wavelength region (IR3)" from an object may be calculated from Expression (14) or the like, for example.

$$Y+IR1+IR3=a11(W+IR)-2b11(M+IR1+IR2)-c11(C+IR2+IR3) \quad (14)$$

Here, a11, b11, and c11 represent coefficients, and may be appropriately adjusted according to transmittances of the respective optical filters, detection rates of the respective optical sensors, or the like.

Here, b24(M+IR1+IR2) detected by each of the optical sensors may be color-specified as "M" of the three primary colors, a24(C+IR2+IR3) detected by each of the optical sensors may be color-specified as "C" of the three primary colors, and c24(Y+IR1+IR3) detected by each of the optical sensors may be color-specified as "Y" of the three primary colors, with respect to the Y+IR1+IR3 obtained from the above-mentioned calculation. Here, a24, b24, and c24 represent coefficients, and may be appropriately adjusted.

Similarly, it is possible to convert the CMY color system information into the RGB color system information.

Referring to FIG. 11(f), the optical filter 2a transmits the "W wavelength region" and the "infrared wavelength region (IR)", the optical filters 2b and 2c transmit the "Y wavelength region", the "third infrared wavelength region (IR3)", and the "first infrared wavelength region (IR1)", and the optical filter 2d transmits the "M wavelength region", the "first infrared wavelength region (IR1)", and the "second infrared wavelength region (IR2)".

The light intensity of the "C wavelength region", the "second infrared wavelength region (IR2)", and the "third infrared wavelength region (IR3)" from an object may be calculated from Expression (15) or the like, for example.

$$C+IR2+IR3=a12(W+IR)-2b12(Y+IR1+IR3)-c12(M+IR1+IR2) \quad (15)$$

Here, a12, b12, and c12 represent coefficients, and may be appropriately adjusted according to transmittances of the respective optical filters, detection rates of the respective optical sensors, or the like.

Here, c25(Y+IR1+IR3) detected by each of the optical sensors may be color-specified as "Y" of the three primary colors, b25(M+IR1+IR2) detected by each of the optical sensors may be color-specified as "M" of the three primary colors, and a25(C+IR2+IR3) detected by each of the optical sensors may be color-specified as "C" of the three primary colors. Here, a25, b25, and c25 represent coefficients, and may be appropriately adjusted.

Similarly, it is possible to convert the CMY color system information to the RGB color system information.

Embodiment 9

Still Another Configuration Example of Optical Filters

FIGS. 12(a) to 12(f) are diagrams illustrating installation examples of optical filters that form a light detecting device and a solid-state image capturing apparatus according to Embodiment 9. Here, in the composite optical filter 5b, the optical filters 2a to 2d are arranged with the spacer member 7a being interposed therebetween.

Figure 12:
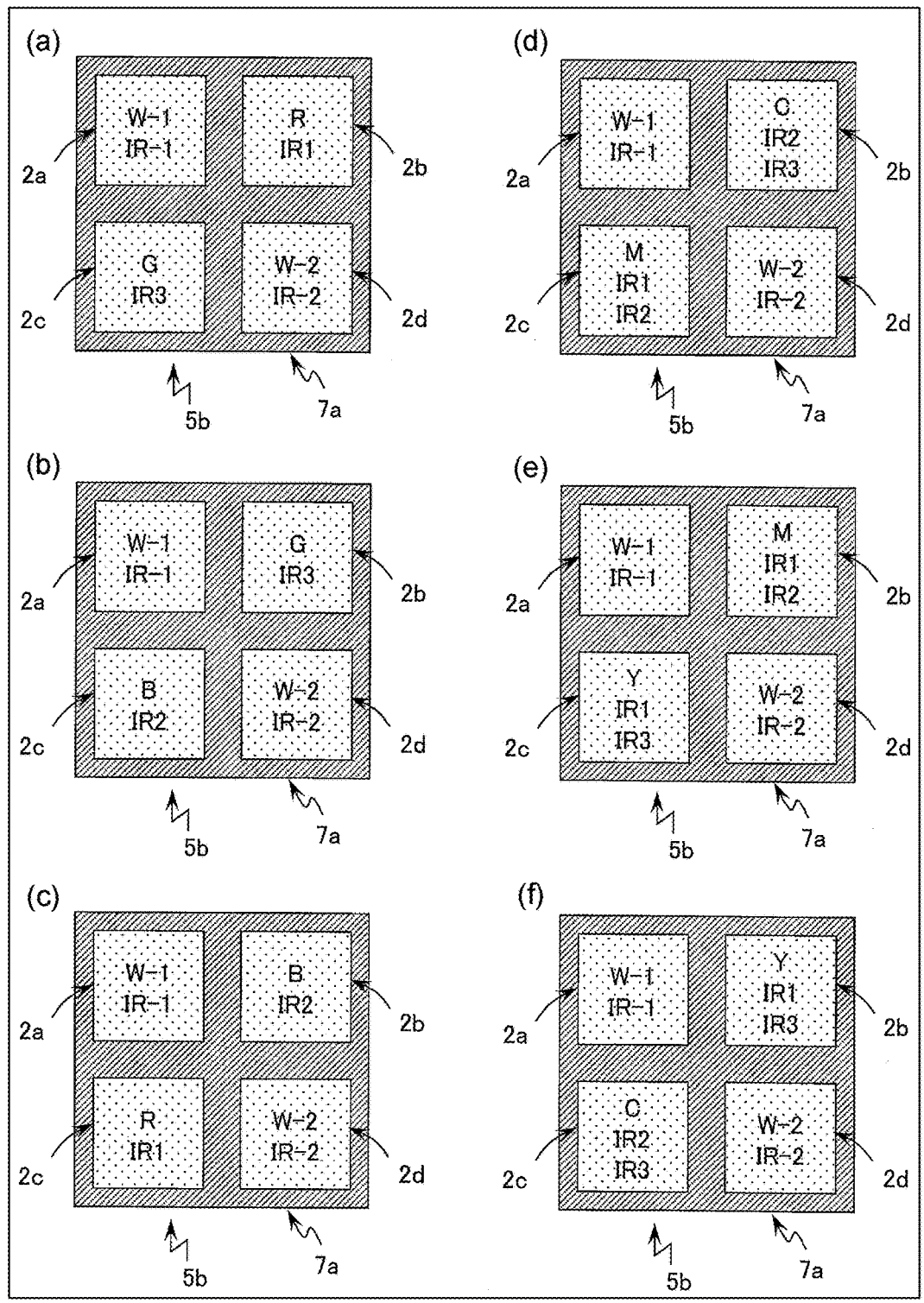
FIGS. 12(a) to 12(f) are diagrams illustrating installation examples of optical filters that form a light detecting device and a solid-state image capturing apparatus according to Embodiment 9 of the invention.

Referring to FIG. 12(a), the optical filters 2a and 2d transmit the "W wavelength region" and the "infrared wavelength region (IR)", the optical filter 2b transmits the "red wavelength region (R)" and the "first infrared wavelength region (IR1)", and the optical filter 2c transmits the "green wavelength region (G)" and the "third infrared wavelength region (IR3)".

The light intensity of the "blue wavelength region (B)" and the "second infrared wavelength region (IR2)" from an object may be calculated from Expression (16) or the like, for example.

$$B+IR2=2a13(W+IR)-b13(R+IR1)-c13(G+IR3) \quad (16)$$

Here, a13, b13, and c13 represent coefficients, and may be appropriately adjusted according to transmittances of the respective optical filters, detection rates of the respective optical sensors, or the like.

Referring to FIG. 12(b), the optical filters 2a and 2d transmit the "W wavelength region" and the "infrared wavelength region (IR)", the optical filter 2b transmits the "green wavelength region (G)" and the "third infrared wavelength region (IR3)", and the optical filter 2c transmits the "blue wavelength region (B)" and the "second infrared wavelength region (IR2)".

The light intensity of the "red wavelength region (R)" and the "first infrared wavelength region (IR1)" from an object may be calculated from Expression (17) or the like, for example.

$$R+IR1=2a14(W+IR)-b14(G+IR3)-c14(B+IR2) \quad (17)$$

Here, a14, b14, and c14 represent coefficients, and may be appropriately adjusted according to transmittances of the respective optical filters, detection rates of the respective optical sensors, or the like.

Referring to FIG. 12(c), the optical filters 2a and 2d transmit the "W wavelength region" and the "infrared wavelength region (IR)", the optical filter 2b transmits the "blue wavelength region (B)" and the "second infrared wavelength region (IR2)", and the optical filter 2c transmits the "red wavelength region (R)" and the "first infrared wavelength region (IR1)".

The light intensity of the "green wavelength region (G)" and the "third infrared wavelength region (IR3)" from an object may be calculated from Expression (18) or the like, for example.

$$G+IR3=2a15(W+IR)-b15(B+IR2)-c15(R+IR1) \quad (18)$$

Here, a15, b15, and c15 represent coefficients, and may be appropriately adjusted according to transmittances of the respective optical filters, detection rates of the respective optical sensors, or the like.

Referring to FIG. 12(d), the optical filters 2a and 2d transmit the "W wavelength region" and the "infrared wavelength region (IR)", the optical filter 2b transmits the "C wavelength region", the "second infrared wavelength region (IR2)", and the "third infrared wavelength region (IR3)", and the optical filter 2c transmits the "M wavelength region", the "first infrared wavelength region (IR1)", and the "second infrared wavelength region (IR2)".

The light intensity of the "Y wavelength region", the "first infrared wavelength region (IR1), and the "third infrared wavelength region (IR3)" from an object may be calculated from Expression (19) or the like, for example.

$$Y+IR1+IR3=2a16(W+IR)-b16(C+IR2+IR3)-c16(M+IR1+IR2) \quad (19)$$

Here, a16, b16, and c16 represent coefficients, and may be appropriately adjusted according to transmittances of the respective optical filters, detection rates of the respective optical sensors, or the like.

Similarly, it is possible to convert the CMY color system information to the RGB color system information.

Referring to FIG. 12(e), the optical filters 2a and 2d transmit the "W wavelength region" and the "infrared wavelength region (IR)", the optical filter 2b transmits the "M wavelength region", the "first infrared wavelength region (IR1)", and the "second infrared wavelength region (IR2)", and the optical filter 2c transmits the "Y wavelength region", the "first infrared wavelength region (IR1), and the "third infrared wavelength region (IR3)".

The light intensity of the "C wavelength region", the "second infrared wavelength region (IR2)", and the "third infrared wavelength region (IR3)" from an object may be calculated from Expression (20) or the like, for example.

$$C+IR2+IR3=2a17(W+IR)-b17(M+IR1+IR2)-c17(Y+IR1+IR3) \quad (20)$$

Here, a17, b17, and c17 represent coefficients, and may be appropriately adjusted according to transmittances of the respective optical filters, detection rates of the respective optical sensors, or the like.

Similarly, it is possible to convert the CMY color system information into the RGB color system information.

Referring to FIG. 12(f), the optical filters 2a and 2d transmit the "W wavelength region" and the "infrared wavelength region (IR)", the optical filter 2b transmits the "Y wavelength region", the "first infrared wavelength region (IR1)", and the "third infrared wavelength region (IR3)", and the optical filter 2c transmits the "C wavelength region", the "second infrared wavelength region (IR2)", and the "third infrared wavelength region (IR3)".

The light intensity of the "M wavelength region", the "first infrared wavelength region (IR1)", and the "second infrared wavelength region (IR2)" from an object may be calculated from Expression (21) or the like, for example.

$$M+IR1+IR2=2a18(W+IR)-b18(Y+IR1+IR3)-c18(C+IR2+IR3) \quad (21)$$

Here, a18, b18, and c18 represent coefficients, and may be appropriately adjusted according to transmittances of the respective optical filters, detection rates of the respective optical sensors, or the like.

Similarly, it is possible to convert the CMY color system information into the RGB color system information.

In addition to the above-mentioned combinations, other combinations using the "red wavelength region (R)", the "green wavelength region (G)", the "blue wavelength region (B)", the "C wavelength region", the "M wavelength region", the "Y wavelength region", the "first infrared wavelength region (IR1)", the "second infrared wavelength region (IR2)", or the "third infrared wavelength region (IR3) may be used.

The number of combinations obtained by selecting four or the three regions from the "red wavelength region (R)" and the "first infrared wavelength region (IR1)", the "green wavelength region (G)" and the "third infrared wavelength region (IR3)", the "blue wavelength region (B)" and the "second infrared wavelength region (IR2)", the "C wavelength region", the "second infrared wavelength region (IR2)" and the "third infrared wavelength region (IR3)", the "M wavelength region", the "first infrared wavelength region (IR1)" and the "second infrared wavelength region (IR2)", and the "Y wavelength region", the "first infrared wavelength region (IR1)" and the "third infrared wavelength region (IR3)" and by allocating the result to four regions, including the above-mentioned combinations, is about 140. Further, in consideration of differences between positions in the four regions, the number of combinations may be larger.

It is possible to convert their color systems into the RGB color system, the CMY color system, or the like, respectively.

In addition to the above-mentioned combinations, other combinations using other primary colors or colors may be used.

Similarly, it is possible to convert the CMY color system information into the RGB color system information.

Contrarily, it is possible to convert the RGB color system information into the CMY color system information.

W+IR may be replaced with 1 or the like in basic calculation, may be replaced with 255 or the like in digital calculation with 8 bits, may be replaced with 1023 or the like in digital calculation with 10 bits, may be replaced with $(2^{14})-1$ or the like in digital calculation with 14 bits, or may be replaced with $(2^{16})-1$ or the like in digital calculation with 16 bits. This is similarly applied to other bit numbers.

The color specification may be adjustment of hue, brightness (lightness or value), contrast (chroma or saturation), natural vibrance, color balance, color elements, gamma correction, or the like.

Figure 13:
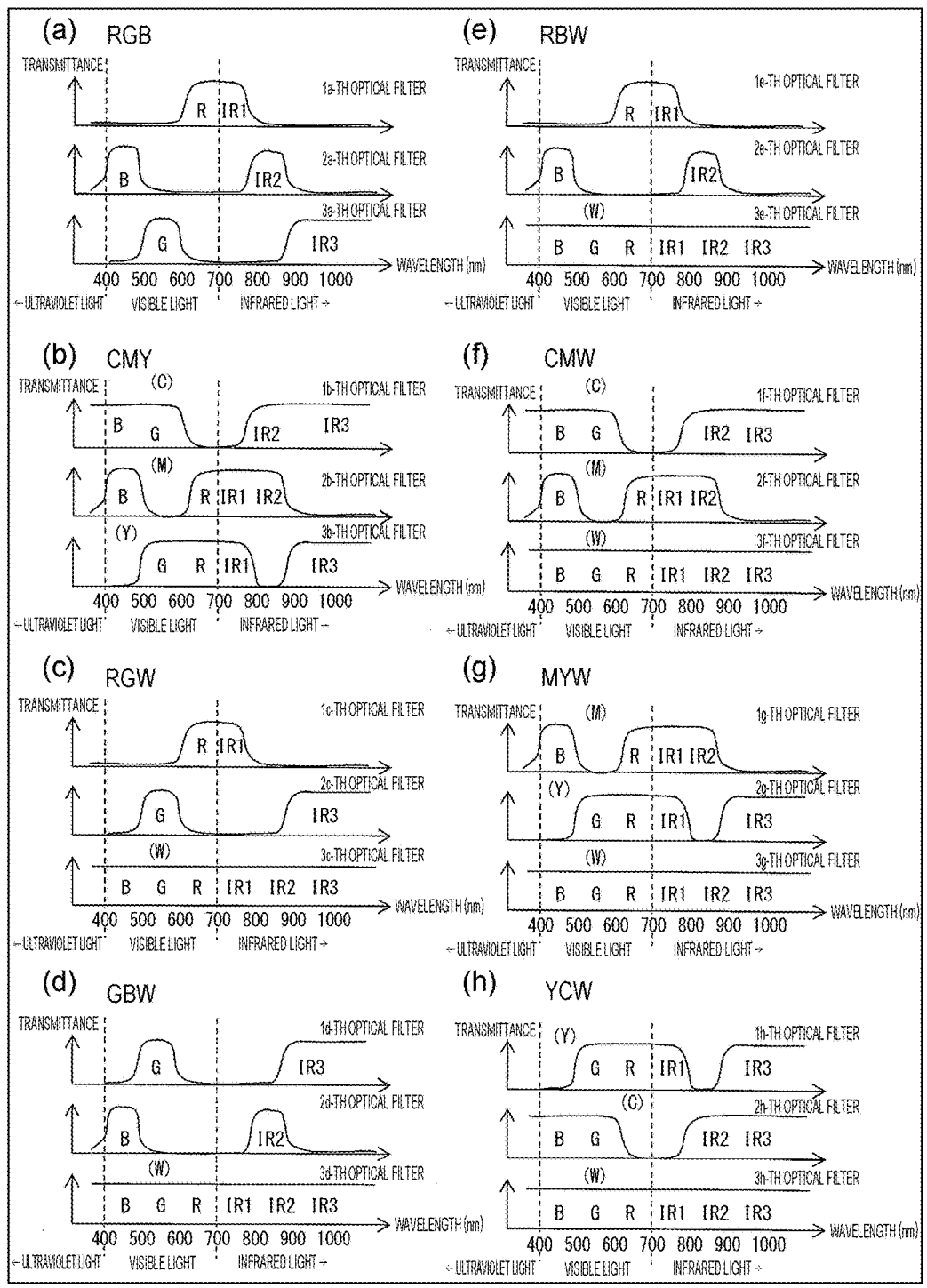
FIGS. 13(a) to 13(h) are diagrams illustrating wavelength dependency of transmittances of optical filters that form the light detecting devices and the solid-state image capturing apparatus according to the invention.

FIGS. 13(a) to 13(h) are diagrams illustrating wavelength dependency of transmittances of optical filters that form a light detecting device and a solid-state image capturing apparatus according to this embodiment. In FIG. 13, specific examples of wavelength dependency of transmittances in combinations of representative optical filters. FIG. 13(a) corresponds to RGB, FIG. 13(b) corresponds to CMY, FIG. 13(c) corresponds to RGW, FIG. 13(d) corresponds to GBW, FIG. 13(e) corresponds to RBW, FIG. 13(f) corresponds to CMW, FIG. 13(g) corresponds to MYW, and FIG. 13(h) corresponds to YCW.

Embodiment 10

Configuration of Solid-State Image Capturing Apparatus 1b

Figure 14:
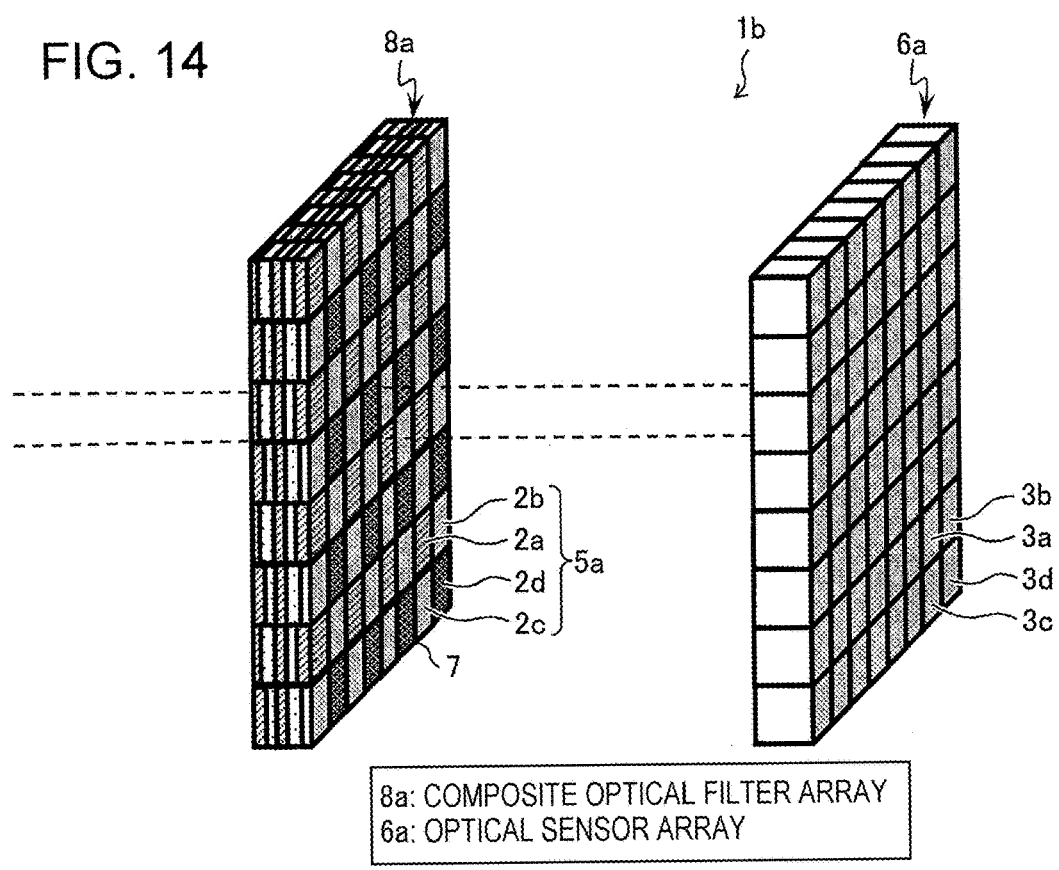
FIG. 14 is a diagram illustrating a solid-state image capturing apparatus according to Embodiment 10 of the invention.

FIG. 14 is a diagram illustrating a configuration of a solid-state image capturing apparatus 1b according to Embodiment 10. The solid-state imaging capturing apparatus 1b includes a composite optical filter array 8a and an optical sensor array 6a. The composite optical filter array 8a includes plural composite optical filters 5a which are regularly arranged in a matrix form. Optical filters 2a to 2d which are arranged in two rows and two columns and have different transmission wavelength bands are formed in each composite optical filter 5a. A spacer member 7 is formed between the optical filters 2a to 2d. The optical filters 2a to 2d transmit visible light having a predetermined wavelength and visible light having a predetermined wavelength. Plural layered members having different refractive indexes are layered in each of the optical filters 2a to 2d.

Further, the optical sensor array 6a includes plural optical sensors 3a to 3d which are regularly arranged in a matrix form to correspond to the optical filters 2a to 2d. The optical sensor 3a detects visible light having a predetermined wavelength and infrared light having a predetermined wavelength that have passed through the optical filter 2a. The optical filter 3b detects visible light having a predetermined wavelength and infrared light having a predetermined wavelength that have passed through the optical filter 2b. The optical filter 3c detects visible light having a predetermined wavelength and infrared light having a predetermined wavelength that have passed through the optical filter 2c. The optical filter 3d detects visible light having a predetermined wavelength and infrared light having a predetermined wavelength that have passed through the optical filter 2d.

Figure 15:
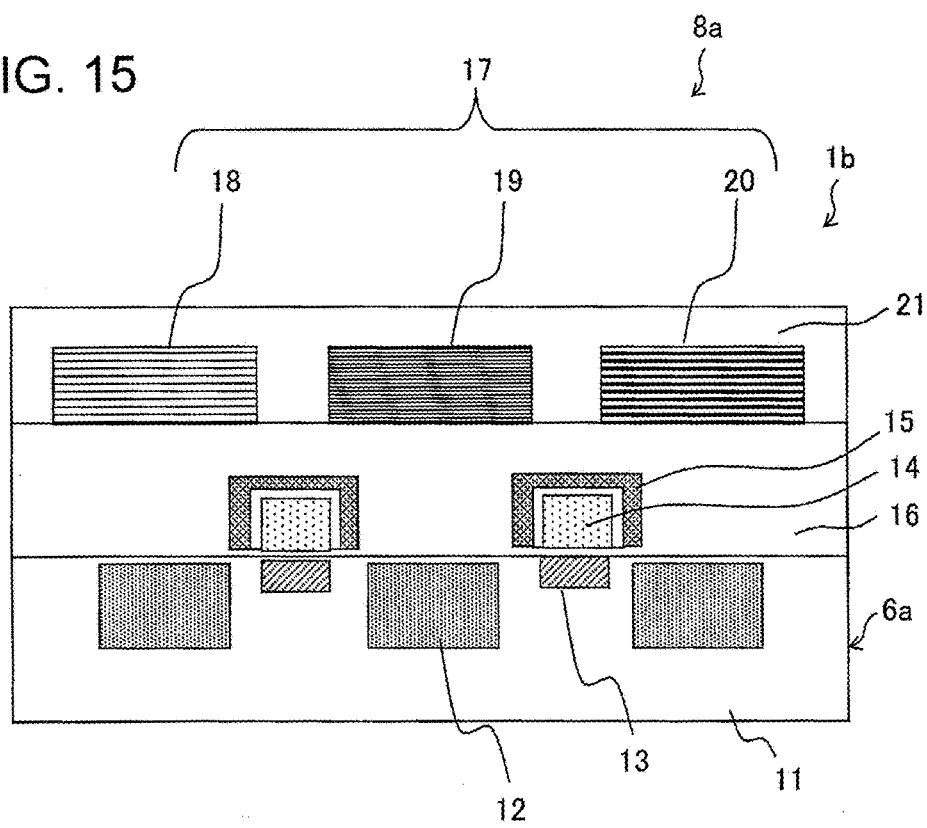
FIG. 15 is a cross-sectional view of the solid-state image capturing apparatus according to Embodiment 10.

FIG. 15 is a cross-sectional view of the solid-state image capturing apparatus 1b according to Embodiment 10. As shown in FIG. 15, the solid-state image sensor 1b according to Embodiment 10 includes a semiconductor substrate 11. A photoelectric conversion unit 12 and a charge transfer unit 13 are formed on the semiconductor substrate 11. The photoelectric conversion unit 12 and the charge transfer unit 13 correspond to the optical sensor array 6a. A transfer electrode 14 and a light shielding film 15 are formed on the semiconductor substrate 11 with an insulating film being interposed therebetween. An insulating film 16 is formed on the light shielding film 15. An inorganic film optical filter 17 is formed on the insulating film 16. A spacer film 21 is formed on the inorganic film optical filter 17. Here, an example in which the spacer film 21 is integrated with the spacer member is shown, and this may be similarly applied hereinafter.

In the example of FIG. 15, the inorganic film optical filter 17 includes a first optical filter 18, a second optical filter 19, and a third optical filter 20, and corresponds to the composite optical filter 8a.

The example of FIG. 15 may be applied to the light detecting device according to this embodiment.

Figure 16:
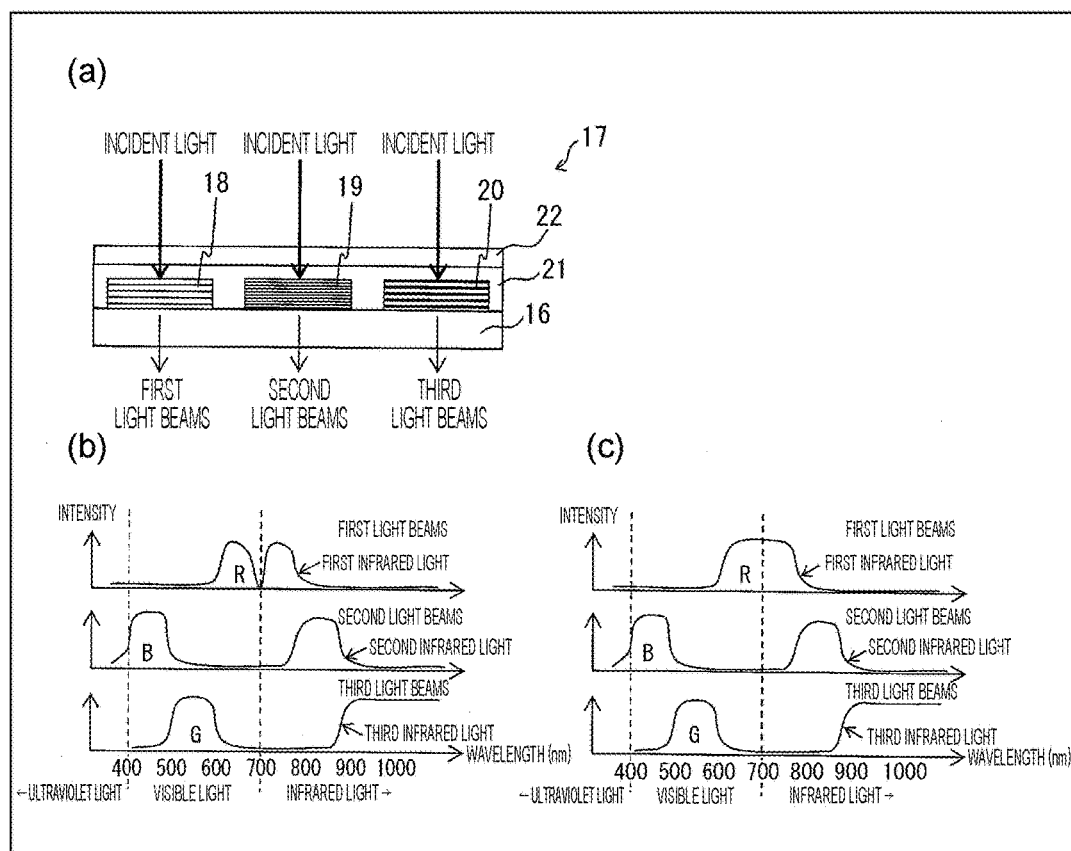
FIG. 16(a) is a cross-sectional view of an inorganic film optical filter unit according to Embodiment 10, and FIGS.

FIG. 16(a) is a cross-sectional view of an inorganic film optical filter unit according to Embodiment 10, and FIGS. 16(b) and 16(c) are graphs illustrating wavelength dependency of intensities of respective light beams that transmit a color filter. In the figure, an example in which incident light passes through the first optical filter 18, the second optical filter 19, and the third optical filter 20, and thus, first light beams, second light beams, and third light beams respectively exit from the first optical filter 18, the second optical filter 19, and the third optical filter 20 is shown. The first optical filter 18, the second optical filter 19, and the third optical filter 20 are configured so that the first light beams, the second light beams, and the third light beams have wavelength spectrums as shown in FIG. 16(b). With respect to the first light beams, the first optical filter 18 may be configured so that the first light beams have a spectrum in which visible light R and first infrared light are connected to each other as shown in FIG. 16(c).

FIGS. 17(a) to 17(g) are cross-sectional diagrams illustrating a method for manufacturing the solid-state image capturing apparatus 1b according to Embodiment 10. Examples of FIGS. 17(a) to 17(g) may be applied to a method for manufacturing the light detecting device according to this embodiment.

First, as shown in FIG. 17(a), the photoelectric conversion unit 12 and the charge transfer unit 13 are formed using ion injection so as to be exposed on a front surface of the semiconductor substrate 11 formed of silicon. Further, an insulating film (not shown) which is a silicon oxide film of a thickness of 100 nm to 3000 nm, for example, is formed on the front surface of the semiconductor substrate 11 using silicon thermal oxidation or a chemical vapor deposition (CVD) method. Then, for example, a polysilicon film is deposited at a thickness of about 50 nm to 300 nm using a CVD method. Then, n-type impurities such as phosphor are introduced using thermal diffusion or ion injection.

Thereafter, the transfer electrode 14 is formed using anisotropic etching, using a photoresist which is patterned in a predetermined pattern as a mask, based on a photolithography technique. Then, an insulating film (not shown) is formed by deposition of an oxidation film based on polysilicon oxidation or a CVD method. For example, an anti-reflection coat (not shown) is formed by depositing a silicon nitride film and performing anisotropic etching with respect to the silicon nitride film using a photoresist patterned in a predetermined pattern as a mask.

Then, tungsten or the like which is a material of a light shielding film is deposited, and the light shielding film 15 is formed using a photolithography technique. Further, the insulating film 16 which is a silicon oxide film is formed using a CVD method. The insulating film 16 may be flattened using CMP or etching.

Next, the first optical filter 18 is formed on the insulating film 16. The first optical filter is formed by an inorganic multilayer film, and is formed by alternately layering a low-refractive-index material and a high-refractive-index material. Specifically, a silicon oxide film $SiO_2$ is used as the low-refractive-index material, and a silicon nitride film SiN or a titanium oxide film $TiO_2$ is used as the high-refractive-index material. The multilayer film may be formed using a CVD method, or may be formed using a deposition method or a sputtering method.

Then, as shown in FIG. 17(b), the first optical filter 18 is etched using a photoresist (not shown) patterned in a predetermined pattern as a mask, based on a photolithography technique, to form a predetermined pattern.

Then, as shown in FIG. 17(c), the second optical filter 19 is formed using a CVD method or the like.

Then, as shown in FIG. 17(d), the second optical filter 19 is etched using a photoresist (not shown) patterned in a predetermined pattern as a mask, based on a photolithography technique, to form a predetermined pattern.

Then, as shown in FIG. 17(e), the third optical filter 20 is formed using a CVD method or the like.

Then, as shown in FIG. 17(f), the third optical filter 20 is etched using a photoresist (not shown) patterned in a predetermined pattern as a mask, based on a photolithography technique, to form a predetermined pattern.

In the above-mentioned examples, the formation of the optical filters is performed in the order of the first optical filter 18, the second optical filter 19, and the third optical filter 20, but the invention is not limited thereto. The formation order of the three optical filters may be arbitrarily set.

Then, as shown in FIG. 17(g), the spacer film 21 is formed. The spacer film 21 is formed by coating of a silicon oxide film $SiO_2$ using a spin-on-glass (SOG) method or by coating of an acrylic material.

FIG. 18 is a cross-sectional view illustrating a structure of an inorganic film optical filter 17. Low-refractive-index materials and high-refractive-index materials of a multilayer film corresponding to plural layered members are alternately arranged in the order of L0, H1, L1, H2, L2, ..., Hj−1, Lj−1, Hj, and Lj from the top, respectively. Refractive indexes of the low-refractive-index materials and the high-refractive-index materials are respectively represented as nL0, nH1, nL1, nH2, nL2, ..., nHj−1, nLj−1, nHj, and nLj, and film thicknesses of the low-refractive-index materials and high-refractive-index materials are respectively represented as dL0, dH1, dL1, dH2, dL2, ..., dHj−1, dLj−1, dHj, and dLj.

The refractive indexes and the film thicknesses of the low-refractive-index materials and high-refractive-index materials are set so that the inorganic film optical filter 17 (the first optical filter 18, the second optical filter 19, and the third optical filter 20) has a filter characteristic having transmission bands in wavelength regions of visible light and infrared light as shown in FIG. 16(b) or FIG. 16(c).

FIG. 19(a) is a diagram illustrating structures of the first optical filter 18 and the second optical filter 19, and FIG.

19(b) is an expression of comparison of refractive indexes of respective high-refractive-index layers. A refractive index of a high-refractive-index layer of the first optical filter 18 is higher than a refractive index of a high-refractive-index layer of the second optical filter 19. As a specific example, the refractive index of the high-refractive-index layer of the first optical filter 18 is set as 2.3 to 2.8, and the refractive index of the high-refractive-index layer of the second optical filter 19 is set as 1.8 to 2.3.

FIG. 20(a) is a graph illustrating a refractive index of the inorganic film optical filter 17, and FIG. 20(b) is a graph illustrating wavelength dependency of an absorption coefficient of the inorganic film optical filter 17. Curve G1 represents a refractive index of a high-refractive-index layer $n_{H:18}$ of the first optical filter 18, curve G2 represents a refractive index of a high-refractive-index layer $n_{H:19}$ of the second optical filter 19, curve G3 represents an absorption coefficient of the high-refractive-index layer $n_{H:18}$ of the first optical filter 18, and curve G4 represents an absorption coefficient of the high-refractive-index layer $n_{H:19}$ of the second optical filter 19.

If the refractive indexes increase as shown in FIGS. 20(a) and 20(b), the absorption coefficients increase and the refractive indexes decrease. Particularly, this is noticeable in a short wavelength region. For example, in a case where the optical filter is configured to transmit a wavelength region of purple to blue of 400 nm to 500 nm, for example, it is possible to prevent reduction in a transmittance by using a material having a low refractive index. In a case where the filter does not need to transmit a short wavelength region, since when a refractive index of a high-refractive-index member is high, it is possible to make the entire film thickness thin, it is preferable to use a high-refractive-index material. That is, by differentiating refractive indexes of high-refractive-index layers at respective pixels, it is possible to obtain optimal spectroscopy.

Figure 21:
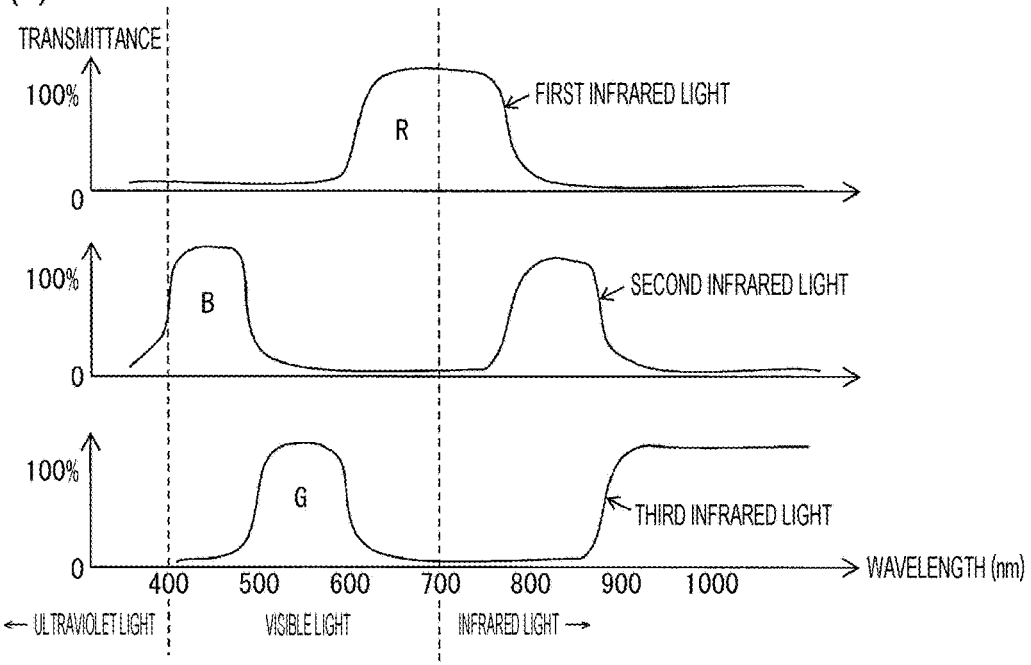

FIG. 21(a) is a diagram illustrating an example of refractive indexes and film thicknesses of the first to third optical filters 18 to 20, and FIG. 21(b) shows wavelength dependency of transmittances of the optical filters. As shown in FIG. 21, by setting a proper refractive index and a proper film thickness for each pixel, it is possible to form optical filters that transmit a visible light region and an infrared light region. Refractive indexes (2.2) of high-refractive-index materials H1 to H8 of the second optical filter 19 and refractive indexes (2.2) of high-refractive-index materials H1 to H4 of the third optical filter 20 are lower than refractive indexes (2.5) of high-refractive-index materials H1 to H4 of the first optical filter 18. Combinations of the film thicknesses and refractive indexes are not limited thereto, and the number of layers may increase or decrease, or an arbitrary film thickness and an arbitrary refractive index may be selected for each layer.

Embodiment 11

Configuration of Solid-State Image Capturing Apparatus 1c

FIG. 22 is a diagram illustrating a configuration of a solid-state image capturing apparatus 1c according to Embodiment 11. The same reference numerals are given to the same components as the components described in FIG. 14, and detailed description thereof will not be repeated. The solid-state image capturing apparatus 1c is different from the solid-state image capturing apparatus 1b shown in FIG. 14 in that a lens array 9a is provided on a side opposite to the optical sensor array 6a with respect to the composite optical filter array 8a. The lens array 9a includes plural lenses which are regularly arranged in plan to correspond to the optical filters 2a to 2d.

FIG. 23 is a cross-sectional view of the solid-state image capturing apparatus 1c. The same reference numerals are given to the same components as the components described in FIG. 15, and detailed description thereof will not be repeated. The solid-state image capturing apparatus 1c is different from the solid-state image capturing apparatus 1b shown in FIG. 15 in that a concentrating lens 22 is formed on a spacer film 21. The concentrating lens 22 corresponds to the lens array 9a.

In the example of FIG. 23, the inorganic film optical filter 17 includes the first optical filter 18, the second optical filter 19, and the third optical filter 20.

In the example of FIG. 23, a light beam L4 from an object is concentrated by the concentrating lens 22, passes through the second optical filter 19, and enters the photoelectric conversion unit 12. Thus, it is possible to enhance sensitivity of the photoelectric conversion unit 12 by a concentration effect based on the concentrating lens 22. Further, by performing concentration using the concentrating lens 22 at a central portion of the second optical filter 19 where a filter film thickness is stable, it is possible to reduce variation in transmission characteristics of the second optical filter 19, and to reduce light leakage to adjacent cells. Thus, it is possible to enhance color separation. The example of the second optical filter 19 is shown, but this is similarly applied to the first optical filter 18 and the third optical filter 20.

The example of FIG. 23 may be applied to a light detecting device according to this embodiment.

FIGS. 24(a) and 24(b) are diagrams illustrating a method for manufacturing the solid-state image capturing apparatus 1c according to Embodiment 11. FIG. 24(a) is a cross-sectional view after the inorganic film optical filter 17 and the spacer film 21 are formed, in which the manufacturing method employs the same processes as those of FIGS. 17(a) to 17(g) in Embodiment 10. Then, as shown in FIG. 24(b), acryl is formed thereon, and then, is etched so that a photoresist (not shown) shape patterned in a predetermined shape is transferred, to thereby form the concentrating lens 22.

The example of FIGS. 24(a) and 24(b) may be applied to a method for manufacturing a light detecting device according to this embodiment.

Embodiment 12

Configuration of Solid-State Image Capturing Apparatus 1d

FIG. 25 is a diagram illustrating a solid-state image capturing apparatus 1d according to Embodiment 12. The same reference numerals are given to the same components as the components described in FIG. 22, and detailed description thereof will not be repeated. The solid-state image capturing apparatus 1d is different from the solid-state image capturing apparatus 1c shown in FIG. 22 in that the lens array 9a is provided between the composite optical filter array 8a and the optical sensor array 6a. The lens array 9a includes plural lenses which are regularly arranged in plan to correspond to the optical filters 2a to 2d.

FIG. 26 is a cross-sectional view of the solid-state image capturing apparatus 1d. The same reference numerals are given to the same components as the components described in FIG. 15, and detailed description thereof will not be repeated. The solid-state image capturing apparatus 1*d* is different from the solid-state image capturing apparatus 1*b* shown in FIG. 15 in that a concentrating lens 27 is formed on the insulating film 16. The concentrating lens 27 corresponds to the lens array 9*a*.

In the example of FIG. 26, the inorganic film optical filter 17 includes the first optical filter 18, the second optical filter 19, and the third optical filter 20.

In the example of FIG. 26, a light beam L4 from an object passes through the second optical filter 19, is concentrated by the concentrating lens 27, and enters the photoelectric conversion unit 12. Thus, it is possible to enhance sensitivity of the photoelectric conversion unit 12 by a concentration effect based on the concentrating lens 27. The example of the second optical filter 19 is shown, but this is similarly applied to the first optical filter 18 and the third optical filter 20.

The example of FIG. 26 may be applied to a light detecting device according to this embodiment.

Figure 27:
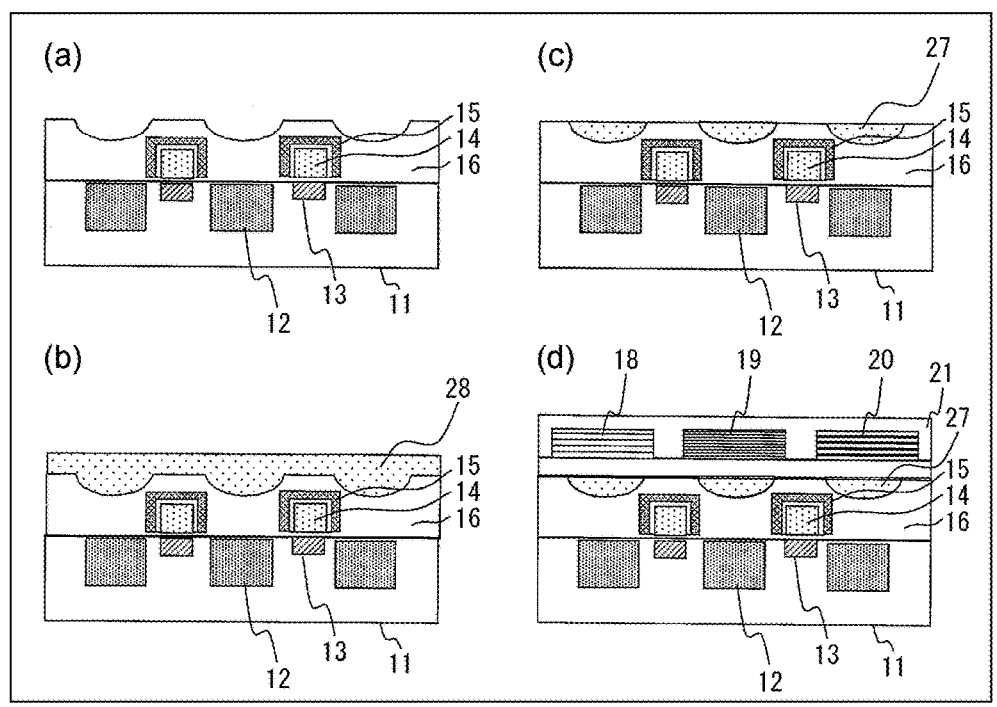

FIGS. 27(*a*) and 27(*d*) are diagrams illustrating a method for manufacturing the solid-state image capturing apparatus 1*d* according to Embodiment 12. First, as shown in FIG. 27(*a*), the photoelectric conversion unit 12 and the charge transfer unit 13 are formed using ion injection so as to be exposed on a front surface of the semiconductor substrate 11 formed of silicon. Further, an insulating film (not shown) which is a silicon oxide film of a thickness of 100 nm to 3000 nm, for example, is formed on the front surface of the semiconductor substrate 11 using silicon thermal oxidation or a CVD method.

Then, for example, a polysilicon film is deposited at a thickness of about 50 nm to 300 nm using a CVD method. Then, n-type impurities such as phosphor are introduced using thermal diffusion or ion injection. Thereafter, the transfer electrode 14 is formed using anisotropic etching, using a photoresist which is patterned in a predetermined pattern as a mask, based on a photolithography technique.

Then, an insulating film (not shown) is formed by deposition of an oxidation film based on polysilicon oxidation or a CVD method. For example, an antireflection coat (not shown) is formed by depositing a silicon nitride film and performing anisotropic etching with respect to the silicon nitride film using a photoresist patterned in a predetermined pattern as a mask.

Then, tungsten or the like which is a material of a light shielding film is deposited, and the light shielding film 15 is formed using a photolithography technique. Further, the insulating film 16 which is a silicon oxide film is formed using a CVD method. An embedding shape of the insulating film 16 formed using the CVD method is a downwardly convex shape between the transfer electrodes 14, as shown in FIG. 27(*a*).

Then, as shown in FIG. 27(*b*), for example, a silicon nitride film 28 is formed using a CVD method, for example. Then, as shown in FIG. 27(*c*), the concentrating lens 27 is formed using an etching method or a chemical mechanical planarization (CMP) method. Further, as shown in FIG. 27(*d*), the first optical filter 18, the second optical filter 19, and the third optical filter 20 are sequentially formed using the same method as in FIGS. 17(*a*) to 17(*g*).

The formation of the optical filters is not limited to the method performed in the order of the first optical filter 18, the second optical filter 19, and the third optical filter 20, and the formation order of the three optical filters may be arbitrarily set.

In FIG. 27(*c*), the concentrating lens 27 is formed using the etching method or the CMP method, but it is possible to obtain the same lens effect as in the concentrating lens 27 even when the shape of FIG. 27(*b*) is maintained as it is. By performing etching, a distance between the semiconductor substrate 11, and the first optical filter 18, the second optical filter 19 and the third optical filter 20 is reduced, and thus, the sensitivity is enhanced.

The examples of FIGS. 27(*a*) to 27(*d*) may be applied to a method for manufacturing the light detecting device according to this embodiment.

Embodiment 13

(Configuration of Solid-State Image Capturing Apparatus 1*e*

FIG. 28 is a diagram illustrating a configuration of a solid-state image capturing apparatus 1*e* according to Embodiment 13. The same reference numerals are given to the same components as the components described in FIG. 22, and detailed description thereof will not be repeated. The solid-state image capturing apparatus 1*e* is different from the solid-state image capturing apparatus 1*c* shown in FIG. 22 in that a lens array 9*b* is provided between the composite optical filter array 8*a* and the optical sensor array 6*a*, in addition to the lens array 9*a*. The lens array 9*b* has the same configuration as that of the lens array 9*a*.

FIG. 29 is a cross-sectional view of the solid-state image capturing apparatus 1*e* according to Embodiment 13. The same reference numerals are given to the same components as the components described in FIG. 23, and detailed description thereof will not be repeated. The solid-state image capturing apparatus 1*e* is different from the solid-state image capturing apparatus 1*c* shown in FIG. 23 in that the concentrating lens 27 described in FIG. 26 is additionally provided.

In the example of FIG. 29, the inorganic film optical filter 17 includes the first optical filter 18, the second optical filter 19, and the third optical filter 20. In FIG. 29, the shape of the light beam L4 is shown, but it is possible to enhance sensitivity of the photoelectric conversion unit 12 by a concentration effect based on two lenses of the concentrating lens 22 and the concentrating lens 27. Further, by performing concentration at a central portion of the second optical filter 19 where a filter film thickness is stable, it is possible to reduce variation in transmission characteristics of the second optical filter 19, and to reduce light leakage to adjacent cells. Thus, it is possible to enhance color separation. The example of the second optical filter 19 is shown, but this is similarly applied to the first optical filter 18 and the third optical filter 20.

The example of FIG. 29 may be applied to a light detecting device according to this embodiment.

Figure 30:
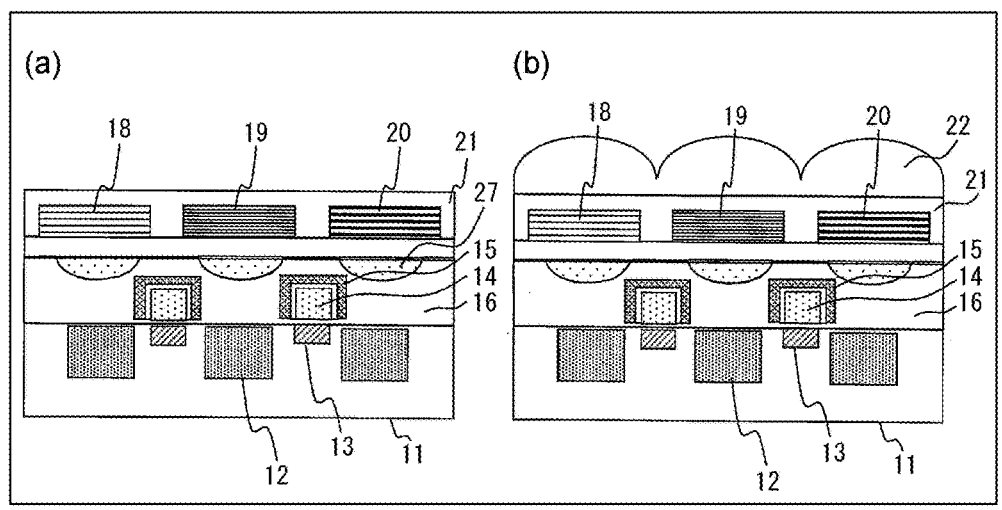

FIGS. 30(*a*) and 30(*b*) are diagrams illustrating a method for manufacturing the solid-state image capturing apparatus 1*e* according to Embodiment 13. FIG. 30(*a*) is a cross-sectional view after the inorganic film optical filter 17 and the spacer film 21 are formed. The manufacturing method employs the same processes as those of FIGS. 27(*a*) to 27(*d*) in Embodiment 12. Then, as shown in FIG. 30(*b*), acryl is formed thereon, and then, is etched so that a photoresist (not shown) shape patterned in a predetermined shape is transferred, to thereby form the concentrating lens 22.

The example of FIGS. 30(*a*) and 30(*b*) may be applied to a method for manufacturing a light detecting device according to this embodiment.

Embodiment 14

Figure 31:
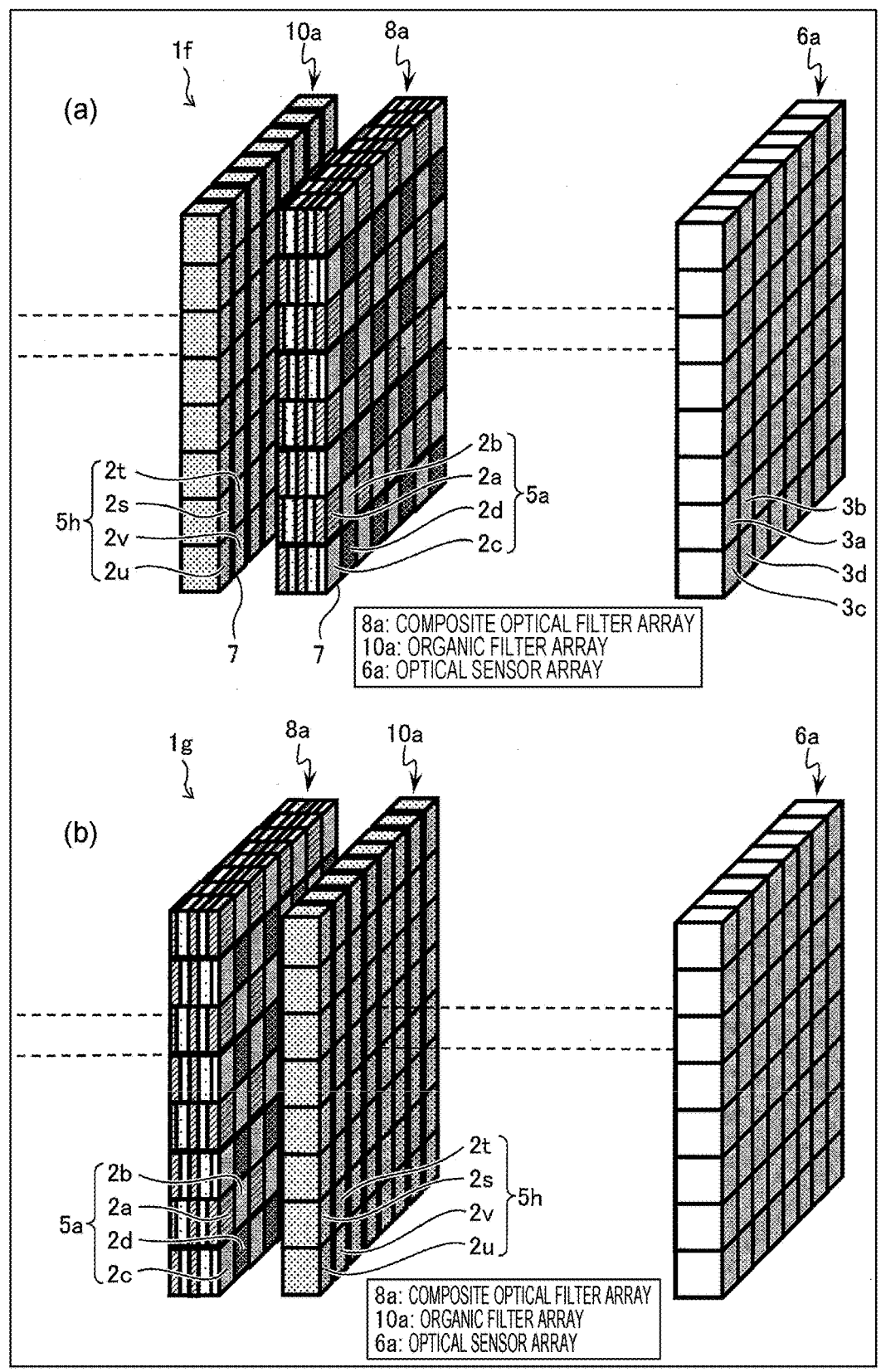

FIG. 31(*a*) is a diagram illustrating a configuration of a solid-state image capturing apparatus 1*f* according to Embodiment 14. FIG. 31(b) is a diagram illustrating a configuration of another solid-state image capturing apparatus 1g according to Embodiment 14. The same reference numerals are given to the same components as the components described in FIG. 14, and detailed description thereof will not be repeated. The solid-state image capturing apparatus if shown in FIG. 31(a) is different from the solid-state image capturing apparatus 1b shown in FIG. 14 in that an organic filter array 10a (or a second composite optical filter array) is provided on a side opposite to the optical sensor 6a with respect to the composite optical filter array 8a (or a first composite optical filter array). The organic filter array 10a includes plural composite organic filters 5h. Each of the plural composite organic filters 5h includes optical filters 2s, 2t, 2u, and 2v which are arranged in two rows and two columns and are different in transmission wavelength bands. The optical filters 2s, 2t, 2u, and 2v are formed of organic materials. The optical filters 2s, 2t, 2u, and 2v are regularly arranged in plan to correspond to the optical filters 2a, 2b, 2c, and 2d of the composite optical filters 8a. The optical filters 2a to 2d of the composite optical filter 5a may be formed of different materials. Further, at least two of the optical filters 2a to 2d may be formed of the same material. Furthermore, the optical filters 2s to 2v of the composite organic filter 5h may be formed of different materials. In addition, at least two of the optical filters 2s to 2v may be formed of the same material.

The solid-state image capturing apparatus 1g shown in FIG. 31(b) is different from the solid-state image capturing apparatus 1f shown in FIG. 31(a) in that the organic filter array 10a (the second composite optical filter array) is provided between the composite optical filter 8a (the first composite optical filter) and the optical sensor array 6a. The solid-state image capturing apparatus 1g has the same configuration as that of the solid-state image capturing apparatus 1f except for the above-described difference. The optical filters 2a to 2d of the composite optical filter 5a may be formed of different materials. Further, at least two of the optical filters 2a to 2d may be formed of the same material. Furthermore, the optical filters 2s to 2v of the composite organic filter 5h may be formed of different materials. In addition, at least two of the optical filters 2s to 2v may be formed of the same material.

FIG. 32 is a cross-sectional view of the solid-state image capturing apparatus 1f according to Embodiment 14. The same reference numerals are given to the same components as the components described in FIG. 15, and detailed description thereof will not be repeated. The solid-state image capturing apparatus 1f is different from the solid-state image capturing apparatus 1b shown in FIG. 15 in that an organic film optical filter 24 and a second planarization film 26 are formed on the spacer film 21.

The example of FIG. 32 may be applied to a light detecting device according to this embodiment.

FIG. 33(a) is a graph illustrating wavelength dependency of a transmittance of an organic film optical filter, FIG. 33(b) is a graph illustrating wavelength dependency of a transmittance of an inorganic optical filter, and FIG. 33(c) is a graph illustrating wavelength dependency of a total transmittance.

Curve G5 of FIG. 33(a) represents wavelength dependency of a transmittance of the organic film optical filter 24. Curve G6 of FIG. 33(b) represents wavelength dependency of a transmittance of the second optical filter (inorganic film optical filter) 19. Curve G7 of FIG. 33(c) represents wavelength dependency of a total transmittance of the organic film optical filter 24 and the second optical filter (inorganic film optical filter) 19. FIG. 33(c) shows the same characteristics as in the second optical filter of FIG. 21(b). By layering filters having spectrum characteristics as shown in FIGS. 33(a) and 33(b), it is possible to obtain spectrum characteristics indicating transmission of a visible light region and an infrared region as shown in FIG. 33(c).

As shown in FIG. 33(b), the spectrum of the second optical filter (inorganic film optical filter) 19 may be obtained by cutting a part of the infrared region, and thus, it is possible to relatively simply configure a structure of an inorganic multilayer film. By layering the organic filter (organic film optical filter 24) and the inorganic film filter (second optical filter 19) in this way, it is possible to realize complicated spectrum characteristics.

FIGS. 34(a) to 34(c) are diagrams illustrating a method for manufacturing the solid-state image capturing apparatus if according to Embodiment 14. First, a structure shown in FIG. 34(a) is manufactured according to the method described in FIGS. 17(a) to (g).

Then, as shown in FIG. 34(b), an organic film is formed thereon, and then, pattern exposure, development, and baking are performed, to thereby form the organic film optical filter 24. Then, as shown in FIG. 34(c), the second flattening film 26 is formed. The second planarization film 26 is formed by coating of an acrylic material.

The example of FIGS. 34(a) to 34(c) may be applied to a method for manufacturing a light detecting device according to this embodiment.

FIG. 35 is a cross-sectional view of the solid-state image capturing apparatus according to Embodiment 14. The same reference numerals are given to the same components as the components described in FIG. 15, and detailed description thereof will not be repeated. The solid-state image capturing apparatus 1f is different from the solid-state image capturing apparatus 1b shown in FIG. 15 in that an organic film optical filter 25 and the second planarization film 26 are formed on the spacer film 21.

The example of FIG. 35 may be applied to a light detecting device according to this embodiment.

FIG. 36(a) is a graph illustrating wavelength dependency of a transmittance of an organic film optical filter, FIG. 36(b) is a graph illustrating wavelength dependency of a transmittance of an inorganic optical filter, and FIG. 36(c) is a graph illustrating wavelength dependency of a total transmittance.

Curve G8 of FIG. 36(a) represents wavelength dependency of a transmittance of the organic film optical filter 25. Curve G9 of FIG. 36(b) represents wavelength dependency of a transmittance of the third optical filter (inorganic film optical filter) 20. Curve G10 of FIG. 36(c) represents wavelength dependency of a total transmittance of the organic film optical filter 25 and the third optical filter (inorganic film optical filter) 20. FIG. 36(c) shows the same characteristics as in the third optical filter of FIG. 21(b). By layering filters having spectrum characteristics as shown in FIGS. 36(a) and 36(b), it is possible to obtain spectrum characteristics indicating transmission of a visible light region and an infrared region as shown in FIG. 36(c).

FIG. 37 is a cross-sectional view of the solid-state image capturing apparatus 1f according to Embodiment 14. The same reference numerals are given to the same components as the components described in FIG. 15, and detailed description thereof will not be repeated. The solid-state image capturing apparatus 1f is different from the solid-state image capturing apparatus 1b shown in FIG. 15 in that an organic film optical filter 23 and the second planarization film 26 are formed on the spacer film 21.

The example of FIG. 37 may be applied to a light detecting device according to this embodiment.

FIG. 38(a) is a graph illustrating wavelength dependency of a transmittance of an organic film optical filter, FIG. 38(b) is a graph illustrating wavelength dependency of a transmittance of an inorganic optical filter, and FIG. 38(c) is a graph illustrating wavelength dependency of a total transmittance.

Curve G13 of FIG. 38(a) represents wavelength dependency of a transmittance of the organic film optical filter 23. Curve G14 of FIG. 38(b) represents wavelength dependency of a transmittance of the first optical filter (inorganic film optical filter) 18. Curve G15 of FIG. 38(c) represents wavelength dependency of a total transmittance of the organic film optical filter 23 and the first optical filter (inorganic film optical filter) 18. FIG. 38(c) shows the same characteristics as in the first optical filter of FIG. 21(b). By layering filters having spectrum characteristics as shown in FIGS. 38(a) and 38(b), it is possible to obtain spectrum characteristics indicating transmission of a visible light region and an infrared region as shown in FIG. 38(c).

Embodiment 15

FIG. 39 is a cross-sectional view of a solid-state image capturing apparatus according to Embodiment 15. The same reference numerals are given to the same components as the components described in FIG. 15, and detailed description thereof will not be repeated. The solid-state image capturing apparatus is different from the solid-state image capturing apparatus 1b shown in FIG. 15 in that a first optical filter 18a, a second optical filter 19a, and a third optical filter 20a are formed, instead of the first optical filter 18, the second optical filter 19, and the third optical filter 20. The first optical filter 18a, the second optical filter 19a, and the third optical filter 20a are formed by layering curved layered members.

In FIG. 39, the shape of the light beam L4 is shown, but it is possible to enhance sensitivity of the photoelectric conversion unit 12 by a concentration effect based on the second optical filter 19a. In the case of this configuration, since it is not necessary to separately form a lens, the manufacturing cost is reduced. Further, a film thickness on a substrate is made thin, and thus, it is possible to enhance a concentration characteristic with respect to oblique light.

In the example of FIG. 39, the inorganic film optical filter 17 includes the first optical filter 18a, the second optical filter 19a, and the third optical filter 20a.

The example of FIG. 39 may be applied to a light detecting device according to this embodiment.

Figure 40:
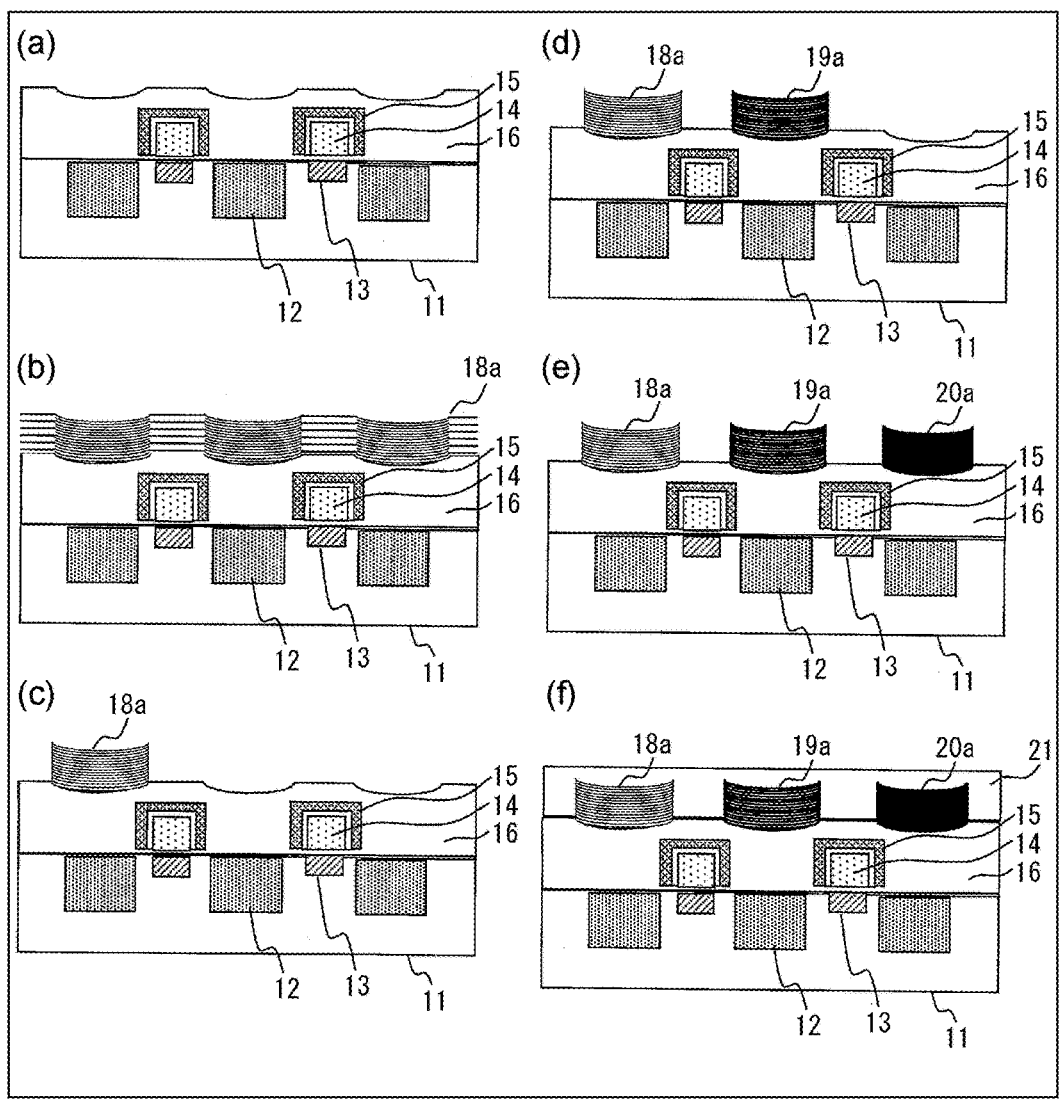

FIGS. 40(a) to 40(f) are diagrams illustrating a method for manufacturing the solid-state image capturing apparatus according to Embodiment 15. First, as shown in FIG. 40(a), the photoelectric conversion unit 12 and the charge transfer unit 13 are formed using ion injection so as to be exposed on a front surface of the semiconductor substrate 11 formed of silicon. Further, an insulating film (not shown) which is a silicon oxide film of a thickness of 100 nm to 3000 nm, for example, is formed on the front surface of the semiconductor substrate 11 using silicon thermal oxidation or a chemical vapor deposition (CVD) method.

Then, for example, a polysilicon film is deposited at a thickness of about 50 nm to 300 nm using a CVD method. Further, n-type impurities such as phosphor are introduced using thermal diffusion or ion injection.

Thereafter, the transfer electrode 14 is formed using anisotropic etching, using a photoresist which is patterned in a predetermined pattern as a mask, based on a photolithography technique. Then, an insulating film (not shown) is formed by deposition of an oxidation film based on polysilicon oxidation or a CVD method.

For example, an antireflection coat (not shown) is formed by depositing a silicon nitride film and performing anisotropic etching with respect to the silicon nitride film using a photoresist patterned in a predetermined pattern as a mask.

Then, tungsten or the like which is a material of a light shielding film is deposited, and the light shielding film 15 is formed using a photolithography technique. Further, the insulating film 16 which is a silicon oxide film is formed using a CVD method. An embedding shape of the insulating film 16 formed using the CVD method is a downwardly convex shape between the transfer electrodes 14.

Then, as shown in FIG. 40(b), the first optical filter 18a is formed on the insulating film 16. The first optical filter is formed of an inorganic multilayer film, and is formed by alternately layering a low-refractive-index material and a high-refractive-index material.

Then, as shown in FIG. 40(c), the first optical filter 18a is etched using a photoresist (not shown) patterned in a predetermined pattern as a mask, based on a photolithography technique, to form a predetermined pattern. Further, as shown in FIGS. 40(d) and 40(e), the second optical filter 19a and the third optical filter 20a are formed using the same method in FIGS. 40(b) and 40(c). Then, as shown in FIG. 40(f), the spacer film 21 is formed. In the above-mentioned examples, the formation of the optical filters is performed in the order of the first optical filter 18a, the second optical filter 19a, and the third optical filter 20a, but the invention is not limited thereto. The formation order of the three optical filters may be arbitrarily set.

The examples of FIGS. 40(a) to 40(f) may be applied to a method for manufacturing the light detecting device according to this embodiment.

In FIG. 18, by setting a ratio of refractive indexes between a film $L_j$ of a lowermost layer of the inorganic film optical filter 17 and the insulating film 16 to 85% or greater and 115% or less, and a ratio refractive indexes between a film $L_0$ of a uppermost layer thereof and the spacer film 21 to 85% or greater and 115% or less, it is possible to prevent reflection and refraction on an interface, and to obtain a desired stable transmittance characteristic of a color filter.

According to the light detecting device, the solid-state image capturing apparatus, and the method for manufacturing the same according to this embodiment, it is possible to realize the light detecting device at a type 1 device size or less.

Further, it is possible to realize a solid-state image capturing apparatus such as a single-plate type CCD image sensor, or a CMOS image sensor capable of coping with the number of pixels of Standard Definition (SD) (640×480 pixels), High Definition (HD) 720 (1280×720 pixels), HD 960 (1280×920 pixels), full HD (1920×1080 pixels), 4K (pixels four times the full HD), 8K (pixels eight times the full HD), or the like in a type 1 device size or less.

Further, it is possible to cope with a scanning type such as an interlace type or a progressive type.

Furthermore, it is possible to realize high-performance electric characteristics which are equal to or better than those in the related art.

Example 1

As a result of measurement of a type ⅓ CCD image sensor of 1.3 million pixels, for example, manufactured by the light detecting device, the solid-state image capturing apparatus, and the method for manufacturing the same according to this embodiment, high-performance electric characteristics such as a sensitivity of 1200 mV/μm² or greater in deposition for 1 second at F5.6, a smear of −120 dB or less, and a saturation output of 800 mV or greater were obtained.

Example 2

FIGS. 41(a) and 41(b) are diagrams illustrating color photos based on visible light and infrared radiation, captured by the solid-state image capturing apparatus of this embodiment. FIG. 41(a) shows a photo based on visible light, and FIG. 41(b) shows a photo based on infrared radiation. It is shown that color based on visible light in FIG. 41(a) can be reproduced using infrared radiation in FIG. 41(b).

[Aspect of the Invention Relating to Manufacturing Method]

Figure 17:
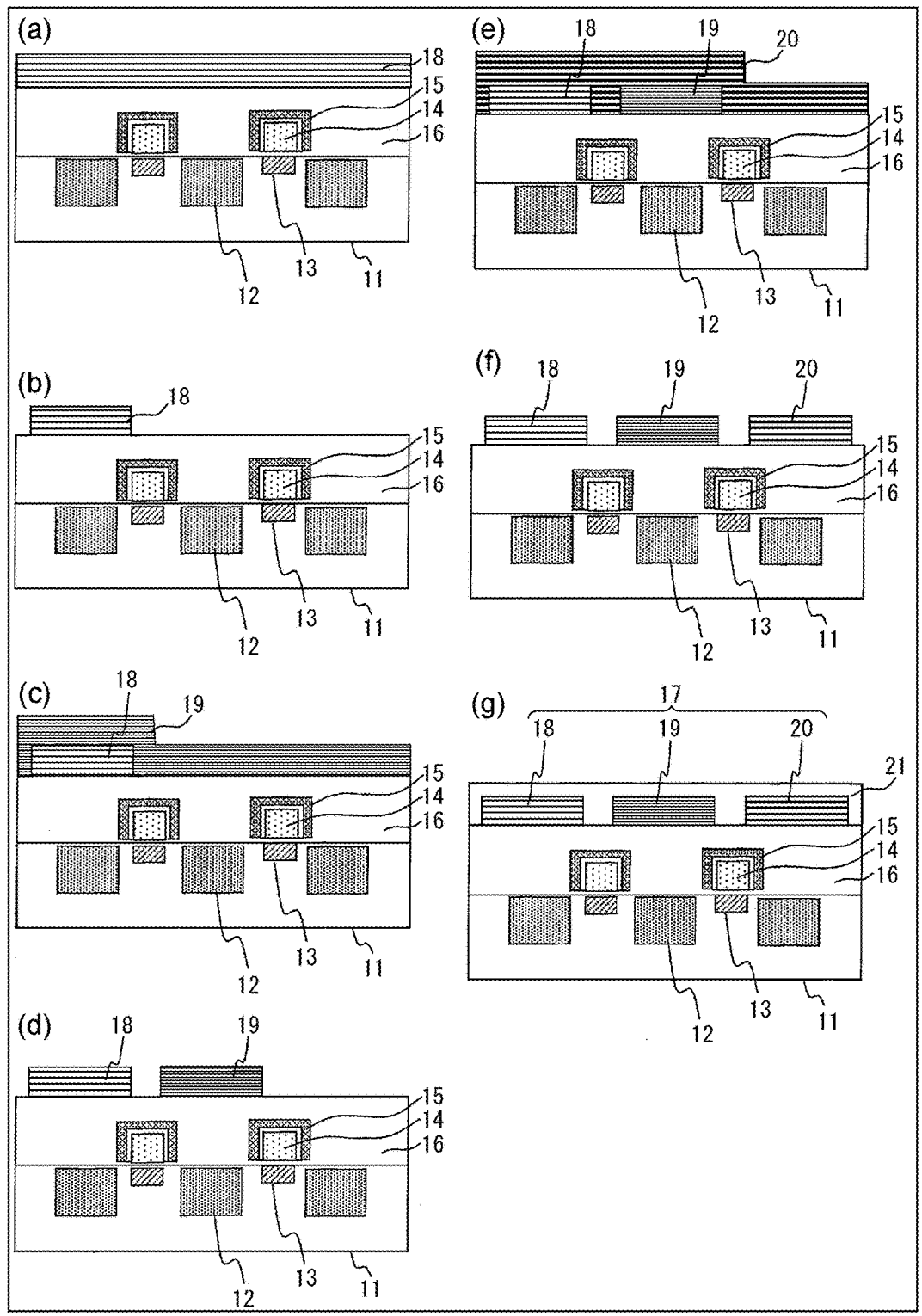

As an aspect of the invention, in the method for manufacturing the light detecting device and the solid-state image sensor shown in FIG. 17, it is preferable that a photoelectric conversion unit and a charge transfer unit are formed on a front surface of a semiconductor substrate formed of silicon, and then, an insulating film which is a silicon oxide film of a thickness of 100 nm to 3000 nm, for example, is formed on the front surface of the semiconductor substrate using thermal oxidation of silicon or a CVD method.

Then, it is preferable that a polysilicon film is deposited at a thickness of about 50 nm to 300 nm using a CVD method, for example, and then, n-type impurities such as phosphor are introduced using thermal diffusion or ion injection. Thereafter, it is preferable that a transfer electrode is formed using anisotropic etching, using a photoresist which is patterned in a predetermined pattern as a mask, based on a photolithography technique.

Then, it is preferable that an insulating film is formed by deposition of an oxidation film based on polysilicon oxidation or a CVD method.

For example, it is preferable that an antireflection coat is formed by depositing a silicon nitride film and performing anisotropic etching with respect to the silicon nitride film using a photoresist patterned in a predetermined pattern as a mask.

Then, it is preferable that tungsten or the like which is a material of a light shielding film is deposited, and then, a light shielding film is formed using a photolithography technique.

Further, it is preferable that an insulating film which is a silicon oxide film is formed using a CVD method. The insulating film may be flattened using CMP or etching.

Further, it is preferable that the first optical filter is formed on the insulating film. Here, it is preferable that the first optical filter is formed by an inorganic multilayer film, and is formed by alternately layering a low-refractive-index material and a high-refractive-index material. It is preferable that a silicon oxide film $SiO_2$ is used as the low-refractive-index material and a silicon nitride film SiN or a titanium oxide film $TiO_2$ is used as the high-refractive-index material. The multilayer film may be formed using a CVD method, or may be formed using a deposition method or a sputtering method.

Then, as shown in FIG. 17(b), it is preferable that the first optical filter is etched using a photoresist patterned in a predetermined pattern as a mask, based on a photolithography technique, to form a predetermined pattern.

Then, as shown in FIG. 17(c), it is preferable that the second optical filter is formed using a CVD method or the like.

Then, as shown in FIG. 17(d), it is preferable that the second optical filter is etched using a photoresist patterned in a predetermined pattern as a mask, based on a photolithography technique, to form a predetermined pattern.

Then, as shown in FIG. 17(e), it is preferable that the third optical filter is formed using a CVD method or the like.

Then, as shown in FIG. 17(f), it is preferable that the third optical filter is etched using a photoresist patterned in a predetermined pattern as a mask, based on a photolithography technique, to form a predetermined pattern.

Then, as shown in FIG. 17(g), the first planarization film is formed. It is preferable that the first planarization film is formed by coating of a silicon oxide film $SiO_2$ using a spin-on-glass (SOG) method or by coating of an acrylic material.

Figure 24:
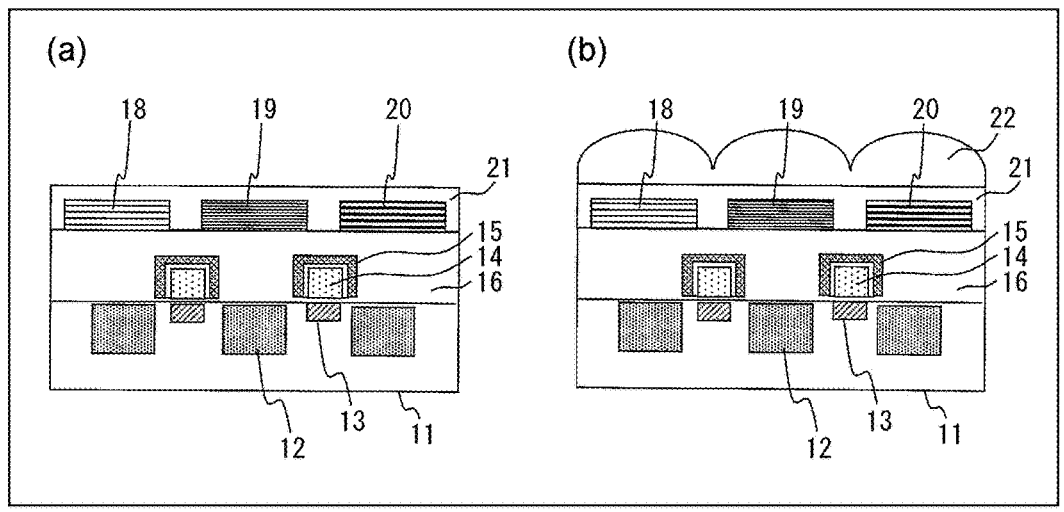

Further, it is preferable that acryl is formed thereon, and then, is etched so that a photoresist shape patterned in a predetermined shape is transferred, to thereby form a first lens, as the method for manufacturing the light detecting device and the solid-state image sensor shown in FIG. 24.

Further, it is preferable that the photoelectric conversion unit and the charge transfer unit are formed using ion injection so as to be exposed on a front surface of the semiconductor substrate formed of silicon, and then, an insulating film which is a silicon oxide film of a thickness of 100 nm to 3000 nm, for example, is formed using silicon thermal oxidation or a CVD method, as the method for manufacturing the light detecting device and the solid-state image sensor shown in FIG. 27.

Then, for example, it is preferable that a polysilicon film is deposited at a thickness of about 50 nm to 300 nm using a CVD method, and then, n-type impurities such as phosphor are introduced using thermal diffusion or ion injection. Then, it is preferable that a transfer electrode is formed using anisotropic etching, using a photoresist which is patterned in a predetermined pattern as a mask, based on a photolithography technique.

Then, it is preferable that an insulating film is formed by deposition of an oxidation film based on polysilicon oxidation or a CVD method, and then, an antireflection coat is formed by depositing a silicon nitride film and performing anisotropic etching with respect to the silicon nitride film using a photoresist patterned in a predetermined pattern as a mask.

Then, it is preferable that tungsten or the like which is a material of a light shielding film is deposited, and then, a light shielding film is formed using a photolithography technique. Further, it is preferable that an insulating film which is a silicon oxide film is formed using a CVD method, and that an embedding shape of the insulating film formed using the CVD method is a downwardly convex shape between the transfer electrodes.

Then, it is preferable that a silicon nitride film is formed using a CVD method, for example. Then, it is preferable that a second lens is formed using an etching method or a CMP method, and then, the first optical filter, the second optical filter, and the third optical filter are formed. Further, it is preferable that the formation order of the first optical filter, the second optical filter, and the third optical filter is arbitrarily set.

The second lens 2 is formed using the etching method or the CMP method, but it is possible to obtain the same lens effect as in the second lens 2 without using the etching method or the CMP method. By performing etching, a distance between the substrate and each filter is reduced, and thus, the sensitivity is enhanced.

Further, as the method for manufacturing the light detecting device and the solid-state image sensor, it is preferable that a photoelectric conversion unit and a charge transfer unit are formed on a front surface of a semiconductor substrate formed of silicon, and then, an insulating film which is a silicon oxide film of a thickness of 100 nm to 3000 nm, for example, is formed on the front surface of the semiconductor substrate using thermal oxidation of silicon or a CVD method.

Then, it is preferable that a polysilicon film is deposited at a thickness of about 50 nm to 300 nm using a CVD method, for example, and then, n-type impurities such as phosphor are introduced using thermal diffusion or ion injection.

Thereafter, it is preferable that a transfer electrode is formed using anisotropic etching, using a photoresist which is patterned in a predetermined pattern as a mask, based on a photolithography technique, and then, an insulating film is formed by deposition of an oxidation film based on polysilicon oxidation or a CVD method.

For example, it is preferable that an antireflection coat is formed by depositing a silicon nitride film and performing anisotropic etching with respect to the silicon nitride film using a photoresist patterned in a predetermined pattern as a mask.

Then, it is preferable that tungsten or the like which is a material of a light shielding film is deposited, and then, a light shielding film is formed using a photolithography technique. Then, it is preferable that an insulating film which is a silicon oxide film is formed using a CVD method, and that an embedding shape of the insulating film formed using the CVD method is a downwardly convex shape between the transfer electrodes.

Then, the first optical filter is formed on the insulating film. It is preferable that the first optical filter is formed on the insulating film. Here, it is preferable that the first optical filter is formed by an inorganic multilayer film, and is formed by alternately layering a low-refractive-index material and a high-refractive-index material.

It is preferable that the first optical filter is etched using a photoresist patterned in a predetermined pattern as a mask, based on a photolithography technique, to form a predetermined pattern.

It is preferable that the second optical filter and the third filter are formed in the same method.

Then, it is preferable that the first planarization film is formed.

By setting the ratio of refractive indexes between the film $L_j$ of the lowermost layer of the inorganic film optical filter and the insulating film to 85% or greater and 115% or less, and the ratio refractive indexes between the film $L_0$ of the uppermost layer thereof and the first planarization film to 85% or greater and 115% or less, it is possible to prevent reflection and refraction on an interface, and to obtain a desired stable transmittance characteristic of a color filter.

CONCLUSION

A light detecting device 1 according to Aspect 1 of the invention includes: an optical filter 2 that transmits a first wavelength light having a wavelength in a first wavelength range, a second wavelength light having a wavelength in a second wavelength range, . . . , and an n-th wavelength light having a wavelength in an n-th wavelength range (n is an integer), in light from an object; an optical sensor 3 that detects at least one of a first wavelength light intensity of the first wavelength light, a second wavelength light intensity of the second wavelength light, . . . , and an n-th wavelength light intensity of the n-th wavelength light; and an analysis unit 4 that estimates a light intensity of light having a wavelength in a wavelength range other than at least one of the first wavelength range, the second wavelength range, . . . , and the n-th wavelength range based on at least one of the first wavelength light intensity, the second wavelength light intensity, . . . , and the n-th wavelength light intensity detected by the optical sensor 3, in which a correlative relationship exists between a light intensity of light having a wavelength in the at least one wavelength range and the light intensity of the light having the wavelength in the wavelength range other than the at least one wavelength range.

According to this configuration, it is possible to estimate the light intensity of light having the wavelength in the wavelength range other than at least one of the first wavelength range, the second wavelength range, . . . , and the n-th wavelength range based on at least one of the first wavelength light intensity, the second wavelength light intensity, . . . , and the n-th wavelength light intensity having the correlative relationship, and thus, it is possible to perform color reproduction or color imaging for an object under an extremely-low-illuminance environment and a 0 lux environment.

Each of light detecting devices 1a and 1h according to Aspect 2 of the invention includes: plural optical filters 2a to 2d having different transmission wavelength bands; and plural optical sensors 3a to 3d that receive light respectively passed through the plural optical filters 2a to 2d, in which each of the plural optical filters 2a to 2d is configured so that plural layered members S1 to S6 having a transmittance of 50% or greater in wavelength regions of visible light and infrared light are layered, the plural layered members S1 to S6 have the same or different refractive indexes, respectively, each of the plural optical filters 2a to 2d reflects light in a predetermined wavelength range to transmit light in a different wavelength range, and the plural optical filters 2a to 2d are arranged in plan with a space or a spacer member 7 being interposed therebetween.

According to this configuration, by detecting the first wavelength light intensity of the first wavelength light transmitted by one of the plural optical filters and the second wavelength light intensity of the second wavelength light transmitted by the other one of the plural filters, it is possible to estimate the light intensity of light having the wavelength in the wavelength range other than the first wavelength range and the second wavelength range, and thus, it is possible to perform color reproduction or color imaging for an object under an extremely-low-illuminance environment and a 0 lux environment.

Each of light detecting devices 1a and 1h according to Aspect 3 of the invention may further include plural lenses provided on a side opposite to the plural optical sensors 3a to 3d with respect to the plural optical filters 2a to 2d, in Aspect 2.

According to this configuration, light beams from an object are concentrated by plural lenses, pass through plural optical filters, and enter plural optical sensors. Accordingly, it is possible to enhance sensitivity of the first and second optical sensors by light concentration effects based on plural lenses.

Each of light detecting devices 1a and 1h according to Aspect 4 of the invention may further include plural lenses arranged between the plural optical filters 2a to 2d and the plural optical sensors 3a and 3d, in Aspect 2.

According to this configuration, light beams from an object are concentrated by plural lenses, pass through plural optical filters, and enter plural optical sensors. Accordingly, it is possible to enhance sensitivity of the plural optical sensors by light concentration effects based on plural lenses.

Each of light detecting devices 1a and 1h according to Aspect 5 of the invention may further include plural first lenses provided on a side opposite to the plural optical sensors 3a to 3d with respect to the plural optical filters 2a to 2d, and plural second lenses arranged between the plural optical filters 2a to 2d and the plural optical sensors 3a and 3d, in Aspect 2.

According to this configuration, light beams from an object are concentrated by the plural first lenses, pass through plural optical filters, are concentrated by the plural second lenses, and enter the plural optical sensors. Accordingly, it is possible to enhance sensitivity of the plural optical sensors by light concentration effects based on the plural first and second lenses.

In a light detecting device 1a or 1h according to Aspect 6 of the invention, light from the object may be infrared light, and the analysis unit 4 may estimate a color, under visible light, of the object that reflects the infrared light, based on at least one of the first wavelength light intensity, the second wavelength light intensity, . . . , and the n-th wavelength light intensity detected by the optical sensors 3a to 3d, in Aspect 1.

According to this configuration, it is possible to estimate color of an object under visible light using infrared light from the object, and thus, it is possible to perform color reproduction or color imaging for an object under an extremely-low-illuminance environment and a 0 lux environment.

Each of light detecting devices 1a and 1h according to Aspect 7 of the invention may further include an analysis unit 4 that estimates a color, under visible light, of an object that reflects the infrared light, based on at least one of the first wavelength light intensity, the second wavelength light intensity, . . . , and the n-th wavelength light intensity detected by the plural optical sensors 3a to 3d, in Aspect 2.

According to this configuration, it is possible to estimate color, under visible light, of an object that reflects infrared light, and thus, it is possible to perform color reproduction or color imaging for an object under an extremely-low-illuminance environment and a 0 lux environment.

Each of solid-state image capturing apparatuses 1b to 1e according to Aspect 8 of the invention includes a composite optical filter array 8a that includes plural composite optical filters 5a and an optical sensor array 6a in which plural optical sensors 3a to 3d are arranged. Here, each of the plural composite optical filters includes plural optical filters 2a to 2d having different transmission wavelength bands, and each of the plural optical filters 2a to 2d transmits visible light having a predetermined wavelength and infrared light having a predetermined wavelength. Plural layered members S1 to S6 having different refractive indexes are layered in each of the plural optical filters 2a to 2d, and the plural optical sensors 3a to 3d have sensitivity to the visible light and the infrared light. The plural optical filters 2a to 2d are regularly arranged in plan, and the plural optical sensors 3a to 3d are regularly arranged in plan.

According to this configuration, since optical sensors detect visible light having a predetermined wavelength and infrared light having a predetermined wavelength, passed through plural optical filters, it is possible to perform color reproduction or color imaging for an object under an extremely-low-illuminance environment and a 0 lux environment.

Each of solid-state image capturing apparatuses 1c and 1e according to Aspect 9 of the invention may further include a lens array 9a that is arranged on a side opposite to the optical sensor array 6a with respect to the composite optical filter array 8a, and the plural lenses may be regularly arranged in plan, in Aspect 8.

According to this configuration, light beams from an object are concentrated by a lens array, pass through an optical filter, and enter an optical sensor. Accordingly, it is possible to enhance sensitivity of the optical sensor by light concentration effects based on the lens array.

Each of solid-state image capturing apparatuses 1d and 1e according to Aspect 10 of the invention may include a lens array 9a or 9b that is disposed between the composite optical filter array 8a and the optical sensor array 6a and includes plural lenses, and the plural lenses may be regularly arranged in plan to correspond to the plural optical filters 2a to 2d, in Aspect 8.

According to this configuration, light beams from an object are concentrated by a lens array, pass through an optical filter, and enter an optical sensor. Accordingly, it is possible to enhance sensitivity of an optical sensor by light concentration effects based on a lens array.

A solid-state image capturing apparatus 1e according to Aspect 11 of the invention may further include a first lens array 9a that is arranged on a side opposite to the optical sensor array 6a with respect to the composite optical filter array 8a and has plural first lenses, and a second lens array 9b that is arranged between the composite optical filter array 8a and the optical sensor array 6a and has plural second lenses, and the plural first and second lenses may be regularly arranged in plan to correspond to the plural optical filters 2a to 2d, in Aspect 8.

According to this configuration, light beams from an object are concentrated by a first lens, pass through an optical filter, are concentrated by a second lens, and enter an optical sensor. Accordingly, it is possible to enhance sensitivity of the optical sensor by light concentration effects based on the first and second lenses.

In each of solid-state image capturing apparatuses 1b to 1e according to Aspect 12 of the invention, the optical filters 2a to 2d may absorb visible light other than the visible light having the predetermined wavelength and infrared light other than the infrared light having the predetermined wavelength, and thus, may transmit the visible light having the predetermined wavelength and the infrared light having the predetermined wavelength, in Aspect 8.

According to this configuration, it is possible to transmit visible light having a predetermined wavelength and infrared light having a predetermined wavelength with a simple configuration.

In each of solid-state image capturing apparatuses 1b to 1e according to Aspect 13 of the invention, the optical filters 2a to 2d may reflect visible light other than the visible light having the predetermined wavelength and infrared light other than the infrared light having the predetermined wavelength, and thus, may transmit the visible light having the predetermined wavelength and the infrared light having the predetermined wavelength, in Aspect 8.

According to this configuration, it is possible to transmit visible light having a predetermined wavelength and infrared light having a predetermined wavelength with a simple configuration.

In each of solid-state image capturing apparatuses 1b to 1e according to Aspect 14 of the invention, the layered members S1 to S6 may include at least one of an organic material and an inorganic material, in Aspect 8.

In each of solid-state image capturing apparatuses 1b to 1e according to Aspect 15 of the invention, the layered members S1 to S6 may be formed of a dielectric substance, in Aspect 8.

In each of solid-state image capturing apparatuses 1b to 1e according to Aspect 16 of the invention, the shape of the optical filters 2a to 2d may be a plate shape, a concave shape, a bowl shape, or a disk shape, in Aspect 8.

In each of solid-state image capturing apparatuses 1b to 1e according to Aspect 17 of the invention, the shape of the layered members S1 to S6 may be a plate shape, a concave shape, a bowl shape, or a disk shape, in Aspect 8.

In each of solid-state image capturing apparatuses 1b to 1e according to Aspect 18 of the invention, the shape of the optical filters 2a to 2d may be a cube, a rectangle, a prism, a pyramid, a frustum, a cylinder, a cone, a truncated cone, an elliptic cylinder, an elliptical cone, an elliptical frustum, a drum shape or a barrel shape, in Aspect 8.

In each of solid-state image capturing apparatuses 1b to 1e according to Aspect 19 of the invention, when a width is a size of the optical filters 2a to 2d along the plane on which the optical filters 2a to 2d are arranged, a length is a size of the optical filters 2a to 2d along the plane, vertical to the size along the plane, and a height is a size of the optical filters 2a to 2d vertical to the plane, the optical filters 2a to 2d may have sizes which are equal or close to each other in the width, the length, and the height, in Aspect 8.

In each of solid-state image capturing apparatuses 1b to 1e according to Aspect 20 of the invention, when a width is a size of the optical filters 2a to 2d along the plane on which the optical filters 2a to 2d are arranged, a length is a size of the optical filters 2a to 2d along the plane, vertical to the size along the plane, and a height is a size of the optical filters vertical to the plane, the optical filters 2a to 2d may be formed by layering plural layered members S1 to S6 having a size of a width of 10 micrometers or less, a length of 10 micrometers or less, and a height of 1 micrometer or less and having different refractive indexes, in Aspect 8.

In each of solid-state image capturing apparatuses 1b to 1e according to Aspect 21 of the invention, a space SP may be formed between the plural optical filters 2a to 2d, in Aspect 8.

In each of solid-state image capturing apparatuses 1b to 1e according to Aspect 22 of the invention, a spacer member 7 may be formed between the plural optical filters 2a to 2d, in Aspect 8.

Each of solid-state image capturing apparatuses 1f to 1g according to Aspect 23 of the invention includes a first composite optical filter array (composite optical filter array 8a), an optical sensor array 6a, and a second composite optical filter array (organic filter array 10a) that is disposed between the first composite optical filter array (composite optical filter array 8a) and the optical sensor array 6a or on a side opposite to the optical sensor array 6a with respect to the first composite optical filter array (composite optical filter array 8a). Here, the first composite optical filter array (composite optical filter array 8a) includes plural first composite optical filters (composite optical filters 5a), and each of the plural first composite optical filters (composite optical filters 5a) includes plural optical filters (optical filters 2a to 2d) having different transmission wavelength bands. The second composite optical filter array (organic filter array 10a) includes plural second composite optical filters (composite organic filters 5h), and each of the plural second composite optical filters (composite organic filters 5h) includes plural optical filters (optical filters 2s, 2t, 2u, and 2v) having different transmission wavelength bands. Each of the plural optical filters (optical filters 2a to 2d) that form the plural first composite optical filters is formed of an inorganic or organic material, and each of the plural optical filters (optical filers 2s, 2t, 2u, and 2v) that form the plural second composite optical filters is formed of an organic or inorganic material. The plural respective optical filters (optical filters 2a to 2d) that form the plural first composite optical filters are regularly arranged in plan, and the plural respective optical filters (optical filters 2s, 2t, 2u, and 2v) that form the plural second composite optical filters are regularly arranged in plan so as to correspond to the plural respective optical filters (optical filters 2a to 2d) that form the plural first composite optical filters. A combination of one optical filter among the plural optical filters (optical filters 2a to 2d) that form the plural first composite optical filters and one optical filter among the plural optical filters (optical filters 2s, 2t, 2u, and 2v) that form the plural second composite optical filters corresponding to the one optical filter among the plural optical filters (optical filters 2a to 2d) that form the plural first composite optical filters transmits visible light having a predetermined wavelength and infrared light having a predetermined wavelength. The optical sensor array 6a includes plural optical sensors 3a to 3d having sensitivity to the visible light and the infrared light. The plural respective optical sensors 3a to 3d are regularly arranged in plan so as to correspond to the plural optical filters (optical filters 2a to 2d).

According to this configuration, a combination of one optical filter among the plural first optical filters and one optical filter among the plural second optical filters corresponding to the one optical filter among the plural first optical filters transmits visible light having a predetermined wavelength and infrared light having a predetermined wavelength, and thus, the optical sensor can detect the visible light and the infrared light. Thus, it is possible to perform color reproduction or color imaging for an object under an extremely-low-illuminance environment and a 0 lux environment.

In each of solid-state image capturing apparatuses 1b to 1e, 1f, and 1g according to Aspect 24 of the invention, the inorganic material may include silicon oxide, silicon nitride, or titanium oxide, in Aspect 14 or 23.

In each of solid-state image capturing apparatuses 1f and 1g according to Aspect 25 of the invention, plural layered members S1 to S6 having different refractive indexes may be layered in each of the plural first and second optical filters (optical filters 2a to 2d, and optical filters 2s, 2t, 2u, and 2v), in Aspect 23.

In each of solid-state image capturing apparatuses 1f and 1g according to Aspect 26 of the invention, each of the plural first and second optical filters (optical filters 2a to 2d, and optical filters 2s, 2t, 2u, and 2v) may include plural high-refractive-index layers (high-refractive-index materials $H_1$ to $H_j$), the plural high-refractive-index layers (high-refractive-index materials $H_1$ to $H_j$) may be layers formed by a layered member having a highest refractive index in the wavelength regions of the visible light and the infrared light among the plural layered members formed in the plural respective first and the second optical filters (optical filters 2a to 2d, and optical filters 2s, 2t, 2u, and 2v), and the plural respective high-refractive-index layers (high-refractive-index materials $H_1$ to $H_j$) may have different refractive indexes, in Aspect 23.

Each of solid-state image capturing apparatuses 1f and 1g according to Aspect 27 of the invention, each of the plural first and second optical filters (optical filters 2a to 2d, and optical filters 2s, 2t, 2u, and 2v) may include plural low-refractive-index layers ($L_0$ to $L_j$), the plural low-refractive-index layers (low-refractive-index materials $L_0$ to $L_j$) may be layers formed by a layered member having a lowest refractive index in the wavelength regions of the visible light and the infrared light among the plural layered members formed in the plural respective first and the second optical filters (optical filters 2a to 2d, and optical filters 2s, 2t, 2u, and 2v), and the plural respective low-refractive-index layers (low-refractive-index materials $L_0$ to $L_j$) may have different refractive indexes, in Aspect 23.

In each of solid-state image capturing apparatuses 1f and 1g according to Aspect 28 of the invention, each of the plural first and second optical filters (optical filters 2a to 2d, optical filters 2s, 2t, 2u, and 2v) may include a lowermost layer (low-refractive-index material $L_j$), an uppermost layer (low-refractive-index material $L_0$), a layer (insulating layer 16) adjacent to the lowermost layer, and a layer (spacer film 21) adjacent to the uppermost layer, in Aspect 23. Here, a ratio between a refractive index of the lowermost layer (low-refractive-index material $L_j$) and a refractive index of the layer (insulating layer 16) adjacent to the lowermost layer may be 85% or greater and 115% or less, and a ratio between a refractive index of the uppermost layer (low-refractive-index material $L_0$) and a refractive index of a layer (spacer layer 21) adjacent to the uppermost layer may be 85% or greater and 115% or less.

Each of solid-state image capturing apparatuses 1b to 1g according to Aspect 29 of the invention includes a composite optical filter array 8a that includes plural composite optical filters 5a, and an optical sensor array 6a in which plural optical sensors are arranged. Here, each of the plural composite optical filters 5a includes a first optical filter 18 that transmits light in a first wavelength range group, a second optical filter 19 that transmits light in a second wavelength range group, . . . , and an n-th optical filter that transmits light in an n-th wavelength range group (n is an integer). A k-th wavelength range group (k is an integer that satisfies 1≤k≤n) includes a (k, 1) wavelength range, a (k, 2) wavelength range, . . . , and a (k, m) wavelength range (m is an integer). A correlative relationship exists between light intensities of the respective (k, 1) wavelength range, the (k, 2) wavelength range, . . . , and the (k, m) wavelength range. The composite optical sensor includes a first optical sensor 3a, a second optical sensor 3b, . . . , and an n-th optical sensor. A k-th optical sensor detects at least one of the respective light intensities of the (k, 1) wavelength range, the (k, 2) wavelength range, . . . , and the (k, m) wavelength range. The solid-state image capturing apparatus further includes an analysis unit 4 that estimates, from a light intensity of light having a wavelength in the at least one wavelength range, a light intensity of light having a wavelength in a wavelength range other than the at least one wavelength range. A correlative relationship exists between the light intensity of the light having the wavelength in the at least one wavelength range and the light intensity of the light having the wavelength in the wavelength range other than the at least one wavelength range.

According to this configuration, it is possible to estimate a light intensity of light having a wavelength in a wavelength range other than at least one of the respective light intensities of the (k, 1) wavelength range, the (k, 2) wavelength range, . . . , and the (k, m) wavelength range, based on at least one of the respective light intensities of the (k, 1) wavelength range, the (k, 2) wavelength range, . . . , and the (k, m) wavelength range, and thus, it is possible to perform color reproduction or color imaging for an object under an extremely-low-illuminance environment and a 0 lux environment.

In each of solid-state image capturing apparatuses 1b to 1g according to Aspect 30 of the invention, one of the first to n-th optical filters may transmit red light having a red light wavelength region, and infrared light having a wavelength region which is closest to the red light wavelength region, in Aspect 29.

In each of solid-state image capturing apparatuses 1b to 1g according to Aspect 31 of the invention, n may be 3, the (1, 1) wavelength range may correspond to a red wavelength region, the (1, 2) wavelength range may correspond to a first infrared wavelength region, the (2, 1) wavelength range may correspond to a blue wavelength region, the (2, 2) wavelength range may correspond to a second infrared wavelength region, the (3, 1) wavelength range may correspond to a green wavelength region, and the (3, 2) wavelength range may correspond to a third infrared wavelength region, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 32 of the invention, n may be 3, the (1, 1) wavelength range may include a blue wavelength region and a red wavelength region, the (1, 2) wavelength range may include a first infrared wavelength region and a second infrared wavelength region, the (2, 1) wavelength range may include a green wavelength region and the blue wavelength region, the (2, 2) wavelength range may include the second infrared wavelength region and a third infrared wavelength region, the (3, 1) wavelength range may include the first infrared wavelength region and the third infrared wavelength region, and the (3, 2) wavelength range may include the first infrared wavelength region and the third infrared wavelength region, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 33 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the red wavelength region, the (2, 2) wavelength range may include the first infrared wavelength region, the (3, 1) wavelength range may include the green wavelength region, and the (3, 2) wavelength range may include the third infrared wavelength, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 34 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the green wavelength region, the (2, 2) wavelength range may include the third infrared wavelength region, the (3, 1) wavelength range may include the blue wavelength region, and the (3, 2) wavelength range may include the second infrared wavelength, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 35 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the green wavelength region, the (2, 2) wavelength range may include the second infrared wavelength region, the (3, 1) wavelength range may include the red wavelength region, and the (3, 2) wavelength range may include the first infrared wavelength, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 36 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the green wavelength region and the blue wavelength region, the (2, 2) wavelength range may include the third infrared wavelength region and the second infrared wavelength region, the (3, 1) wavelength range may include the blue wavelength region and the red wavelength region, and the (3, 2) wavelength range may include the second infrared wavelength and the first infrared wavelength region, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 37 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the blue wavelength region and the red wavelength region, the (2, 2) wavelength range may include the second infrared wavelength region and the first infrared wavelength region, the (3, 1) wavelength range may include the red wavelength region and the green wavelength region, and the (3, 2) wavelength range may include the first infrared wavelength and the third infrared wavelength region, in any one aspect of Aspects 8 to 30. Here, the second infrared wavelength region may be positioned on a longer wavelength side with respect to the first infrared wavelength region, and the third infrared wavelength region may be positioned on a wavelength side with respect to the second infrared wavelength region.

In each of solid-state image capturing apparatuses 1b to 1g according to Aspect 38 of the invention, n may be 3, the (1, 1) wavelength range may include a red wavelength region, a green wavelength region, and a blue wavelength region, the (1, 2) wavelength range may include a first infrared wavelength region, a second infrared wavelength region, and a third infrared wavelength region, the (2, 1) wavelength range may include the red wavelength region and the green wavelength region, the (2, 2) wavelength range may include the first infrared wavelength region and the third infrared wavelength region, the (3, 1) wavelength range may include the green wavelength region and the blue wavelength region, and the (3, 2) wavelength range may include the third infrared wavelength and the second infrared wavelength region, in any one aspect of Aspects 8 to 30. Here, the second infrared wavelength region may be positioned on a longer wavelength side with respect to the first infrared wavelength region, and the third infrared wavelength region may be positioned on a longer wavelength side with respect to the second infrared wavelength region.

In each of solid-state image capturing apparatuses 1b to 1g according to Aspect 39 of the invention, plural layered members having a transmittance of 50% or more may be layered in space or in wavelength regions of visible light and infrared light, in the first optical filter 18, in any one aspect of Aspects 33 to 38.

In each of solid-state image capturing apparatuses 1b to 1g according to Aspect 40 of the invention, the analysis unit 4 may calculate the intensity of light from an object having a wavelength of the blue wavelength region and a wavelength of the second infrared wavelength region based on the intensity of light that passes through the first optical filter 18, the intensity of light that passes through the second optical filter 19, and the intensity of light that passes through the third optical filter 20, in Aspect 33.

In each of solid-state image capturing apparatuses 1b to 1g according to Aspect 41 of the invention, the analysis unit 4 may calculate the intensity of light from an object having a wavelength of the red wavelength region and a wavelength of the first infrared wavelength region based on the intensity of light that passes through the first optical filter 18, the intensity of light that passes through the second optical filter 19, and the intensity of light that passes through the third optical filter 20, in Aspect 34.

In each of solid-state image capturing apparatuses 1b to 1g according to Aspect 42 of the invention, the analysis unit 4 may calculate the intensity of light from an object having a wavelength of the green wavelength region and a wavelength of the third infrared wavelength region based on the intensity of light that passes through the first optical filter 18, the intensity of light that passes through the second optical filter 19, and the intensity of light that passes through the third optical filter 20, in Aspect 35.

In each of solid-state image capturing apparatuses 1b to 1g according to Aspect 43 of the invention, the analysis unit 4 may calculate the intensity of light from an object having a wavelength of the red wavelength region, a wavelength of the green wavelength region, a wavelength of the first infrared wavelength region, and a wavelength of the third infrared wavelength region based on the intensity of light that passes through the first optical filter 18, the intensity of light that passes through the second optical filter 19, and the intensity of light that passes through the third optical filter 20, in Aspect 36.

In each of solid-state image capturing apparatuses 1b to 1g according to Aspect 44 of the invention, the analysis unit 4 may calculate the intensity of light from an object having a wavelength of the blue wavelength region, a wavelength of the green wavelength region, a wavelength of the third infrared wavelength region, and a wavelength of the second infrared wavelength region based on the intensity of light that passes through the first optical filter 18, the intensity of light that passes through the second optical filter 19, and the intensity of light that passes through the third optical filter 20, in Aspect 37.

In each of solid-state image capturing apparatuses 1b to 1g according to Aspect 45 of the invention, the analysis unit 4 may calculate the intensity of light from an object having a wavelength of the blue wavelength region, a wavelength of the red wavelength region, a wavelength of the second infrared wavelength region, and a wavelength of the first infrared wavelength region based on the intensity of light that passes through the first optical filter 18, the intensity of light that passes through the second optical filter 19, and the intensity of light that passes through the third optical filter 20, in Aspect 38.

Each of solid-state image capturing apparatuses 1b to 1g according to Aspect 46 of the invention may further include a conversion unit that performs color conversion using matrix calculation, in any one of Aspects 8, 23, and 29.

In each of solid-state image capturing apparatuses 1b to 1g according to Aspect 47 of the invention, a refractive index of the high-refractive-index layer that transmits light having a wavelength of a blue wavelength region may be lower than a refractive index of the high-refractive-index layer that transmits light having a wavelength of a green wavelength region and a refractive index of the high-refractive-index layer that transmits light having a wavelength of a red wavelength region, in Aspect 26.

In each of solid-state image capturing apparatuses 1b to 1g according to Aspect 48 of the invention, plural layered members having different thicknesses may be layered in each of the plural composite optical filters, in any one aspect of Aspects 8 and 29.

In each of solid-state image capturing apparatuses 1b to 1g according to Aspect 49 of the invention, any one of the optical filters 2a to 2d, and the first to n-th optical filters may include plural layered members of which refractive indexes and thicknesses are $(n_1, d_1)$, $(n_2, d_2)$, ..., and $(n_i, d_i)$, respectively, and may transmit visible light in a predetermined wavelength region and infrared light in a predetermined wavelength region by appropriately setting respective values of $(n_1, d_1)$, $(n_2, d_2)$, ..., and $(n_i, d_i)$ (i is an integer), in any one aspect of Aspects 8, 23, and 29.

In each of solid-state image capturing apparatuses 1b to 1g according to Aspect 50 of the invention, the optical filters 2a to 2d or the first to n-th optical filters may include plural layered members of which refractive indexes and thicknesses are $(n^1_1, d^1_1)$, $(n^1_2, d^1_2)$, ..., and $(n^1_i, d^1_i)$; $(n^2_1, d^2_1)$, $(n^2_2, d^2_2)$, ..., and $(n^2_i, d^2_i)$; ..., and $(n^p_1, d^p_1)$, $(n^p_2, d^p_2)$, ..., and $(n^p_i, d^p_i)$, respectively, and may transmit visible light in a predetermined wavelength region and infrared light in a predetermined wavelength region by appropriately setting respective values of $(n^1_2, d^1_1)$, $(n^1_2, d^1_2)$, ..., and $(n^1_i, d^1_i)$; $(n^2_1, d^2_1)$, $(n^2_2, d^2_2)$, ..., and $(n^2_i, d^2_i)$; ..., and $(n^p_1, d^p_1)$, $(n^p_2, d^p_2)$, ..., and $(n^p_i, d^p_i)$ (p is an integer that satisfies $1 \leq p \leq n$), in any one aspect of Aspects 8, 23, and 29.

Each of solid-state image capturing apparatuses 1b to 1g according to Aspect 51 of the invention may further include an electromagnetic wave radiation unit that radiates electromagnetic waves to an object, in any one aspect of Aspects 8, 23, 29.

Each of solid-state image capturing apparatuses 1b to 1g according to Aspect 52 of the invention may further include an infrared radiation unit that radiates infrared light to an object, in any one aspect of Aspects 8, 23, 29.

Each of solid-state image capturing apparatuses 1b to 1g according to Aspect 53 of the invention may further include a visible light radiation unit that radiates visible light to an object, in any one aspect of Aspects 8, 23, 29.

Each of solid-state image capturing apparatuses 1b to 1g according to Aspect 54 of the invention may further include a visible light radiation unit that radiates visible light to an object and an infrared radiation unit that radiates infrared light to the object, in any one aspect of Aspects 8, 23, 29.

In each of solid-state image capturing apparatuses 1b to 1g according to Aspect 55 of the invention, the infrared light is near infrared light, in Aspect 51 or 53.

In each of solid-state image capturing apparatuses 1b to 1e according to Aspect 56 of the invention, the spacer member 7 may include an organic material or an inorganic material, in Aspect 22.

In each of solid-state image capturing apparatuses 1b to 1e according to Aspect 57 of the invention, the size of the spacer member 7 may be 10 micrometers or less, in Aspect 22.

In each of solid-state image capturing apparatuses 1b to 1e according to Aspect 58 of the invention, a size ratio of the optical filters 2a to 2d to the spacer member 7 along a plane vertical to a transmission direction of light with respect to the optical filters 2a to 2d may be 0.5 or greater, in Aspect 22.

In each of solid-state image capturing apparatuses 1b to 1g according to Aspect 59 of the invention, a ratio, to the size of the optical filters 2a to 2d or the first to n-th optical filters along a plane vertical to a transmission direction of light with respect to the optical filters 2a to 2d or the first to n-th optical filters, of the size of the optical filters 2a to 2d or the first to n-th optical filters along a direction vertical to the plane may be 0.5 or greater, in any one aspect of Aspects 8, 23, and 29.

In each of solid-state image capturing apparatuses 1c and 1e according to Aspect 60 of the invention, a cycle at which the plural optical filters 2a to 2d are regularly arranged in plan, a cycle at which the plural optical sensors 3a to 3d are regularly arranged in plan, and a cycle at which the plural lenses are regularly arranged in plan may be different from each other, in Aspect 9.

Each of solid-state image capturing apparatuses 1b to 1g according to Aspect 61 of the invention includes a composite optical filter array 8a that includes plural composite optical filters 5a and an optical sensor array 6a in which plural optical sensors 3a to 3d are arranged. Here, each of the plural composite optical filters 5a includes plural optical filters 2a to 2d having different transmission wavelength bands, and each of the plural optical filters 2a to 2d transmits ultraviolet light having a predetermined wavelength, visible light having a predetermined wavelength, and infrared light having a predetermined wavelength. Plural layered members S1 to Si having different refractive indexes are layered in each of the plural optical filters 2a to 2d. The plural optical sensors 3a to 3d have sensitivity to the ultraviolet light, the visible light, and the infrared light. The plural optical filters 2a to 2d are regularly arranged in plan, and the plural optical sensors 3a to 3d are regularly arranged in plan.

A method for manufacturing a solid-state image capturing apparatus according to Aspect 62 of the invention includes forming a first optical sensor and a second optical sensor (photoelectric conversion unit 12) on a semiconductor substrate 11; forming an insulating film 16 on the semiconductor substrate 11 to cover the first optical sensor and the second optical sensor (photoelectric conversion unit 12); forming a first optical filter 18 corresponding to the first optical sensor on the insulating film 16; and forming a second optical filter 19 corresponding to the second optical sensor on the insulating film 16. Here, the first optical filter 18 and the second optical filter 19 have different transmission wavelength bands and transmit visible light having a predetermined wavelength and infrared light having a predetermined wavelength. Further, each of the first optical filter 18 and the second optical filter 19 is formed by layering plural layered members S1 to Si having different refractive indexes. The first and second optical sensors (photoelectric conversion unit 12) have sensitivity to the visible light and the infrared light.

Each of solid-state image capturing apparatuses 1b to 1g according to Aspect 63 of the invention may further include a radiation unit that radiates, to an object, light in at least region or plural regions among an ultraviolet wavelength region, a magenta wavelength region, a blue wavelength region, a cyan wavelength region, a green wavelength region, a yellow wavelength region, an orange wavelength region, a red wavelength region, a first infrared wavelength region, a second infrared wavelength region, a third infrared wavelength region, . . . , and a n-th infrared wavelength region, or the like.

Each of solid-state image capturing apparatuses 1b to 1g according to Aspect 64 of the invention may be provided on a ceiling, a wall, an electric pole, or the like, and may be mounted on a vehicle, a ship, a wearable device, or the like.

In each of solid-state image capturing apparatuses 1a and 1h according to Aspect 65 of the invention, at least one of the plural layered members layered in each of optical filters 2a to 2d may be a high-refractive-index layer (high-refractive-index materials $H_1$ to $H_j$) having a refractive index higher than refractive indexes of the other layered members, and the high-refractive-index layer of at least one of the plural optical filters may have a refractive index different from refractive indexes of high-refractive-index layers of the other optical filters, in Aspect 2.

In each of solid-state image capturing apparatuses 1a and 1h according to Aspect 66 of the invention, at least one of the plural optical filters 2a to 2d may transmit light having a wavelength shorter than a wavelength of light that the other optical filters transmit in the wavelength regions (of the visible light and the infrared light, and the refractive index of the high-refractive-index layer of the at least one of the plural optical filters 2a to 2d may be lower than the refractive indexes of the high-refractive-index layers of the other optical filters, in Aspect 65.

In each of solid-state image capturing apparatuses 1a and 1h according to Aspect 67 of the invention, at least one of the plural layered members may be a lowermost layer (low-refractive-index material $L_j$) that is closest to the optical sensors 3a to 3d, and another one of the plurality of layered members may be an uppermost layer (low-refractive-index material $L_0$) that is most distant from the optical sensors 3a to 3d, in Aspect 2. Here, a ratio between a refractive index of the lowermost layer (low-refractive-index material $L_j$) and a refractive index of a layer (insulating film 16) adjacent to the lowermost layer may be 85% or greater and 115% or less, and a ratio between a refractive index of the uppermost layer (low-refractive-index material $L_0$) and a refractive index of a layer (spacer film 21) adjacent to the uppermost layer may be 85% or greater and 115% or less.

A solid-state image capturing apparatus 1c according to Aspect 68 of the invention may further include a lens array 9a that is arranged on a side opposite to the optical sensor array 6a with respect to the composite optical filter array 8a and includes plural lenses, and the plural lenses may be regularly arranged in plan, in Aspect 8.

In each of solid-state image capturing apparatuses 1f and 1g according to Aspect 69 of the invention, at least one of the plural layered members layered in each of optical filters 2a to 2d that form the first composite optical filter may be a high-refractive-index layer (high-refractive-index materials $H_1$ to $H_j$) having a refractive index higher than refractive indexes of the other layered members, and the high-refractive-index layer of at least one of the plural optical filters that form the plural first composite optical filters may have a refractive index different from refractive indexes of high-refractive-index layers of the other optical filters, in Aspect 23.

In each of solid-state image capturing apparatuses 1f and 1g according to Aspect 70 of the invention, at least one of the plural optical filters 2a to 2d that form the first composite optical filter may transmit light having a wavelength shorter than a wavelength of light that the other optical filters transmit in the wavelength regions of the visible light and the infrared light, and the refractive index of the high-refractive-index layer of the at least one of the plural optical filters 2a to 2d may be lower than the refractive indexes of the high-refractive-index layers of the other optical filters, in Aspect 69.

In each of solid-state image capturing apparatuses 1f and 1g according to Aspect 71 of the invention, one of the plural layered members of the plural optical filters 2a to 2d that form the first composite optical filter may be a lowermost layer (low-refractive-index material $L_j$) that is closest to the optical sensors 3a to 3d, and another one of the plural layered members may be an uppermost layer (low-refractive-index material $L_0$) that is most distant from the optical sensors 3a to 3d, in Aspect 23. Here, a ratio between a refractive index of the lowermost layer (low-refractive-index material $L_j$) and a refractive index of a layer (insulating layer 16) adjacent to the lowermost layer may be 85% or greater and 115% or less, and a ratio between a refractive index of the uppermost layer (low-refractive-index material $L_0$) and a refractive index of a layer (spacer film 21) adjacent to the uppermost layer may be 85% or greater and 115% or less.

Each of solid-state image capturing apparatuses 1f and 1g according to Aspect 72 of the invention may further include plural lenses provided on a side opposite to the optical sensor array 6a with respect to the first composite optical filter array (composite optical filter array 8a), and the plural lenses may be regularly arranged in plan, in Aspect 23.

In each of solid-state image capturing apparatuses 1b to 1g according to Aspect 73 of the invention, n may be 3, the (1, 1) wavelength range may correspond to a red wavelength region, the (1, 2) wavelength range may correspond to a first infrared wavelength region, the (2, 1) wavelength range may correspond to a blue wavelength region, the (2, 2) wavelength range may correspond to a second infrared wavelength region, the (3, 1) wavelength range may correspond to a green wavelength region, and the (3, 2) wavelength range may correspond to a third infrared wavelength region, in Aspect 30. Here, the second infrared wavelength region may be positioned on a longer wavelength side with respect to the first infrared wavelength region, and the third infrared wavelength region may be positioned on a longer wavelength side with respect to the second infrared wavelength region.

The invention is not limited to the above-described embodiments, and various modifications may be made in the scopes disclosed in claims. Embodiments obtained by appropriately combining technical means respectively disclosed in different embodiments are also included in the technical scope of the invention. Further, new technical features may be formed by combining technical means disclosed in the respective embodiments.

INDUSTRIAL APPLICABILITY

The present invention may be used in a light detecting device, a solid-state image capturing apparatus, and a method for manufacturing the same using an object under a normal-illuminance environment, a low-illuminance environment, an extremely-low-illuminance environment, and a 0 lux environment as a target.

REFERENCE SIGNS LIST

1 LIGHT DETECTING DEVICE
1a, 1h LIGHT DETECTING DEVICE
1b to 1g SOLID-STATE IMAGE CAPTURING APPARATUS
2 OPTICAL FILTER
2a to 2v OPTICAL FILTER (FIRST OPTICAL FILTER, SECOND OPTICAL FILTER)
3 OPTICAL SENSOR
3a to 3d OPTICAL SENSOR
4 ANALYSIS UNIT
5a to 5g COMPOSITE OPTICAL FILTER
6, 6a OPTICAL SENSOR FILTER
7 SPACER MEMBER
7a to 7f SPACER MEMBER
8a COMPOSITE OPTICAL FILTER ARRAY (FIRST COMPOSITE OPTICAL FILTER ARRAY)
9a, 9b LENS ARRAY
10a ORGANIC FILTER ARRAY (SECOND COMPOSITE OPTICAL FILTER ARRAY)
11 SEMICONDUCTOR SUBSTRATE
12 PHOTOELECTRIC CONVERSION UNIT (FIRST OPTICAL SENSOR, SECOND OPTICAL SENSOR)
13 CHARGE TRANSFER UNIT
14 TRANSFER ELECTRODE
15 LIGHT SHIELDING FILM
16 INSULATING FILM (LAYER ADJACENT TO LOWERMOST LAYER)
17 INORGANIC FILM OPTICAL FILTER
18, 18a FIRST OPTICAL FILTER
19, 19a SECOND OPTICAL FILTER
20, 20a THIRD OPTICAL FILTER
21 SPACER FILM (LAYER ADJACENT TO UPPERMOST LAYER)
22 CONCENTRATING LENS
23 ORGANIC FILM OPTICAL FILTER
24 ORGANIC FILM OPTICAL FILTER
25 ORGANIC FILM OPTICAL FILTER
26 SECOND PLANARIZATION FILM
27 CONCENTRATING LENS
S1 to S6 LAYERED MEMBER
SP SPACE
L1 to L4 LIGHT BEAM
T INFORMATION
W WAVEFORM
W1~W5 WAVEFORM
$H_1$~$H_j$ HIGH-REFRACTIVE-INDEX MATERIAL (HIGH-REFRACTIVE-INDEX LAYER)
$L_0$~$L_j$ LOW-REFRACTIVE-INDEX MATERIAL (LOW-REFRACTIVE-INDEX LAYER, LOWERMOST LAYER, UPPERMOST LAYER)

The invention claimed is:

1. A light detecting device comprising:
a plurality of optical filters each of which transmits a first wavelength light having a wavelength in a first wavelength range, a second wavelength light having a wavelength in a second wavelength range, . . . , and an n-th wavelength light having a wavelength in an n-th wavelength range (n is an integer), in light from an object;
an optical sensor that detects at least one of a first wavelength light intensity of the first wavelength light, a second wavelength light intensity of the second wavelength light, . . . , and an n-th wavelength light intensity of the n-th wavelength light; and
an analysis unit that estimates a light intensity of light having a wavelength in a wavelength range other than at least one of the first wavelength range, the second wavelength range, . . . , and the n-th wavelength range based on at least one of the first wavelength light intensity, the second wavelength light intensity, . . . , and the n-th wavelength light intensity detected by the optical sensor; and
a spacer member that is formed between the plurality of optical filters, wherein
a correlative relationship exists between a light intensity of light having a wavelength in the at least one wavelength range and the light intensity of the light having the wavelength in the wavelength range other than the at least one wavelength range.

* * * * *